(12) United States Patent
Murooka

(10) Patent No.: US 10,439,002 B2
(45) Date of Patent: *Oct. 8, 2019

(54) SEMICONDUCTOR MEMORY DEVICE AND METHOD OF MANUFACTURING THE SAME

(71) Applicant: TOSHIBA MEMORY CORPORATION, Minato-ku (JP)

(72) Inventor: Kenichi Murooka, San Jose, CA (US)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 90 days.

This patent is subject to a terminal disclaimer.

(21) Appl. No.: 15/692,343

(22) Filed: Aug. 31, 2017

(65) Prior Publication Data

US 2017/0365639 A1    Dec. 21, 2017

Related U.S. Application Data

(63) Continuation of application No. 15/238,406, filed on Aug. 16, 2016, now Pat. No. 9,773,845, which is a
(Continued)

(51) Int. Cl.
*H01L 27/24* (2006.01)
*H01L 27/105* (2006.01)
(Continued)

(52) U.S. Cl.
CPC ........ *H01L 27/249* (2013.01); *G11C 13/0026* (2013.01); *G11C 13/0028* (2013.01);
(Continued)

(58) Field of Classification Search
CPC ..... H01L 27/1052; H01L 27/10; H01L 27/24; H01L 27/2463; H01L 27/2481; H01L 27/249; H01L 27/249
See application file for complete search history.

(56) References Cited

U.S. PATENT DOCUMENTS 8,891,277 B2   11/2014   Murooka
8,896,051 B2   11/2014   Nansei
(Continued)

FOREIGN PATENT DOCUMENTS

JP    2013-120618    6/2013
JP    2013-153127    8/2013

OTHER PUBLICATIONS

Office Action dated Jul. 1, 2016, in Taiwanese Patent Application No. 104102753 (with English language translation).

*Primary Examiner* — Michele Fan
(74) *Attorney, Agent, or Firm* — Oblon, McClelland, Maier & Neustadt, L.L.P.

(57) ABSTRACT

A connection unit is provided adjacently to the cell array unit and electrically connected to a peripheral circuit unit positioned downwardly of the cell array unit. The cell array unit has a configuration in which a variable resistance layer is provided at intersections of a plurality of word lines extending in a horizontal direction and a plurality of bit lines extending in a vertical direction. The connection unit includes a lower wiring line layer in which a base portion bundling a plurality of the word lines is formed, and a middle wiring line layer and upper wiring line layer formed upwardly thereof. The lower wiring line layer includes: a first penetrating electrode connecting the plurality of word lines and the peripheral circuit unit; and a second penetrating electrode connecting at least one of the middle wiring line layer and upper wiring line layer and the peripheral circuit unit.

16 Claims, 53 Drawing Sheets

Related U.S. Application Data continuation of application No. 14/593,344, filed on Jan. 9, 2015, now Pat. No. 9,455,257.

(60) Provisional application No. 62/045,970, filed on Sep. 4, 2014.

(51) Int. Cl.
*H01L 45/00* (2006.01)
*G11C 13/00* (2006.01)

(52) U.S. Cl.
CPC ...... *H01L 27/1052* (2013.01); *H01L 27/2454* (2013.01); *H01L 27/2463* (2013.01); *H01L 45/04* (2013.01); *H01L 45/1226* (2013.01); *H01L 45/1233* (2013.01); *H01L 45/146* (2013.01); *H01L 45/147* (2013.01); *H01L 45/16* (2013.01)

(56) References Cited

U.S. PATENT DOCUMENTS

| | | |
|---|---|---|
| 9,123,411 B2 | 9/2015 | Murooka |
| 9,129,677 B2 | 9/2015 | Murooka |
| 9,224,459 B1 | 12/2015 | Murooka |
| 9,231,029 B2 | 1/2016 | Murooka |
| 9,349,446 B2 | 5/2016 | Murooka |
| 9,355,913 B2 | 5/2016 | Park |
| 9,455,257 B2 | 9/2016 | Murooka |
| 9,773,845 B2 * | 9/2017 | Murooka ............ H01L 27/2463 |
| 2012/0147644 A1 | 6/2012 | Scheuerlein |
| 2012/0147645 A1 | 6/2012 | Scheuerlein |
| 2012/0147646 A1 | 6/2012 | Scheuerlein |
| 2012/0147647 A1 | 6/2012 | Scheuerlein |
| 2012/0147648 A1 | 6/2012 | Scheuerlein |
| 2012/0147649 A1 | 6/2012 | Samachisa et al. |
| 2012/0147650 A1 | 6/2012 | Samachisa et al. |
| 2012/0147651 A1 | 6/2012 | Scheuerlein et al. |
| 2012/0147652 A1 | 6/2012 | Scheuerlein |
| 2012/0147689 A1 | 6/2012 | Scheuerlein et al. |
| 2013/0148400 A1 | 6/2013 | Murooka |
| 2013/0187118 A1 | 7/2013 | Murooka |
| 2013/0248801 A1 | 9/2013 | Yamamoto |
| 2014/0063962 A1 * | 3/2014 | Sakurai ............... G11C 16/3427 365/185.17 |
| 2014/0211539 A1 * | 7/2014 | Kanno ................. H01L 27/2409 365/148 |
| 2014/0241037 A1 | 8/2014 | Kobayashi et al. |
| 2014/0306174 A1 | 10/2014 | Murooka |
| 2014/0340956 A1 | 11/2014 | Murooka |
| 2016/0071908 A1 | 3/2016 | Murooka |

* cited by examiner

|  | Write | Erase | Read |
|---|---|---|---|
| SGL_s | Vg_w | Vg_e | Vg_r, 0 |
| SGL_u | 0 | 0 | 0 |
| GBL_s | Vw | Vof | Vr+Vo |
| GBL_u | Vwf | Vef+Vof | Vr+Vo |
| WL_s | 0 | Ves+Vof | Vo |
| WL_u | Vwf | Vef+Vof | Vr+Vo |

FIG. 87

Correspondence Table of Process Drawings

| Cell Array Unit | Connection Unit | Step Formation | Entirety |
|---|---|---|---|
| FIG. 10 | FIG. 25 | | FIG. 68 |
| | FIGS. 26 to 28 | | |
| | FIG. 29 | | FIG. 69 |
| | FIGS. 30 to 34 | | |
| | FIG. 35 | FIG. 50 | |
| | | FIGS. 51 to 65 | |
| | FIG. 36 | FIG. 66 | FIG. 70 |
| | FIG. 37 | | |
| | FIG. 38 | FIG. 67 | FIG. 71 |
| FIG. 11 | | | |
| FIG. 12 | FIG. 39 | | FIG. 72 |
| FIG. 13 | FIG. 40 | | FIG. 73 |
| FIG. 14 | FIG. 41 | | FIG. 74 |
| FIG. 15 | FIG. 42 | | FIG. 75 |
| FIG. 16 | | | |
| FIG. 17 | | | FIG. 76 |
| FIG. 18 | | | FIG. 77 |
| FIG. 19 | | | |
| FIG. 20 | | | FIG. 78 |
| | FIG. 43 | | FIG. 79 |
| | FIG. 44 | | |
| | FIG. 45 | | |
| FIG. 21 | FIG. 46 | | FIG. 80 |
| FIG. 22 | | | |
| | FIG. 47 | | FIG. 81 |
| FIG. 23 | | | |
| FIG. 24 | FIG. 48 | | FIG. 82 |

US 10,439,002 B2

SEMICONDUCTOR MEMORY DEVICE AND METHOD OF MANUFACTURING THE SAME

CROSS REFERENCE TO RELATED APPLICATION

This application is a continuation application of U.S. application Ser. No. 15/238,406, filed Aug. 16, 2016, which is a continuation application of U.S. application Ser. No. 14/593,344, filed Jan. 9, 2015, which is based on and claims the benefit of priority from prior U.S. Provisional Patent Application No. 62/045,970, filed on Sep. 4, 2014, the entire contents of which are incorporated herein by reference.

FIELD

An embodiment described in the present specification relates to a semiconductor memory device and a method of manufacturing the same.

BACKGROUND

Conventionally proposed is a semiconductor memory device employing as a storage element a variable resistance element whose resistance value changes by application of a voltage. Moreover, conventionally known is a three-dimensional type memory cell array structure in which the previously mentioned variable resistance element is provided at an intersection of a first wiring line formed in a perpendicular direction to a substrate and a second wiring line formed in a horizontal direction to the substrate.

BRIEF DESCRIPTION OF THE DRAWINGS

FIG. 87 is a correspondence table of the manufacturing process views according to FIGS. 10 to 82.

DETAILED DESCRIPTION

Figure 1:
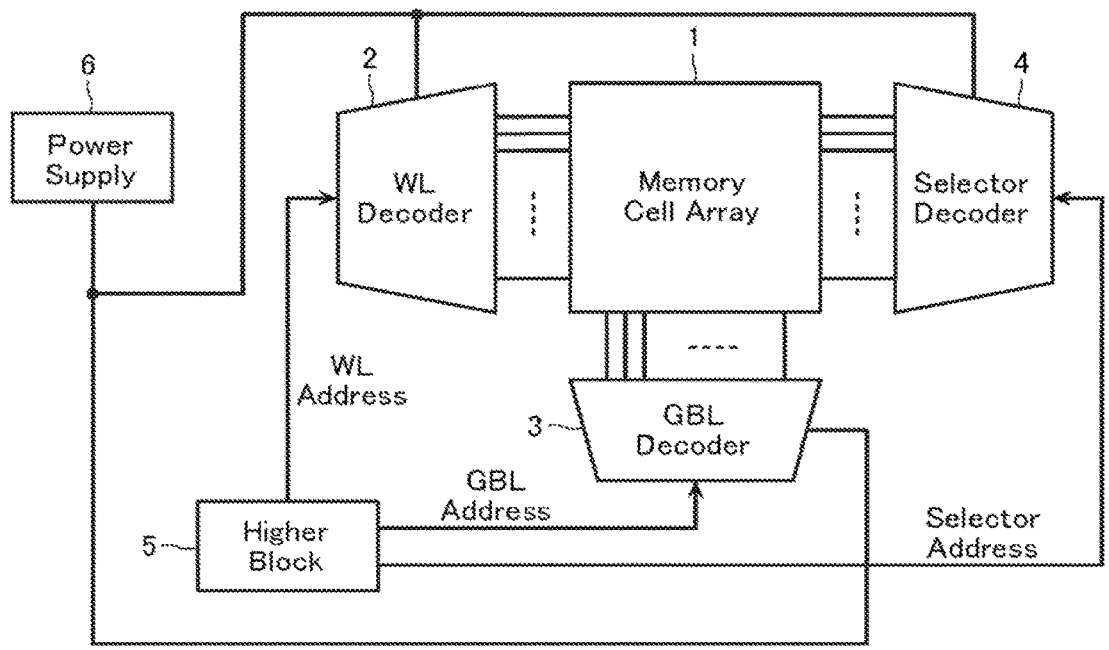
FIG. 1 is an overall block diagram of a semiconductor memory device according to a first embodiment.

A semiconductor memory device according to an embodiment comprises: a cell array unit; and a connection unit that is provided adjacently to the cell array unit and is electrically connected to a peripheral circuit unit disposed below the cell array unit. The cell array unit includes: a plurality of word lines that extend in a first direction and are respectively disposed with a certain spacing in a second direction and a third direction, the second direction intersecting the first direction, and the third direction being a stacking direction that intersects the first direction and the second direction; a plurality of bit lines that extend in the third direction and are respectively disposed with a certain spacing in the first direction and the second direction; a variable resistance layer that is provided on a side surface facing the word line in the bit line and that functions as a storage element at an intersection of the bit line and the word line; a plurality of select gate lines that are provided in a layer upward of the plurality of word lines and that function as a control gate for selecting the bit line; and a plurality of global bit lines that are provided in a layer upward of the plurality of select gate lines and that are electrically connected to the plurality of bit lines via the control gate. The connection unit includes: a lower wiring line layer in which a base unit is formed, the base unit bundling the plurality of word lines; a middle wiring line layer that is provided on the lower wiring line layer and in which the plurality of select gate lines extending from the cell array unit are formed; and an upper wiring line layer that is provided on the middle wiring line layer and in which the same wiring line layer as the plurality of global bit lines is formed. The lower wiring line layer includes: a first penetrating electrode that connects the plurality of word lines and the peripheral circuit unit; and a second penetrating electrode that connects at least one of the middle wiring line layer and upper wiring line layer and the peripheral circuit unit.

A method of manufacturing a semiconductor memory device according to an embodiment comprises: (a step for) forming a lower wiring line layer, the lower wiring line layer including a word line stacked structure in which a plurality of insulating layers and a plurality of word line layers are alternately stacked; (a step for) forming a first through-hole in a connection unit of the lower wiring line layer, the connection unit being connected to a peripheral circuit unit disposed downwardly of the lower wiring line layer, and the first through-hole penetrating the lower wiring line layer up and down; (a step for) forming a second through-hole in the connection unit, the second through-hole reaching from an upper surface of the lower wiring line layer to each layer of the plurality of word line layers; (a step for) supplying a via material to the first through-hole and the second through-hole and respectively forming a first penetrating electrode and a second penetrating electrode, the first penetrating electrode connecting the plurality of word lines and the peripheral circuit unit, and the second penetrating electrode connecting the wiring line layer formed upwardly of the lower wiring line layer and the peripheral circuit unit; (a step for,) in a cell array unit that is adjacent in a first direction to the connection unit of the lower wiring line layer, patterning the word line stacked structure and forming a plurality of word lines that extend in the first direction, with a certain spacing in a second direction, the second direction intersecting the first direction; (a step for) forming a variable resistance layer on a side surface of the plurality of word lines, the variable resistance layer functioning as a storage element; (a step for) forming between the variable resistance layers a plurality of bit lines that extend in a third direction, with a certain spacing in the first direction and the second direction, the third direction being a stacking direction that intersects the first direction and the second direction; (a step for) forming a middle wiring line layer upwardly of the lower wiring line layer, the middle wiring line layer being formed straddling the cell array unit and the connection unit, and the middle wiring layer including a plurality of select gate lines that each function as a control gate for selecting the bit line; (a step for) forming an upper wiring line layer upwardly of the middle wiring line layer, the upper wiring line layer including a plurality of global bit lines that are electrically connected to the plurality of bit lines via the control gate; and (a step for) connecting at least one of the middle wiring line layer and upper wiring line layer and the second penetrating electrode.

An embodiment will be described in detail below with reference to the drawings.

First Embodiment

[Configuration]

FIG. 1 is an overall block diagram of a semiconductor memory device according to a first embodiment. As will be mentioned in detail at a later stage, a memory cell array 1 has a structure in which a memory cell (MC) including a variable resistance layer is provided three-dimensionally at an intersection of a word line (WL) extending in a horizontal direction and a bit line (BL) extending in a vertical direction. Respectively connected to the memory cell array 1 are a word line decoder (referred to below as "WL decoder 2"), a global bit line decoder (referred to below as "GBL decoder 3"), and a selector decoder 4.

The WL decoder 2 is connected to a plurality of the word lines (WL) in the memory cell array 1. The GBL decoder 3 is connected to a plurality of global bit lines (GBL) in the memory cell array 1. The selector decoder 4 is connected to a plurality of select gate lines (SGL) in the memory cell array 1. The WL decoder 2, the GBL decoder 3, and the selector decoder 4 respectively select the word line, the global bit line, and the select gate line connected to the memory cell which is to be a target of a read/write/erase, based on address information (a WL address, a GBL address, and a selector address) inputted from a higher block 5.

Figures 6, 7:
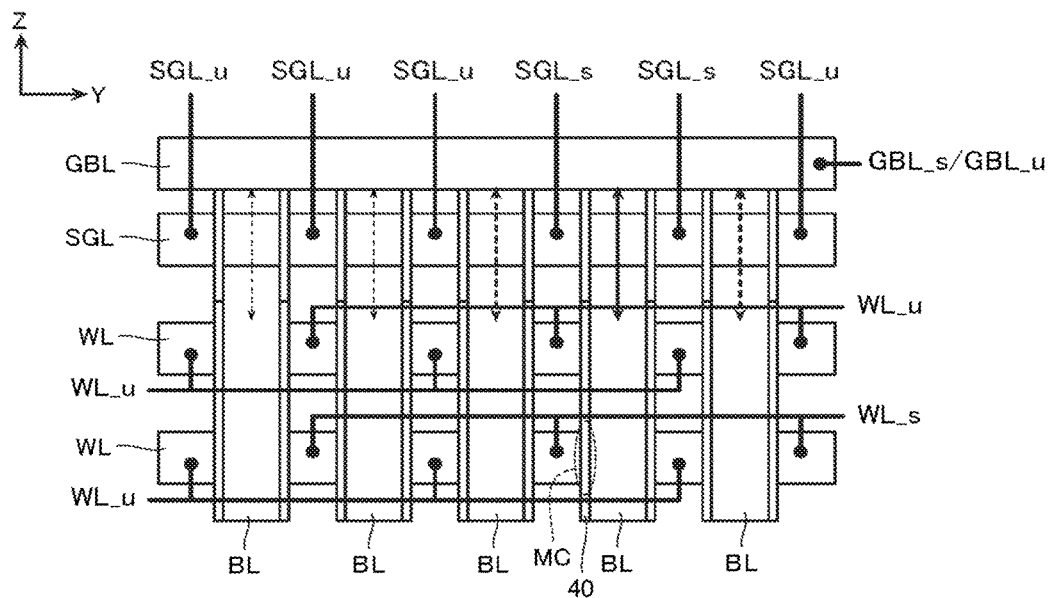
FIG. 6 is a cross-sectional schematic view of the cell array unit.
FIG. 7 is a table showing applied voltages during operations.

A power supply 6 generates combinations of voltages corresponding to each of operations of the read/write/erase (refer to FIG. 7). The power supply 6 respectively supplies a bias voltage of a selected word line (WL_s) and a bias voltage of an unselected word line (WL_u) to the WL decoder 2, a bias voltage (GBL_s) of a selected global bit line (GBL_s) and a bias voltage of an unselected global bit line (GBL_u) to the GBL decoder 3, and a select gate line voltage (SGL_s) to the selector decoder 4. The present configuration makes it possible to perform the read/write/erase on any memory cell in the memory cell array 1.

Figure 2:
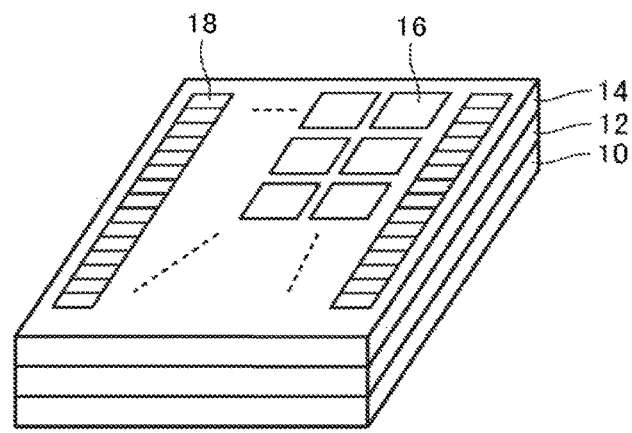
FIG. 2 is a perspective view of external appearance of the semiconductor memory device.

FIG. 2 is a perspective view of external appearance of the semiconductor memory device according to the first embodiment. A peripheral circuit layer 12 and a memory layer 14 are sequentially stacked on a substrate 10. Employable in the substrate 10 is, for example, a silicon (Si) substrate. The peripheral circuit layer 12 is a layer including peripheral circuits such as the WL decoder 2, the GBL decoder 3, the selector decoder 4, and the higher block 5 shown in FIG. 1, and may be formed by a commonly employed semiconductor process.

The memory layer 14 includes a memory cell unit 16 that includes the memory cell array 1 shown in FIG. 1. Provided in a periphery of the memory cell unit 16 is a connection unit (not illustrated in FIG. 2, will be mentioned in detail at a later stage) for achieving electrical connection with the peripheral circuit layer 12. Blocks that each adopt said connection unit and memory cell unit 16 as a unit are disposed in a matrix on the memory layer 14. Moreover, provided in a periphery of a region where the memory cell units 16 are disposed in a matrix (provided at an edge of the memory layer 14) is an input/output unit 18 of the semiconductor memory device.

Figure 3:
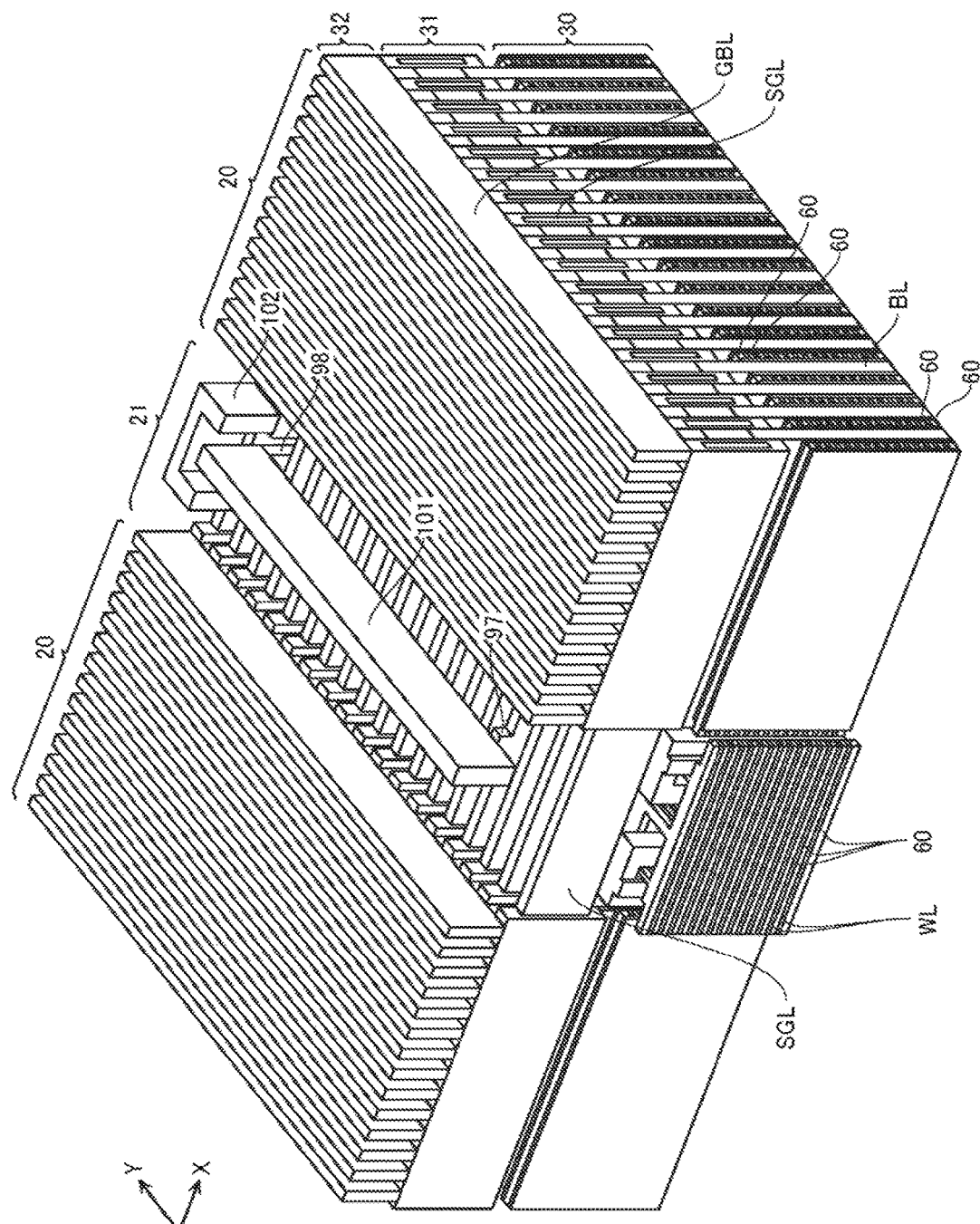
FIG. 3 is a perspective view of external appearance of a memory cell unit.

FIG. 3 is a perspective view of external appearance of the memory cell unit 16 in FIG. 2. Provided between two cell array units 20 is a connection unit 21 for achieving electrical connection with the peripheral circuit layer 12. The memory cell unit 16 is broadly divided into three layers in a stacking direction, that is, in order of closeness to the peripheral circuit layer 12, a lower wiring line layer 30, a middle wiring line layer 31, and an upper wiring line layer 32. Detailed configurations of each layer and each unit will be described in detail by FIG. 4 and later drawings.

Now, in FIG. 3, a first direction which is horizontal to the substrate 10 and in which the word line WL extends is referred to as an X direction. Moreover, a second direction which is horizontal to the substrate 10 and which intersects the X direction is referred to as a Y direction. Furthermore, a third direction (the stacking direction) which intersects both of the X direction and the Y direction is referred to as a Z direction. Meanings of these directions are similar also in descriptions of FIG. 4 and later drawings.

As shown in FIG. 3, the lower wiring line layer 30 of the cell array unit 20 has stacked therein, via an insulating film 60, a plurality of the word lines WL extending in the X direction. The middle wiring line layer 31 of the cell array unit 20 is provided with a plurality of the select gate lines SGL extending in the X direction, and said select gate lines SGL extend to the cell array unit 20 on an opposite side via the connection unit 21. The upper wiring line layer 32 of the cell array unit 20 is provided with a plurality of the global bit lines GBL extending in the Y direction.

The lower wiring line layer 30, the middle wiring line layer 31, and the upper wiring line layer 32 are formed also in the connection unit 21, similarly to in the cell array unit 20. Wiring lines of each wiring line layer are respectively formed by the same materials as wiring lines of the cell array unit 20. Formed in the upper wiring line layer 32 of the connection unit 21 are a first wiring line pattern 101 and a second wiring line pattern 102, and these wiring line patterns are connected to downward wiring line layers via a third penetrating electrode 97 and a fourth penetrating electrode 98. Detailed configurations of the cell array unit 20 and the connection unit 21 will be mentioned later.

Figure 4:
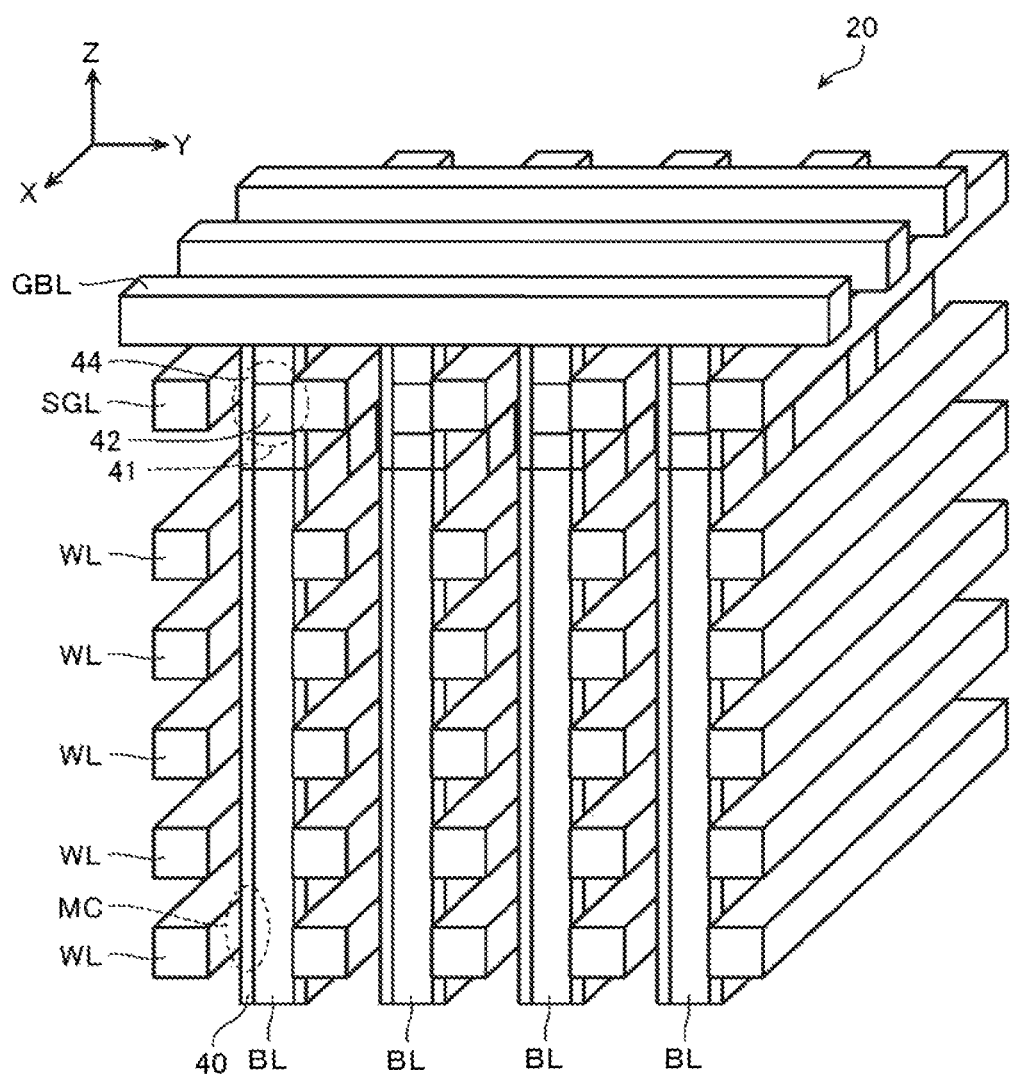
FIG. 4 is a perspective view of external appearance showing part of a cell array unit.

FIG. 4 is a perspective view of external appearance showing part of the cell array unit 20. The plurality of word lines WL extending in the X direction are disposed with a certain spacing in each of the Y direction and the Z direction. Respectively provided upwardly of the word lines WL (on an opposite side to the peripheral circuit layer 12) are the plurality of select gate lines SGL extending in the X direction and the plurality of global bit lines GBL extending in the Y direction.

Disposed between the word lines WL with a certain spacing in each of the X direction and the Y direction are the plurality of column shaped bit lines BL extending in the Z direction. Formed on a side surface facing the word line WL of side surfaces of the bit line BL is a variable resistance layer 40 whose resistance changes by application of a voltage. The variable resistance layer 40 is sandwiched by the bit line BL and the word line WL at each of intersections of the bit line BL and the word line WL. The variable resistance layer 40 of said region is applied with voltages corresponding to each of the operations of read/write/erase from each of the bit line BL and the word line WL, and thereby functions as the memory cell MC which is a storage element.

The variable resistance layer 40 is formed from a resistance varying material that undergoes transition between at least two states, that is, a low-resistance state and a high-resistance state. The variable resistance layer 40 in the high-resistance state undergoes transition to the low-resistance state when a certain voltage or more is applied to that variable resistance layer 40. The variable resistance layer 40 in the low-resistance state undergoes transition to the high-resistance state when a certain current or more is passed through that variable resistance layer 40. Employable as the variable resistance layer 40 is, for example, hafnium oxide (HfO), but alternatively, a thin film layer including the likes of $TiO_2$, $ZnMn_2O_4$, NiO, AlO, $SrZrO_3$, $Pr_{0.7}Ca_{0.3}MnO_3$, and so on, may be appropriately employed.

A channel region 42 is formed at an upper end of the bit line BL. A gate insulating film 44 is formed on a side surface of the channel region 42. The channel region 42 is configured to contact the select gate line SGL via said gate insulating film 44. Said region positioned at the upper end of the bit line BL functions as a selection element 41 for selecting the bit line BL.

Figure 5A:
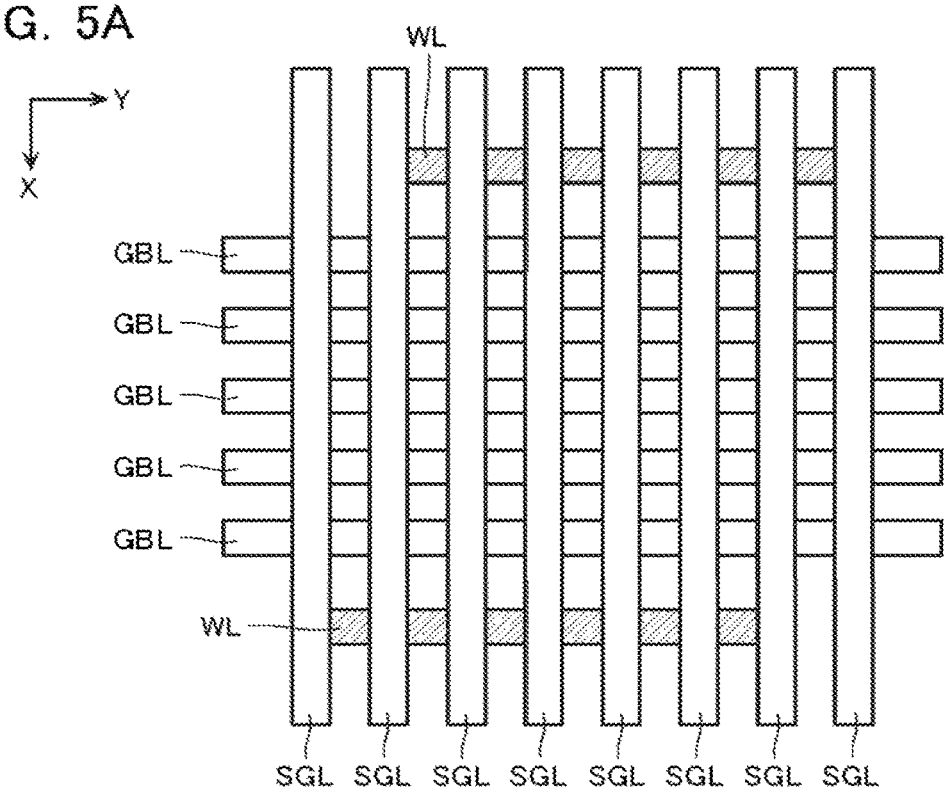
FIG. 5A is a plan view in which the cell array unit is viewed front above (an opposite side to a substrate).
Figure 5B:
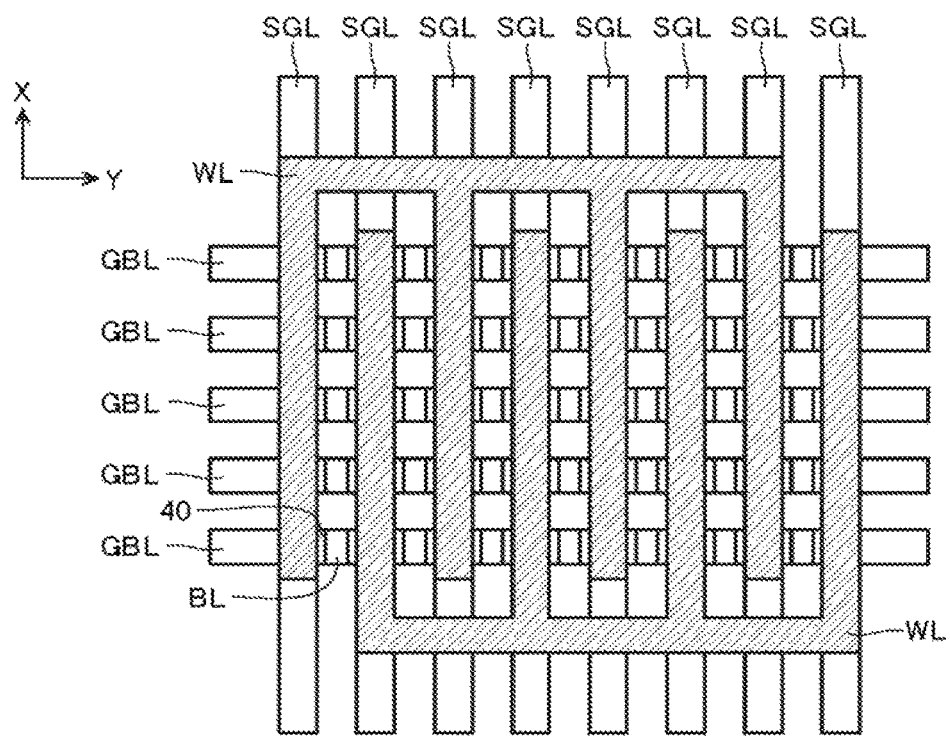
FIG. 5B is a plan view in which the cell array unit is viewed from below (a substrate side).

FIGS. 5A and 5B are plan views in which the cell array unit 20 of FIG. 4 is viewed from the stacking direction (Z direction). FIG. 5A is a top view in which the cell array unit 20 is viewed from above, and FIG. 5B is a bottom view in which the cell array unit 20 is viewed from below (a peripheral circuit layer 12 side). As shown in FIG. 5B, the plurality of word lines WL extending in the X direction are alternately bunched by a base portion 120 extending in the Y direction, and form comb tooth shaped electrode patterns that face each other. Each of the comb type electrode patterns is provided with an identical voltage.

FIG. 6 is a cross-sectional schematic view along a Y-Z planar surface of the cell array unit 20, and FIG. 7 is a table showing applied voltages to the cell array unit 20 during each of the operations of read/write/erase. In FIG. 7, SGL_s indicates a selected gate line, SGL_u indicates an unselected gate line, GBL_s indicates a selected global bit line, GBL_u indicates an unselected global bit line, WL_s indicates a selected word line, and WL_u indicates an unselected word line.

FIG. 6 shows an example where the memory cell of a region surrounded by the symbol MC is selected by respectively selecting the one of the comb type electrode patterns for the bottom-word line WL and the second from right bit line BL. At this time, the selected word line WL is applied with a bias voltage of the selected word line WL_s. Moreover, the select gate lines SGL on both sides of the channel region 42 in the upper end of the selected bit line SL are applied with a bias voltage of the selected gate line SGL_s, and the selection element 41 attains an on state. As a result, the selected bit line BL is applied with a bias voltage of the selected global bit line GBL_s via the channel region 42. The other select gate lines SGL are applied with a bias voltage of the unselected gate line SGL_u, hence the selection element 41 attains an off state. As a result, the unselected bit lines BL are not applied with the bias voltage of the selected global bit line GBL_s.

Next, details of applied voltages during each of the operations will be described with reference to FIG. 7. During a write operation that stores information in the memory cell MC, the selected global bit line (GBL_s) is applied with a Write voltage (Vw), and the selected gate line (SGL_s) is applied with a Write select gate voltage (Vg_w). Meanwhile, the selected word line (WL_s) is set unchanged at 0 V. As a result, both ends of the memory cell MC are applied with a bias voltage corresponding to the Write voltage (Vw) and a resistance value of the variable resistance layer 40 changes, whereby write of data is performed. At this time, the unselected global bit line (GBL_u) and the unselected word line (WL_u) are applied with a voltage (Vwf) such that a cell voltage of a half-selected cell is half of a selected cell voltage. In addition, the unselected select gate line (SGL_u) is maintained in a state of 0 V.

Next, during an erase operation that erases information of the memory cell MC, it is taken into account that a bipolar operation (transition from the high-resistance state to the low-resistance state and transition from the low-resistance state to the high-resistance state being made by applied voltages of different polarity) is performed by the variable resistance layer 40. That is, the selected global bit line (GBL_s) is applied with an offset voltage Vof (for example, about 1 V), and the selected gate line (SGL_s) is applied with an Erase select gate voltage (Vg_e). Meanwhile, the selected word line (WL_s) is applied with a value of the offset voltage Vof (approximately about 1 V) added to an Erase voltage (Ves). As a result, the selected memory cell MC is applied with a bias voltage corresponding to the Erase voltage (Ves) and the resistance value of the variable resistance layer 40 changes, whereby erase of data is performed. At this time, the unselected global bit line (GBL_u) and the unselected word line (WL_u) are applied with a voltage of Vof added to a voltage (Vef) such that the cell voltage of the half-selected cell is half of the selected cell voltage. In addition, the unselected select, gate line (SGL_u) is maintained in a state of 0 V.

Now, the reason why the offset voltage Vof is added to the selected global bit line GBL_s and the word line WL is because in terms of characteristics of the selection element 41, setting a potential of the selected global bit line (GBL_s) to a value about 1 V higher than the unselected select gate line (SGL_u) makes it possible to substantially reduce a leak current to an unselected cell. Employing as a means thereof a method that inflates an overall voltage of the selected global bit line GBL_s and the word line WL as in the present embodiment makes it unnecessary to provide a negative voltage circuit, whereby a reduction in circuit area can be achieved.

Next, during a read operation that reads information of the memory cell MC, the selected global bit line (GBL_s) is applied with a voltage of the offset voltage (Vo) added to a Read voltage (Vr), and the selected word line (WL_s) is applied with the offset voltage (Vo). In this state, a Read select gate voltage (Vg_r, 0) applied to the selected gate line (SGL_s) is controlled to perform the read. At this time, the unselected global bit line (GBL_u) and the unselected word line (WL_u) are applied with a voltage of the offset voltage (Vo) added to the Read voltage (Vr). In addition, the unselected select gate line (SGL_u) is maintained in a state of 0 V.

Now, the reason why the offset voltage Vo is added to the selected global bit line GBL_s and the word line WL will be described. Normally, immediately after the write operation or the erase operation has been performed on the memory cell MC, the read operation of said memory cell MC is performed, and it is confirmed whether a desired resistance value has been achieved (verify operation). At this time, when the resistance value of said memory cell MC differs from a range of the desired resistance value, an additional write operation or erase operation is performed. Therefore, when a large voltage difference exists between bias conditions in the write operation or the erase operation and bias conditions in the read operation, there is a possibility that an increase in power consumption or a delay in operation time occurs. It is particularly undesirable that an operation accompanied by a rapid voltage change is performed by a node having a large parasitic capacitance.

In the present embodiment, parasitic capacitance of the global bit line GBL is largest, hence it is preferable to set such that the potential of the global bit line GBL does not change greatly between the read operation and other operations (the write operation or the erase operation). Furthermore, there are more unselected global bit lines (GBL_u) than selected global bit lines (GBL_s), hence it is preferable to set such that the potential of the unselected global bit line does not change greatly between the read operation and other operations (the write operation or the erase operation). Therefore, it is preferable to set the offset voltage Vo such that Vwf and Vr+Vo are substantially equal during write and Vef+Vof and Vr+Vo are substantially equal during erase.

In each of the operations of write/erase/read, only one selected word line (WL_s) is selected per memory cell array of one block. In contrast, a plurality of selected global bit lines (GBL_s) may be simultaneously selected. As a result, the number of bit lines capable of simultaneously performing write/erase/read increases, hence making it possible to achieve a reduction in operation time.

Figure 8:
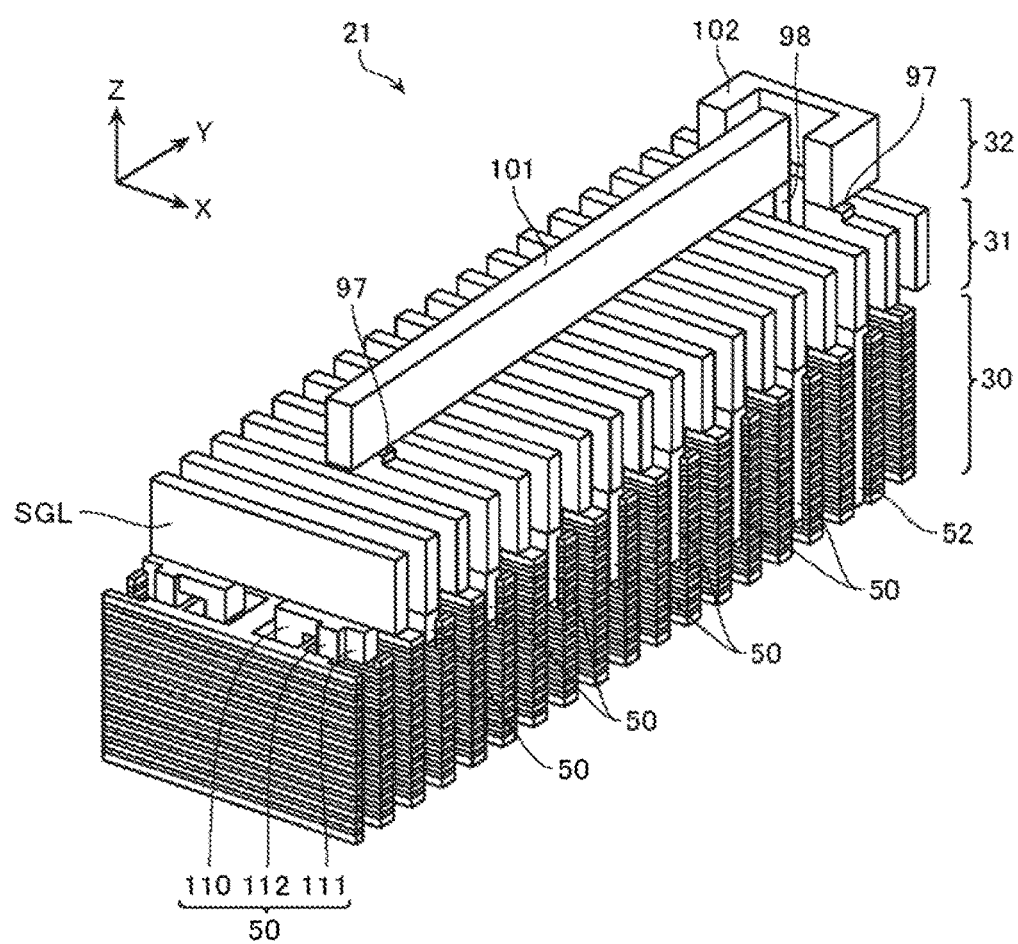
FIG. 8 is a perspective view of external appearance of a connection unit.

FIG. 8 is a perspective view of external appearance of the connection unit 21, and illustration of an inter-layer insulating film is omitted. In the lower wiring line layer 30 of the connection unit 21, a stacked structure of the word lines WL extending from the cell array unit 20 is bunched by the base portion 120 (refer to FIG. 9) extending in the Y direction. Layers of word lines WL are formed from, for example, 16 layers, via the inter-layer insulating film between the layers. Each layer of word lines WL is electrically connected to the peripheral circuit layer 12 positioned downwardly of the cell array unit 20 and the connection unit 21, by a first penetrating electrode 50 formed in the lower wiring line layer 30.

The first penetrating electrodes 50 of the present embodiment are disposed eight at a time aligned in two columns in the Y direction, and are respectively connected to 16 different layers of word lines WL. The first penetrating electrodes 50 each include two columnar portions. A first columnar portion 111 positioned on an outer side is connected to the word line WL, and a second columnar portion 110 positioned on an inner side penetrates the entire lower wiring line layer 30 to be electrically connected to the peripheral circuit layer 12. The first columnar portion 111 and the second columnar portion 110 are connected by a bridging portion 112 at an upper surface of the lower wiring line layer 30. A detailed configuration of the first penetrating electrode 50 is as shown in the manufacturing process view of FIG. 67.

Moreover, formed in the lower wiring line layer 30 is a second penetrating electrode 52 that electrically connects wiring line layers (the middle wiring line layer 31 and the upper wiring line layer 32) positioned upwardly of the lower wiring line layer 30, and the peripheral circuit layer 12. The second penetrating electrode 52 is positioned on an outer side of a region where the first penetrating electrode 50 is formed, and penetrates the lower wiring line layer 30 from an upper surface to a lower surface. A detailed configuration of the second penetrating electrode 52 is also as shown in the manufacturing process view of FIG. 67.

Provided in the middle wiring line layer 31 positioned on the lower wiring line layer 30 are the plurality of select gate lines SGL extending from the cell array unit 20. In principle, the select gate lines SGL are disposed in parallel so as to extend in the X direction, but the select gate line SGL positioned at a connection portion with the second penetrating electrode 52 alone has a partly divided shape.

Provided in the upper wiring line layer 32 positioned on the middle wiring line layer 31 are the first wiring line pattern 101 and the second wiring line pattern 102 formed in the same wiring line layer as the global bit line GBL. The first wiring line pattern 101 extends in the Y direction, has its one end connected to the fourth from end select gate line SGL via a third penetrating electrode 97, and has its other end connected to the second penetrating electrode 52 in the lower wiring line layer 30 via a fourth penetrating electrode 98. The third penetrating electrode 97 that connects the first wiring line pattern 101 and the select gate line SGL is formed by the same material as the select gate line SGL and integrally with the select gate line SGL, in a shape where part of the select gate line SGL protrudes upwardly. On the other hand, the fourth penetrating electrode 98 that connects the first wiring line pattern 101 and the second penetrating electrode 52 is formed by a different material from the select gate line SGL and the third penetrating electrode 97.

Due to the above-described configuration, the fourth from end select gate line SGL is electrically connected to the peripheral circuit layer 12 positioned downwardly of the connection unit 21, via the third penetrating electrode 97, the first wiring line pattern 101, the fourth penetrating electrode 98, and the second penetrating electrode 52. Moreover, the second wiring line pattern 102 is a wiring line pattern formed so as to bypass the connection portion of the first wiring line pattern 101 and the fourth penetrating electrode 98, and its both ends are each connected to the select gate line SGL via the third penetrating electrode 97. As a result, the fellow select gate lines SGL divided at a place of formation of the fourth penetrating electrode 98 are electrically connected via the second wiring line pattern 102 in the upper wiring line layer 32.

Figure 9:
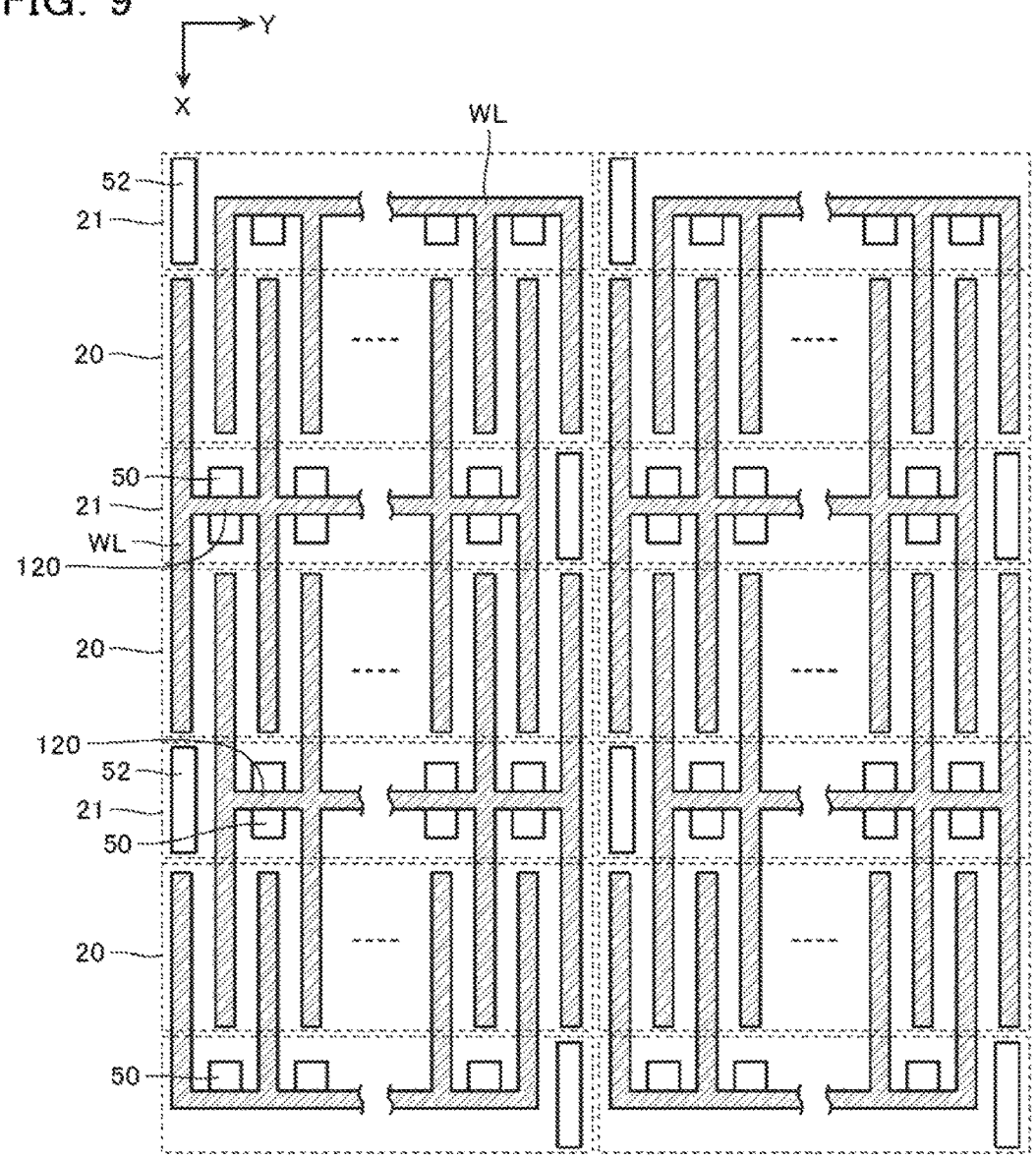
FIG. 9 is a planar schematic view of a lower wiring line layer.

FIG. 9 is a planar schematic view of the lower wiring line layer 30 including a plurality of the cell array units 20 and the connection units 21. The word lines WL are bunched by the base portion 120 and form comb tooth shaped electrode patterns that face each other in the X direction. Of the penetrating electrodes formed in the lower wiring line layer 30, the first penetrating electrode 50 that connects the word line WL and the peripheral circuit layer 12 is provided in a region where fellow teeth of the comb teeth face each other in the X direction. In said region, the word lines WL extending from the base portion 120 are not formed, and interference with said word lines WL can be avoided.

Moreover, of the penetrating electrodes formed in the lower wiring line layer 30, the second penetrating electrode 52 that connects wiring line layers upward of the lower wiring line layer 30 and the peripheral circuit layer 12 is provided between fellow comb tooth shaped wiring line patterns adjacent in the Y direction. In said region, neither of the base portion 120 of the word lines WL nor the word lines WL extending from the base portion 120 are formed, and interference with these layers can be avoided.

In a conventional publicly-known semiconductor memory device, the peripheral circuit layer 12 shown in FIG. 2 is formed not on a side where the stacked structure of the word lines WL is formed (a lower wiring line layer 30 side of the present embodiment), but on a side where the global bit lines GSL are formed (an upper wiring line layer 32 side of the present embodiment). Therefore, in order to electrically connect the word line WL and the peripheral circuit layer 12, contacts are formed avoiding the select gate line SGL positioned between them, in the connection unit 21. As a result, space of the connection unit 21 increases, and it sometimes ends up becoming difficult to achieve an increased integration level of the semiconductor memory device.

In contrast, in the semiconductor memory device according to the present embodiment, the peripheral circuit layer 12 is provided on the side where the stacked structure of the word lines WL is formed (the lower wiring line layer 30 side). Therefore, a contact (first penetrating electrode 50) for electrically connecting the word line WL and the peripheral circuit layer 12 is directly connected to the peripheral circuit layer 12, without passing through the middle wiring line layer 31 where the select gate lines SGL are present. Therefore, there is no need to form the contact avoiding the select gate line SGL as conventionally, and increase in space of the connection unit 21 can be substantially suppressed.

On the other hand, the select gate line SGL is connected to the peripheral circuit layer 12 by penetrating the lower wiring line layer 30 by a contact (second penetrating electrode 52) formed at a position not overlapping the word line WL. However, the select gate line SGL is shared by a plurality of cell array units 20 aligned in the direction of extension of the select gate line SGL (X direction), hence there is no need to form contacts corresponding to all of the select gate lines SGL in one connection unit 21. For example, as in the present embodiment, it is possible to adopt a configuration in which only one select gate line SGL-dedicated contact is formed per one connection unit 21, and the other select gate lines SGL are electrically connected to the peripheral circuit layer 12 in the other connection units 21. As a result, the number of select gate line SGL-dedicated contacts formed in one connection unit 21 becomes substantially fewer compared to the number of word line WL-dedicated contacts formed in the same connection unit 21, and the influence exerted on space increase of the connection unit 21 is slight.

Due to the above configuration, the semiconductor memory device according to the present embodiment is enabled to achieve miniaturization and an increased integration level of the device by suppressing space increase of the connection unit 21. Note that as explained by FIG. 9, in terms of disposition, the first penetrating electrode 50 and the second penetrating electrode 52 are preferably provided in a gap of the comb tooth shaped wiring line patterns of the word lines WL (a region where fellow teeth face each other). As a result, space increase of the connection unit 21 accompanying formation of the first penetrating electrode 50 and the second penetrating electrode 52 can be suppressed.

Method of Manufacturing

Next, a method of manufacturing the semiconductor memory device according to the first embodiment will be described. The cell array unit 20 and the connection unit 21 shown in FIG. 3 are formed by common manufacturing processes, but FIGS. 10 to 24 show only manufacturing processes of the cell array unit 20, and FIGS. 25 to 48 show only manufacturing processes of the connection unit 21. FIGS. 50 to 67 are views showing manufacturing processes of a stepped structure (later described) in the lower wiring line layer 30 of the connection unit 21. FIGS. 68 to 82 are views showing manufacturing processes of both of the cell array unit 20 and the connection unit 21. A correspondence relationship of each of the process drawings is as in the table shown in FIG. 87.

Figure 10:
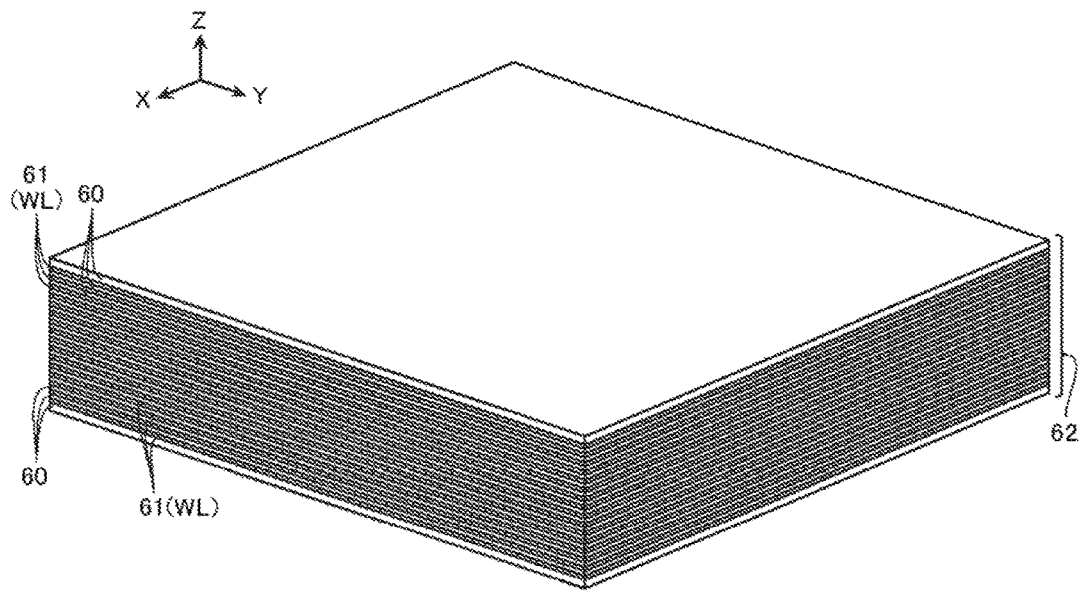
FIG. 10 is a view showing a manufacturing process of the cell array unit (view No. 1).

First, manufacturing processes of the cell array unit 20 will be described with reference to FIGS. 10 to 24. As shown in FIG. 10, the insulating layers 60 and layers which are to be the word lines (referred to below as "WL layer 61") are stacked alternately, and a word line stacked structure 62 which is to be part of the lower wiring line layer 30 is formed. Employable in the insulating layer 60 is, for example, $SiO_2$, and a film thickness of the insulating layer 60 can be set to, for example, 20 nm in a lowermost portion, 13 nm in an uppermost portion, and 7 nm in an inter-layer portion. Employable in the WL layer 61 is, for example, TiN, and a film thickness of the WL layer 61 can be set to, for example, 10 nm.

Figure 11:
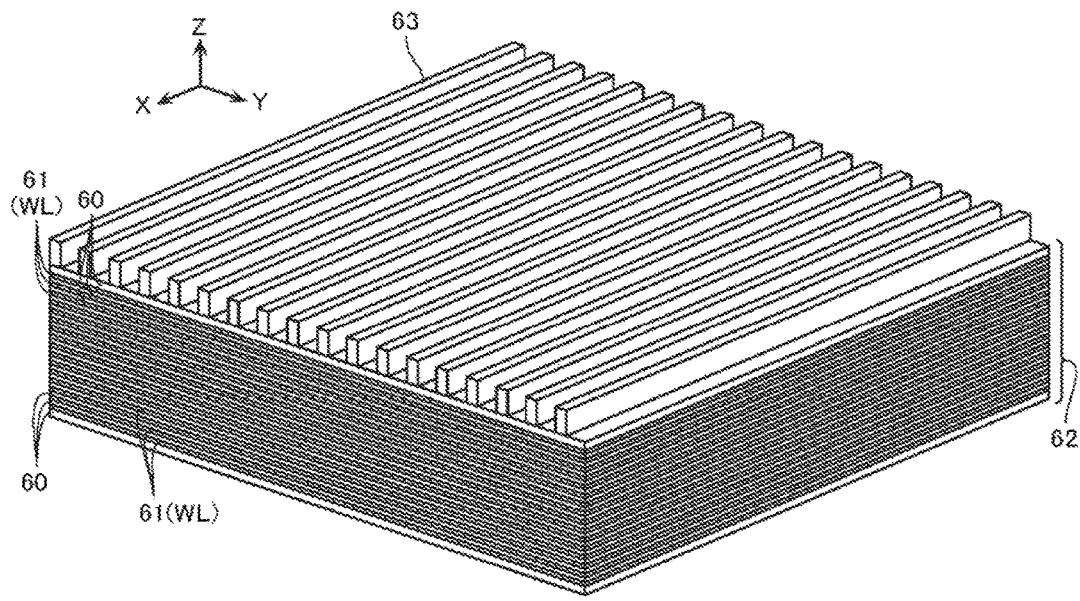
FIG. 11 is a view showing a manufacturing process of the connection unit (view No. 2).

Next, as shown in FIG. 11, an etching mask 63 of the word line stacked structure 62 is formed. A pattern of the word lines WL of the cell array unit 20 is, for example, a striped shape of a line width of 34 nm and space of 42 nm (a half pitch of 38 nm), and can be formed by ordinary photolithography technology and RIE (Reactive Ion Etching) technology.

Figure 12:
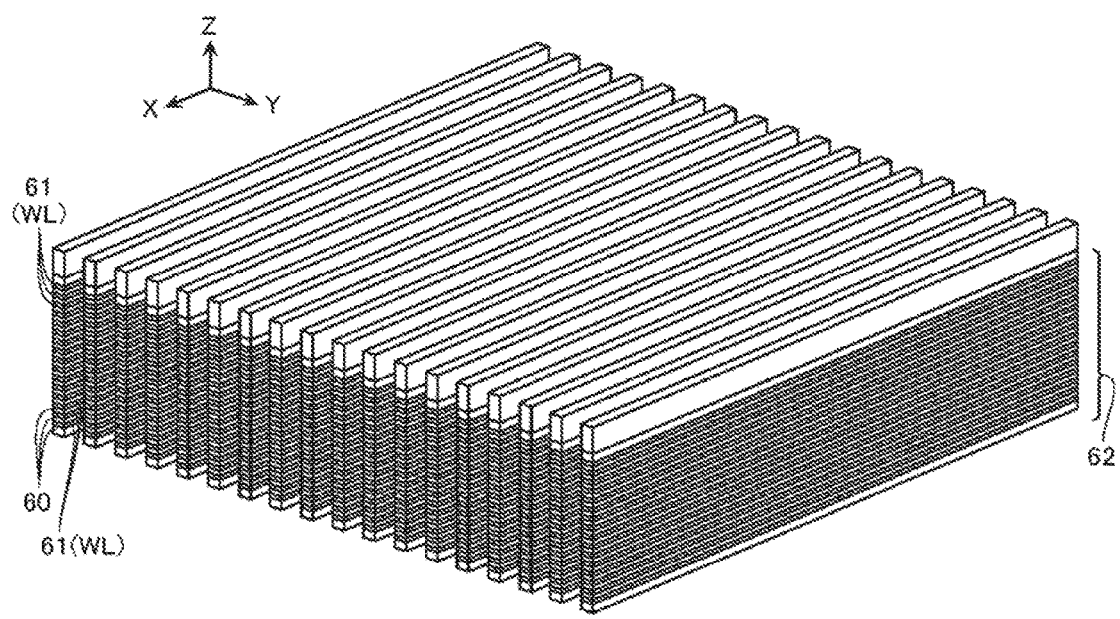
FIG. 12 is a view showing a manufacturing process of the cell array unit (view No. 3).
Figure 13:
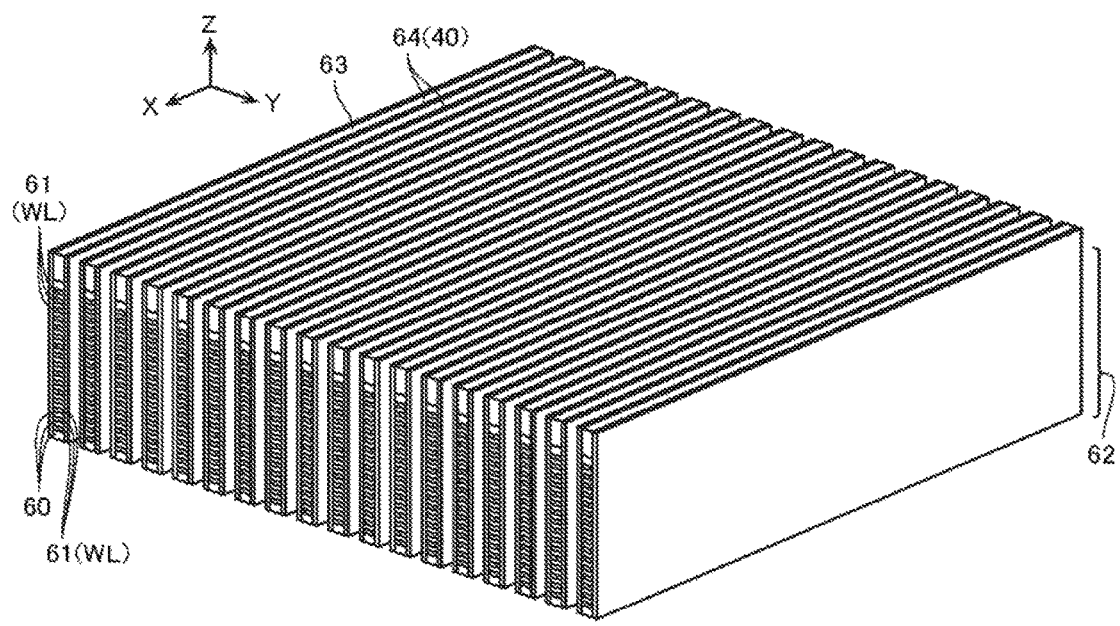
FIG. 13 is a view showing a manufacturing process of the cell array unit (View No. 4).

Next, as shown in FIG. 12, the mask formed in FIG. 11 is employed to batch process the word line stacked structure 62 by RIE technology. Following this, as shown in FIG. 13, a layer 64, which consists of a resistance varying material, is formed on a side surface of the now striped-shaped word line stacked structure 62. This layer 64 corresponds to the variable resistance layer 40 in FIG. 4, employs, for example, HfOx as its material, and can be formed with a thickness of, for example, 4 nm. Formation of the layer 64 can be performed by, for example, an ALD (Atomic Layer Deposition) method. Note that the layer 64 is formed also in a trench bottom portion and upper portion of the patterned word line stacked structure 62, but electrical connection is not formed in these portions, hence they may be disregarded (not illustrated in FIG. 13).

Figure 14:
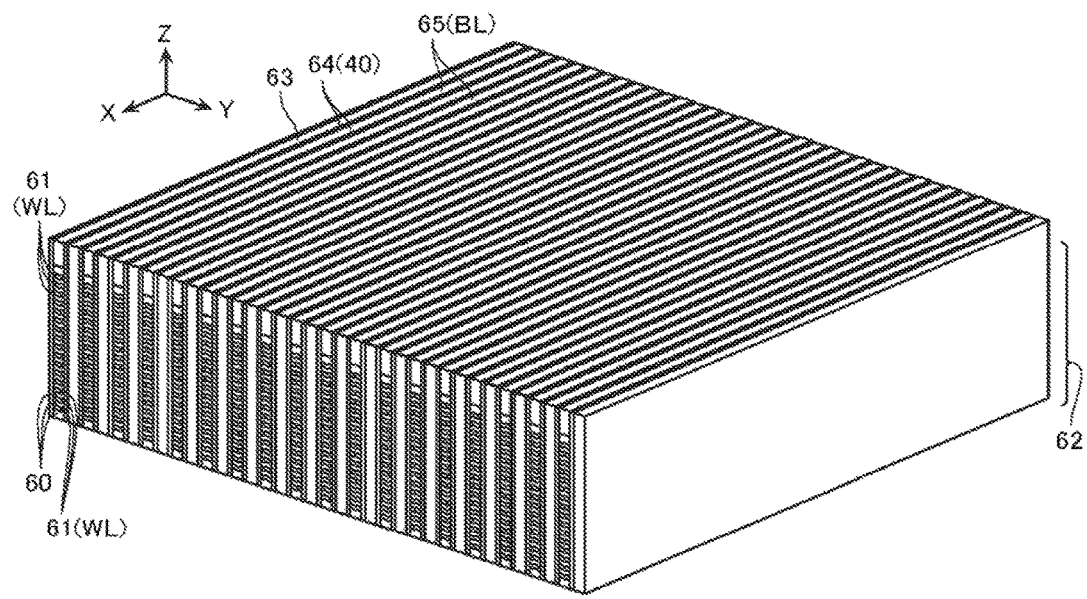
FIG. 14 is a view showing a manufacturing process of the cell array unit (view No. 5).

Next, as shown in FIG. 14, a bit line film 65 is formed in an entire trench portion of the word line stacked structure 62, and by polishing by a CMP (Chemical Mechanical Polishing) method, the bit line film 65 is left only inside the trench. The bit line film 65 corresponds to the bit line BL in FIG. 4, and can be formed employing, for example, n+ type polycrystalline silicon as its material.

Figure 15:
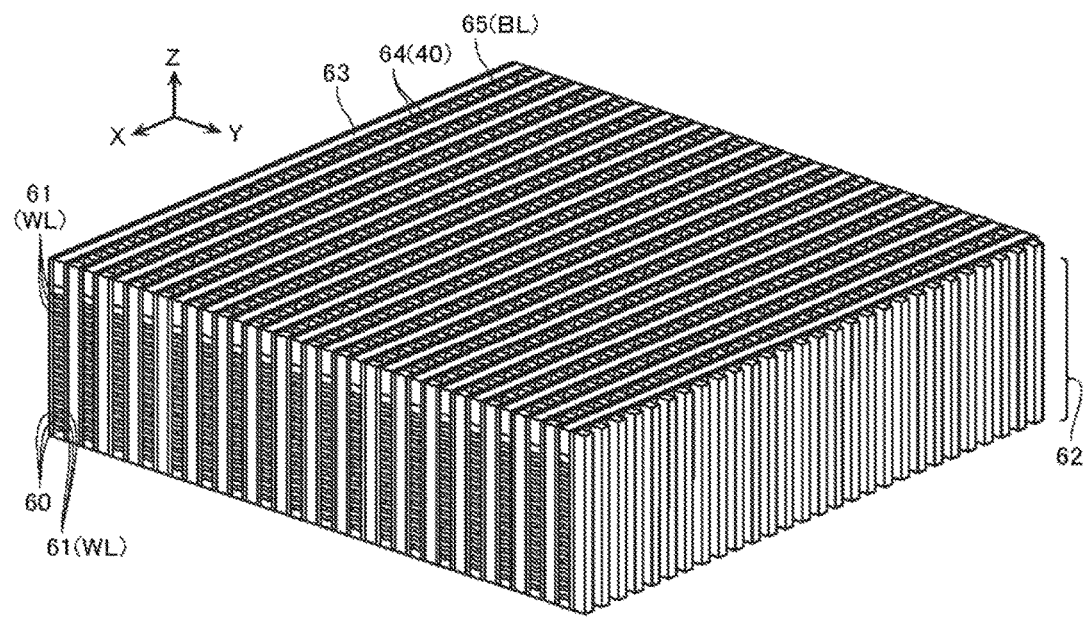
FIG. 15 is a view showing a manufacturing process of the cell array unit (view No. 6).

Next, as shown in FIG. 15, photolithography technology and RIE technology are employed to pattern the bit line film 65 into a pillar shape. The present patterning process can be performed by conditions that, for example, line width and adjacency spacing are both approximately 24 nm. As a result of the present process, the bit line BL is completed. Subsequently, a trench between adjacent bit lines BL is filled with an inter-layer insulating layer (said process is not illustrated), and a surface is planarized by a CMP method.

Figure 16:
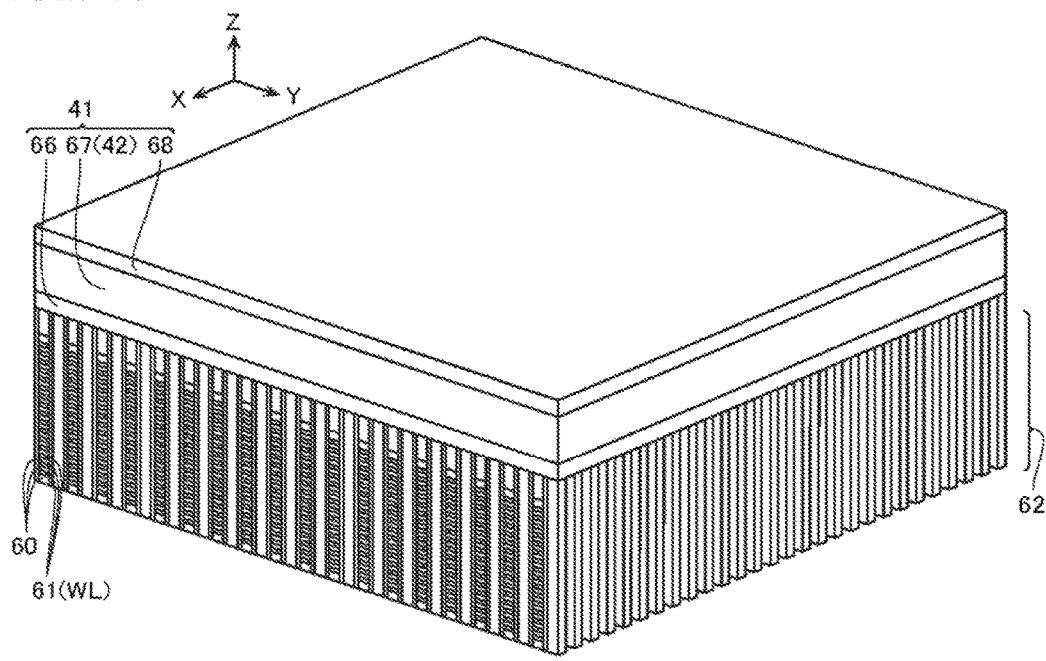
FIG. 16 is a view showing a manufacturing process of the cell array unit (view No. 7).

Next, as shown in FIG. 16, an n+ type silicon layer 66, a p− type silicon layer 67, and an n+ type silicon layer 68 are sequentially formed. The p− type silicon layer 67 corresponds to the channel region 42 in FIG. 4. The n+ type silicon layers 66 and 68 have a dopant concentration of, for example, $1 \times 10^{20}$ cm$^{-3}$, and their film thickness is, for example, 40 nm. The p− type silicon layer 67 has a dopant concentration of, for example, $1 \times 10^{18}$ cm$^{-3}$, and its film thickness is, for example, 120 nm. After the silicon layers 66 to 68 are stacked, annealing is performed by conditions of, for example, approximately 750° C. and 60 seconds, and the silicon layers 66 to 68 are crystallized.

Figure 17:
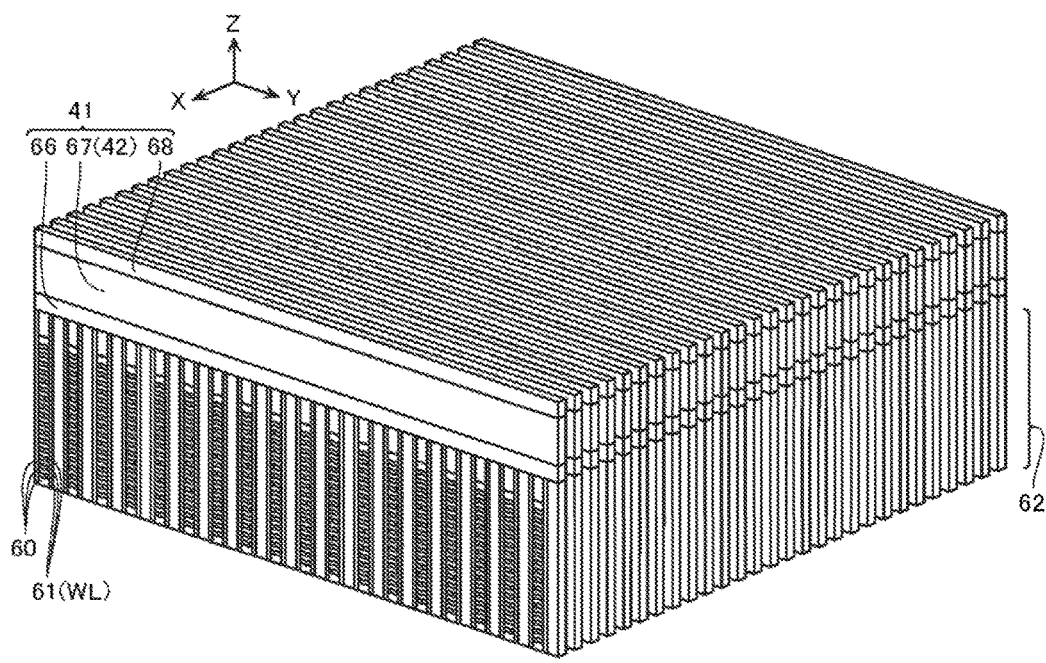
FIG. 17 is a view showing a manufacturing process of the cell array unit (view No. 8).

Next, as shown in FIG. 17, the silicon layers 66 to 68 are patterned by photolithography technology and RIE technology. As a result, a stripe shaped pattern extending in the Y direction is formed. A line width and space of the silicon layer pattern can be set to, for example, 24 nm. Subsequently, an inter-layer insulating layer is formed on an entire surface, and then an upper surface of the n+ type silicon layer 68 is exposed by polishing by the likes of a CMP method. As a result, a trench portion occurring due to the process of FIG. 17 is filled by an inter-layer insulating film (said process is not illustrated).

Figure 18:
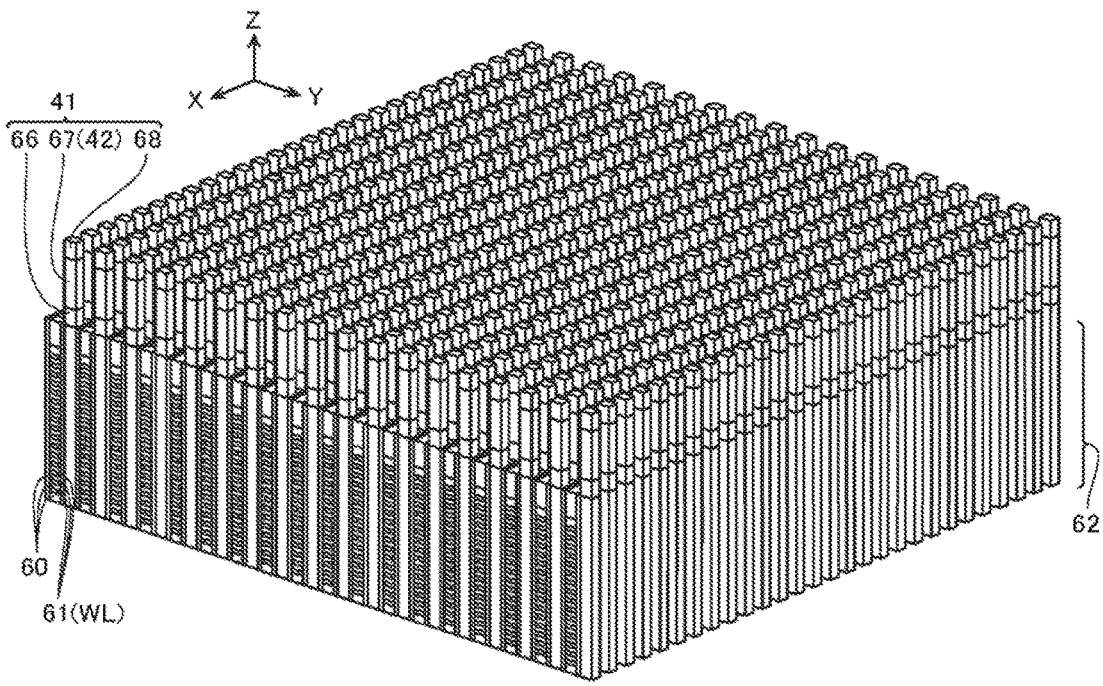
FIG. 18 is a view showing a manufacturing process of the cell array unit (view No. 9).

Next, as shown in FIG. 18, photolithography technology and RIE technology are employed to pattern the silicon layers 66 to 68. As a result, a stripe shaped pattern extending in the X direction is formed, and combined with the process of FIG. 17, the silicon layers 66 to 68 are patterned in a matrix. As a result of the present process, the silicon layers 66 to 68 are divided into the channel regions 42 for each of the selection elements 41 shown in FIG. 4, and are disposed directly above the bit line BL. The present patterning process can be performed by conditions of, for example, a line width of 34 nm and a space of 42 nm (a half pitch of 38 nm).

Figure 19:
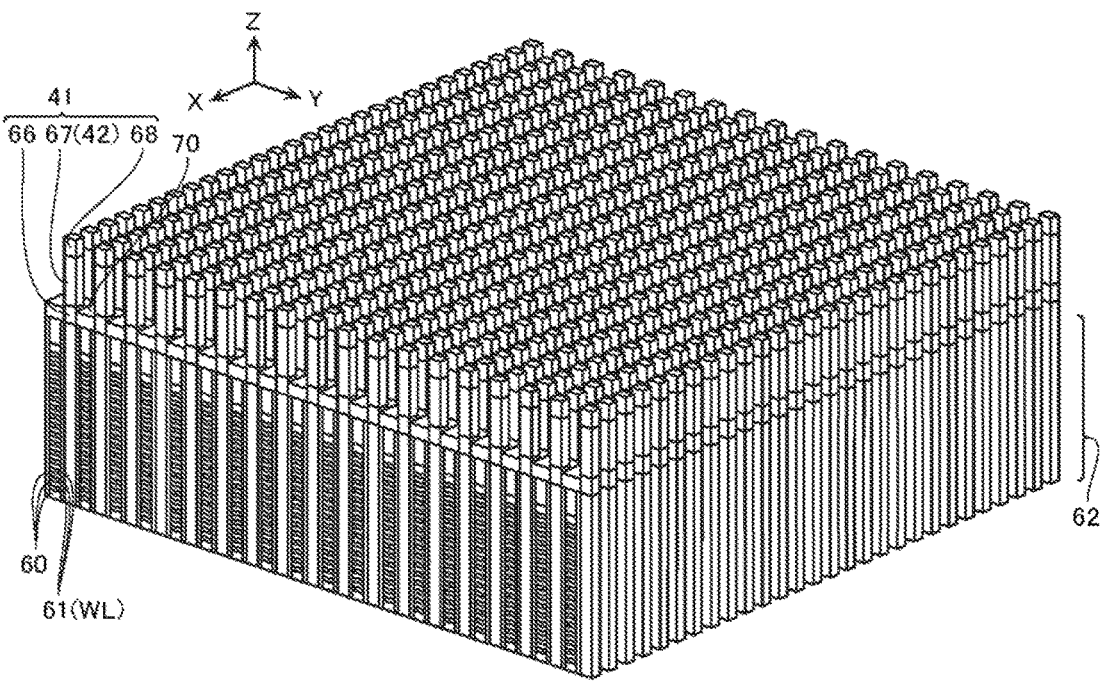
FIG. 19 is a view showing a manufacturing process of the cell array unit (view No. 10).

Next, as shown in FIG. 19, an insulating film 70 is formed on an entire surface of the silicon layers 66 to 68, and then etching is performed, and the insulating film 70 is configured to remain only in a trench bottom portion formed by the silicon layers 66 to 68. Employable in the insulating film 70 is, for example a silicon oxide film, and a thickness of the insulating film 70 can be set to, for example, 30 nm.

Figure 20:
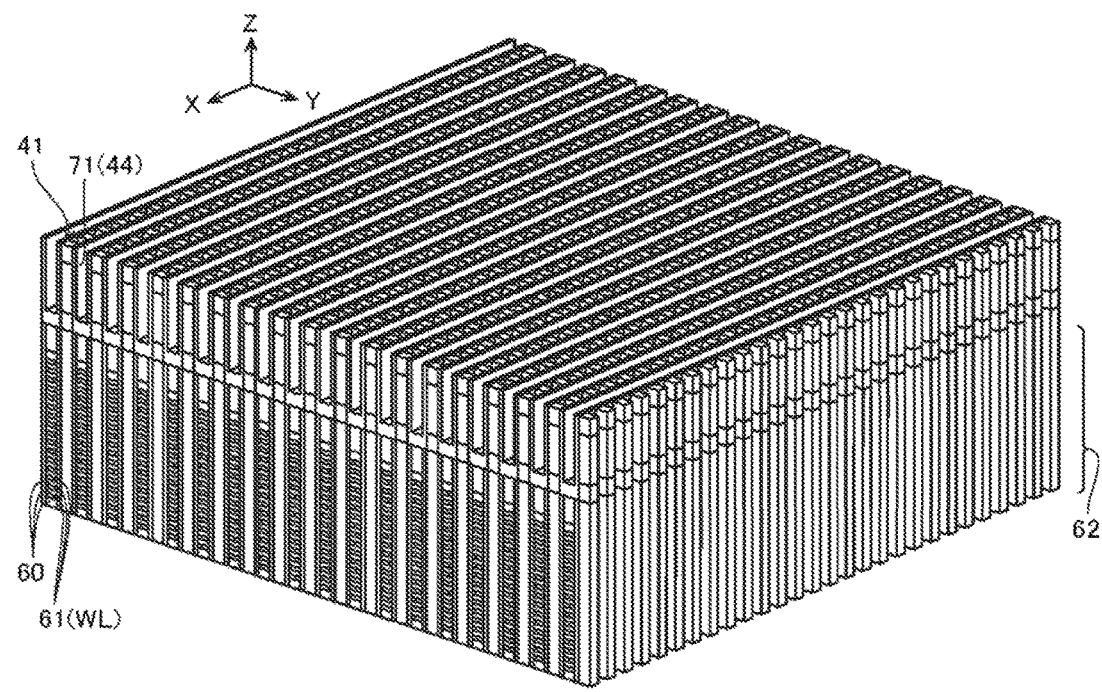
FIG. 20 is a view showing a manufacturing process of the cell array unit (view No. 11).

Next, as shown in FIG. 20, an insulating film 71 is formed on side surfaces of the silicon layers 66 to 68. The insulating film 71 corresponds to the gate insulating film 44 shown in FIG. 4, and its film thickness can be set to, for example, 5 nm. The insulating film 71 is formed also in the trench bottom portion of the silicon layers 66 to 68, but the thickness of the previously mentioned insulating film 70 only changes slightly, hence indication thereof in the present drawing is omitted. Moreover, the insulating film 71 formed on the upper surface of the n+ type silicon layer 68 is removed by a later CMP process (FIG. 22), hence similarly, indication thereof in the present drawing is omitted.

Figure 21:
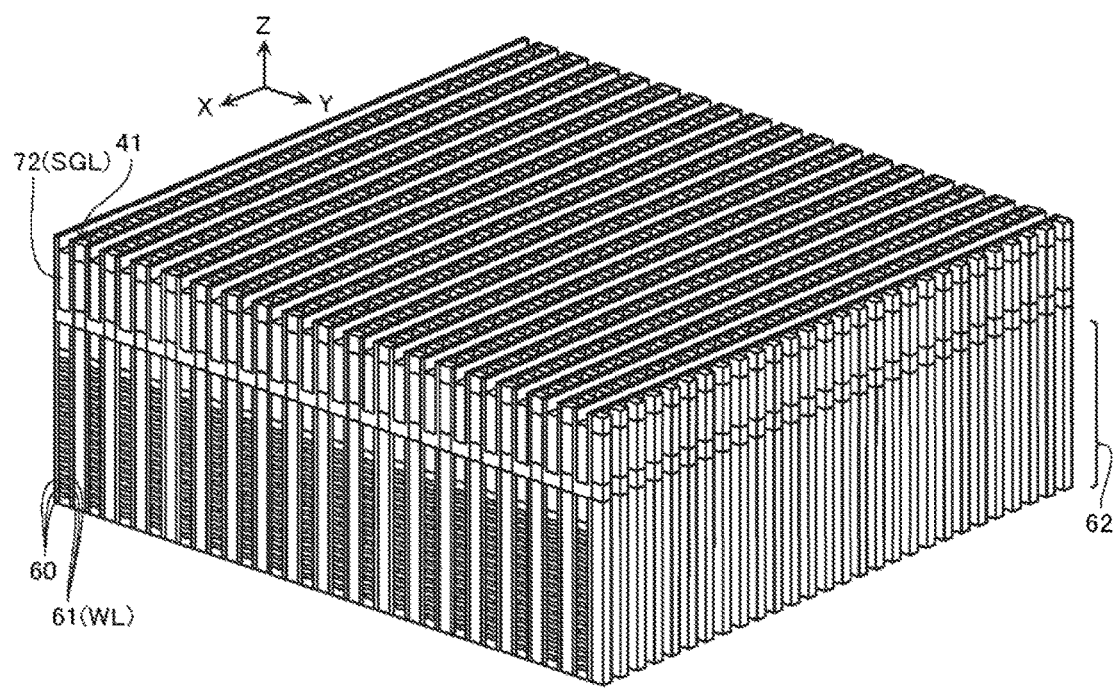
FIG. 21 is a view showing a manufacturing process of the cell array unit (view No. 12).

Next, as shown in FIG. 21, a conductive film 72 is filled inside the trench of the silicon layers 66 to 68. The conductive film 72 corresponds to the select gate line SGL shown in FIG. 4, and may employ, for example, an n+ type polycrystalline silicon layer, but alternatively may employ p+ type polycrystalline silicon, TiN, TiSi, WS, and so on. After filling the conductive film 72, an upper surface of the conductive film 72 is etched, and a film thickness of the conductive film 72 is set to, for example, 140 nm. Due to the present process, a bottom surface of the select gate line SGL is set lower than a lower surface of the p− type silicon layer 67, and an upper surface of the select gate line SGL is set higher than an upper surface of the p− type silicon layer 67.

Figure 22:
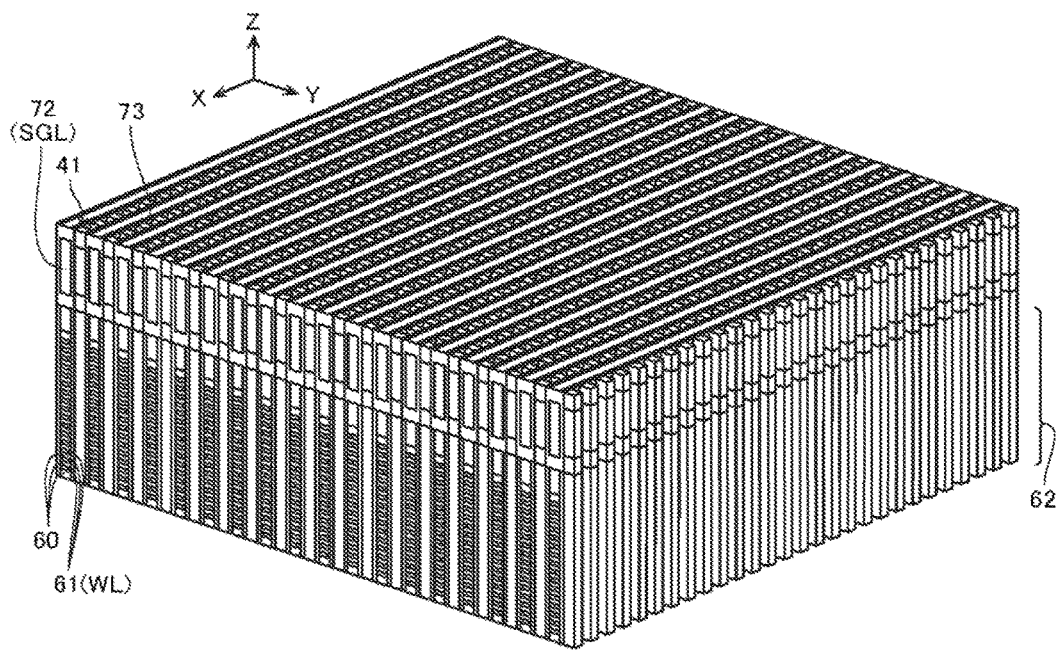
FIG. 22 is a view showing a manufacturing process of the cell array unit (view No. 13).

Next, as shown in FIG. 22, an insulating film 73 is formed on an entire surface. Employable in the insulating film 73 is, for example, a silicon oxide film. Subsequently, the insulating film 73 is polished by, for example, a CMP method, and the insulating film 73 is configured to remain only inside the trench formed by the n+ type silicon layer 68. At this time, the upper surface of the n+ type silicon layer 68 is also exposed.

Figure 23:
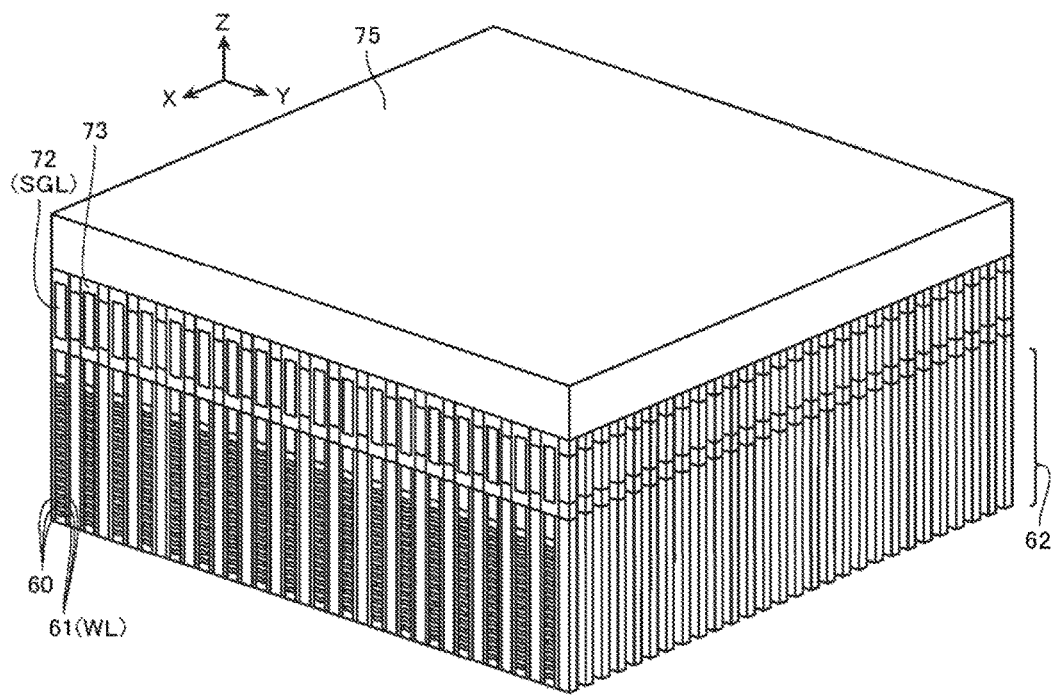
FIG. 23 is a view showing a manufacturing process of the cell array unit (view No. 14).

Next, as shown in FIG. 23, a global bit line film 75 is formed. The global bit line film 75 corresponds to the global bit line GBL shown in FIG. 4. Employable as a material of the global bit line film 75 is, for example, a stacked film of a TiN film acting as a barrier metal and tungsten (W) acting as a wiring line main body.

Figure 24:
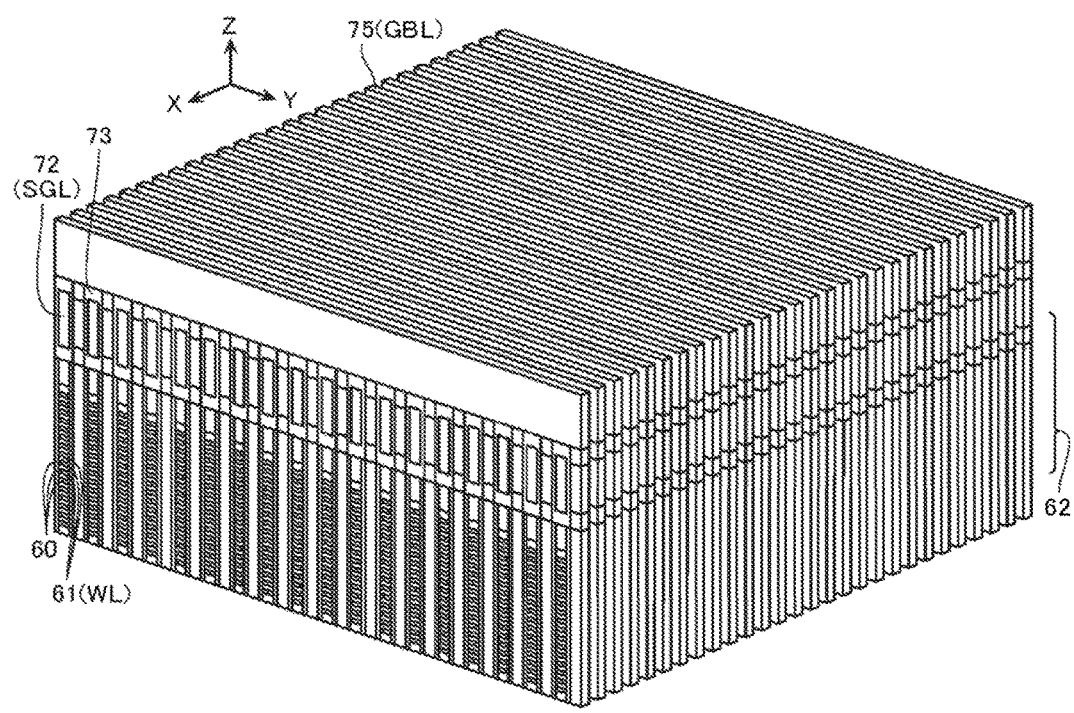
FIG. 24 is a view showing a manufacturing process of the cell array unit (view No. 15).

Next, as shown in FIG. 24, the global bit line film 75 is patterned by photolithography technology and RIE technology, and a stripe shaped pattern extending in the Y direction is formed on the silicon layers 66 to 68 which are to be the selection element 41. A line width and a space of the global bit line GBL may be set to, for example, 24 nm, and a film thickness of the global bit line GBL may be set to, for example, 150 nm. A sheet resistance of the global bit line GBL is, for example, 1.5 Ω/sq. Subsequently, an inter-layer insulating film is formed on an entire surface and polishing is performed by the likes of a CMP method, whereby a trench portion occurring due to formation of the global bit line GBL is filled with the inter-layer insulating film (the present process is not illustrated). As a result, the cell array unit 20 is completed.

Figure 25:
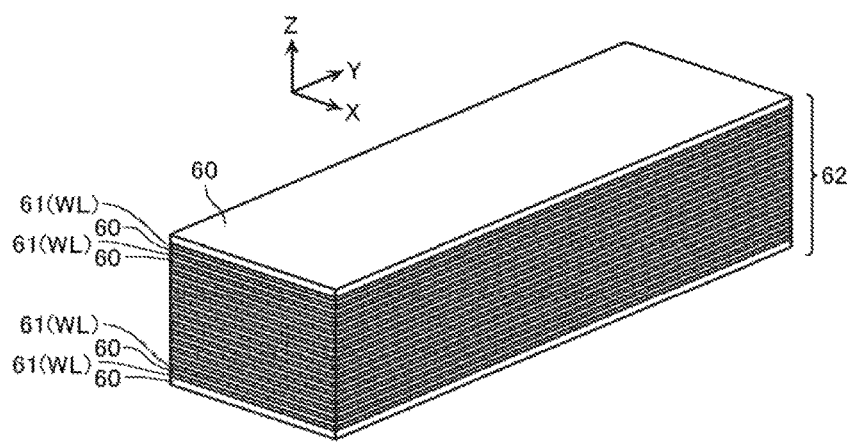
FIG. 25 is a view showing a manufacturing process of the connection unit (view No. 1).

Following this, manufacturing processes of the connection unit 21 will be described with reference to FIGS. 25 to 67. First, as shown in FIG. 25, the insulating layers 60 and the WL layers 61 are stacked alternately, and the word line stacked structure 62 is formed. The present process is similar to that described in FIG. 10.

Figure 26:
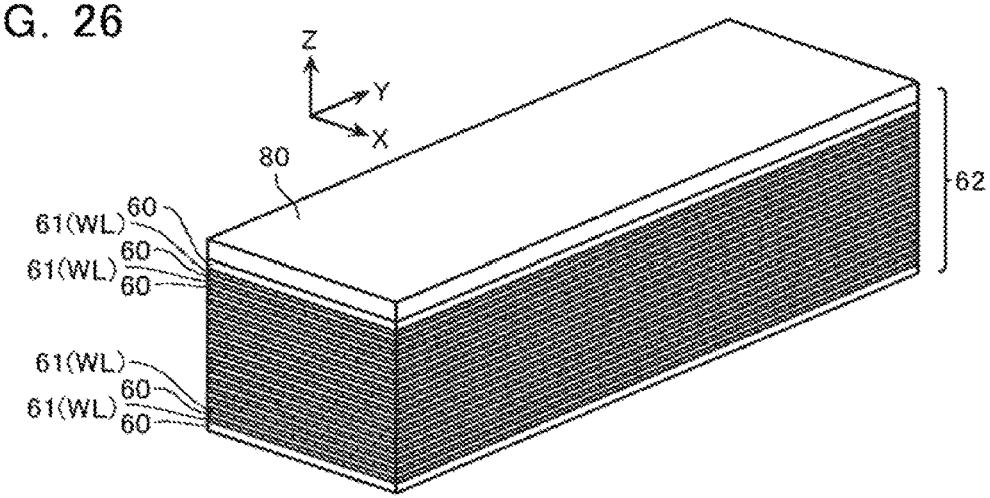
FIG. 26 is a view showing a manufacturing process of the connection unit (view No. 2).
Figure 27:
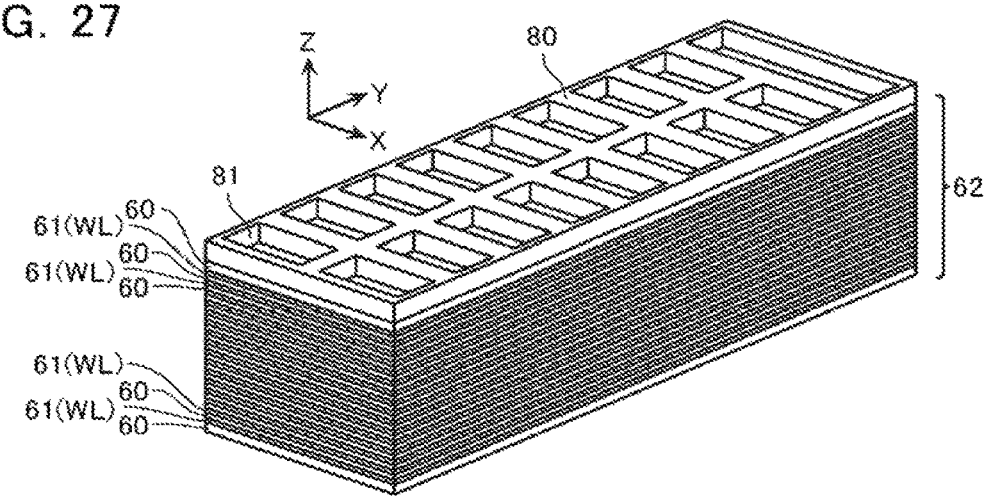
FIG. 27 is a view showing a manufacturing process of the connection unit (view No. 3).

Next, as shown in FIG. 26, an etching-dedicated first mask 80 is formed on an upper surface. Employable in the first mask 80 is, for example, SiN having a film thickness of 100 nm. Next, as shown in FIG. 27, photolithography technology and RIE technology are employed to process the first mask 80 and form a first pattern 81. At this time, an opening of the first pattern 81 is configured to be formed at positions corresponding to the first penetrating electrode 50 and the second penetrating electrode 52 shown in FIG. 8. Note that attention is paid such that RIE stops at a stage where the first mask has been penetrated and an upper surface of the word line stacked structure 62 is not removed.

Figure 28:
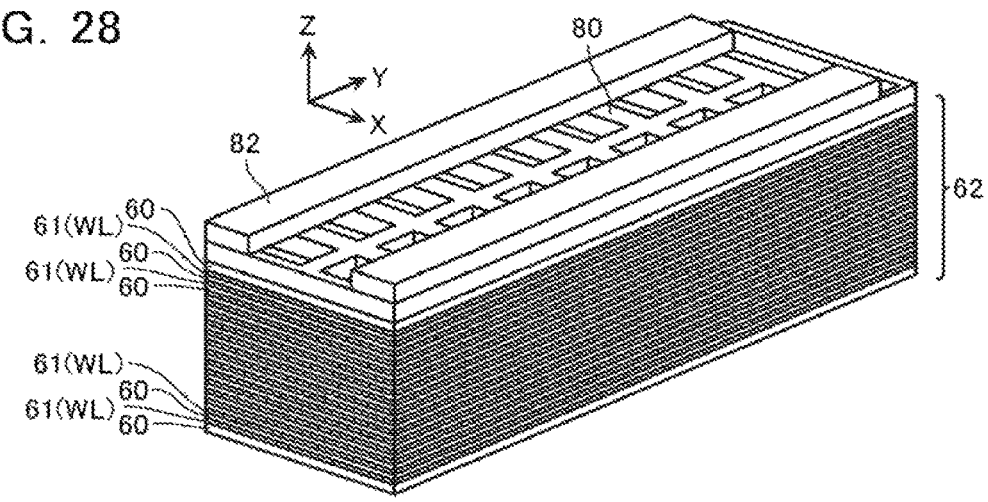
FIG. 28 is a view showing a manufacturing process of the connection unit (view No. 4).

Next, as shown in FIG. 28, an etching-dedicated second mask 82 is formed overlapping the first mask 80. Employable in the second mask 82 is, for example, a coating type carbon system film having a film thickness of 100 nm. The second mask 82 extends in the Y direction and is formed so as to cover part of the opening of the first mask 80 (a position where the first columnar portion 111 of the first penetrating electrode 50 shown in FIG. 8 is formed).

Figure 29:
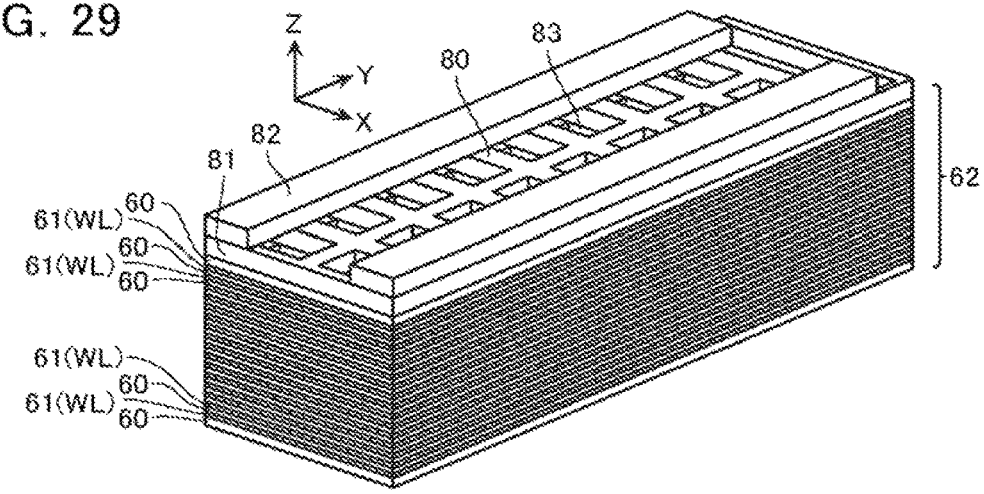
FIG. 29 is a view showing a manufacturing process of the connection unit (view No. 5).

Next, as shown in FIG. 29, the word line stacked structure 62 at portions thereof not covered by either of the first mask 80 and the second mask 82 is removed to a lowermost layer using RIE technology, and a first through-hole 83 is formed. The first through-hole 83 formed in the present process is later to be a connection portion to the peripheral circuit layer 12, hence the above-described RIE may be performed to a depth reaching the peripheral circuit layer 12. The second penetrating electrode 52 and the second columnar portion 110 of the first penetrating electrode 50 shown in FIG. 8 correspond to the first through-hole 83 formed in the present process.

Figure 30:
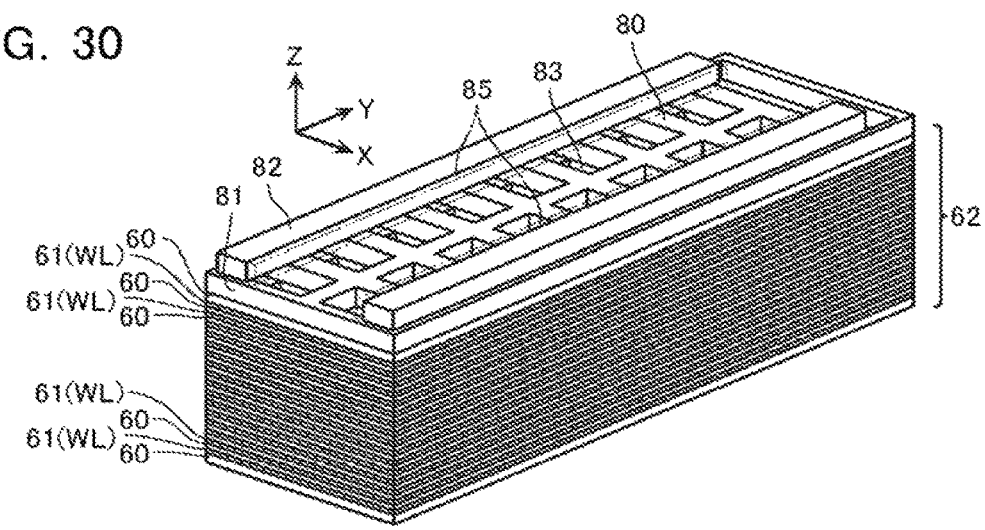
FIG. 30 is a view showing a manufacturing process of the connection unit (view No. 6).
Figure 31:
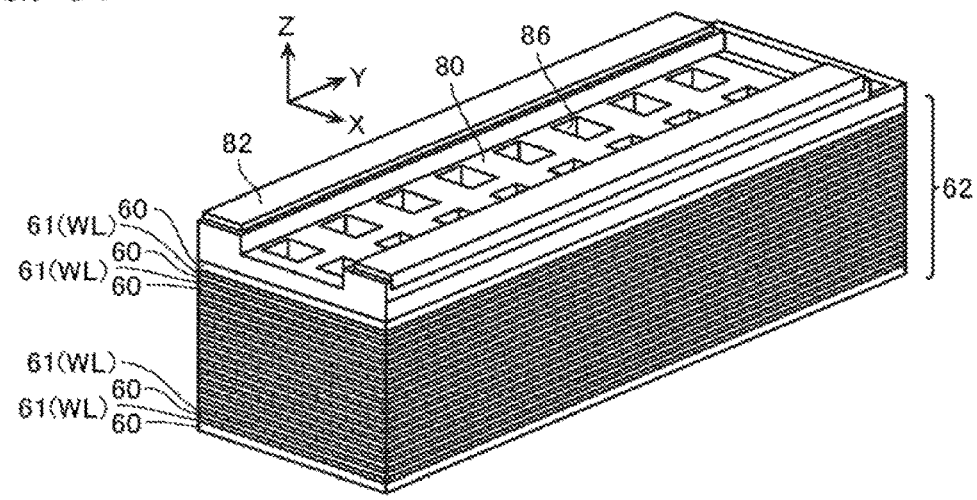
FIG. 31 is a view showing a manufacturing process of the connection unit (view No. 7).

Next, as shown in FIG. 30, the second mask 82 is etched isotropically. Due to the present process, the second mask 82 is shrunk (reduced) by, for example, 10 nm in the X direction (refer to symbol 85). Next, as shown in FIG. 31, a first sidewall protecting film 86 is formed uniformly on an entire surface. As a result, a side surface of the first through-hole 83 formed in FIG. 29 and a side surface of the second mask 82 shrunk by the process of FIG. 30 are covered by the first sidewall protecting film 86. Employable in the first sidewall protecting film 86 is, for example, SiN having a film thickness of 10 nm.

Figure 32:
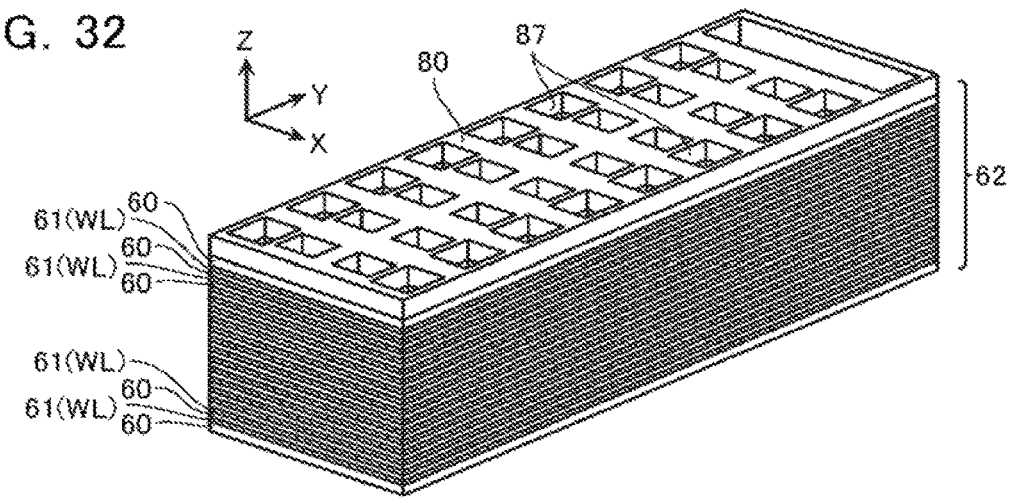
FIG. 32 is a view showing a manufacturing process of the connection unit (view No. 8).

Next, as shown in FIG. 32, the second mask 82 is removed. Subsequently, a region which is not covered by either of the first mask 80 or the first sidewall protecting film 86 and which was covered by the second mask 82 (refer to symbol 87) is removed using RIE technology until an uppermost layer word line WL film is reached. Removed by etching in the present process is part of a region where the first columnar portion 111 connected to the word line WL of the first penetrating electrode 52 shown in FIG. 8 is formed.

Figure 33:
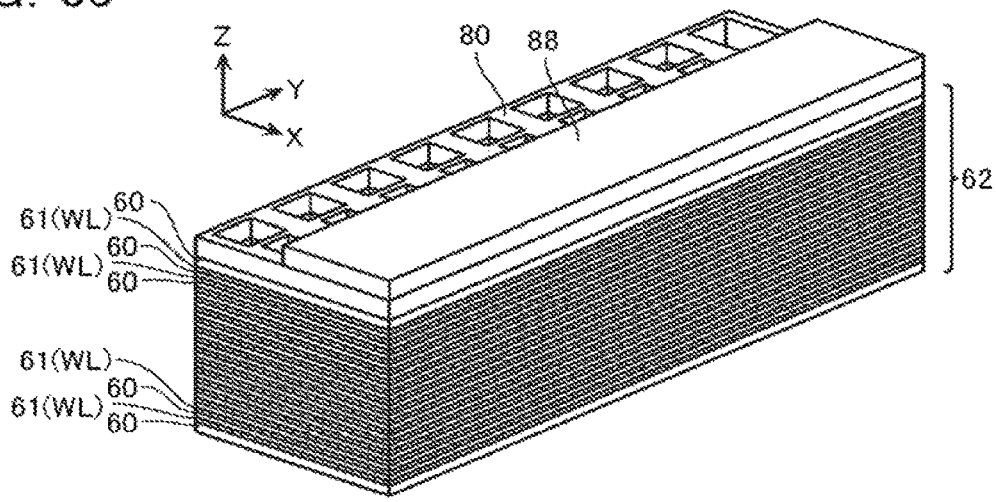
FIG. 33 is a view showing a manufacturing process of the connection unit (view No. 9).
Figure 34:
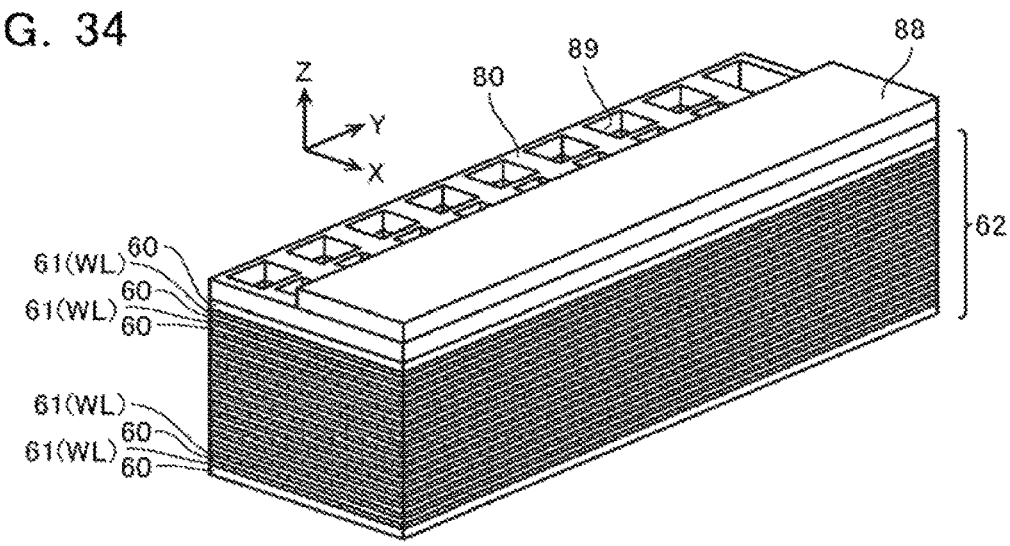
FIG. 34 is a view showing a manufacturing process of the connection unit (view No. 10).
Figure 35:
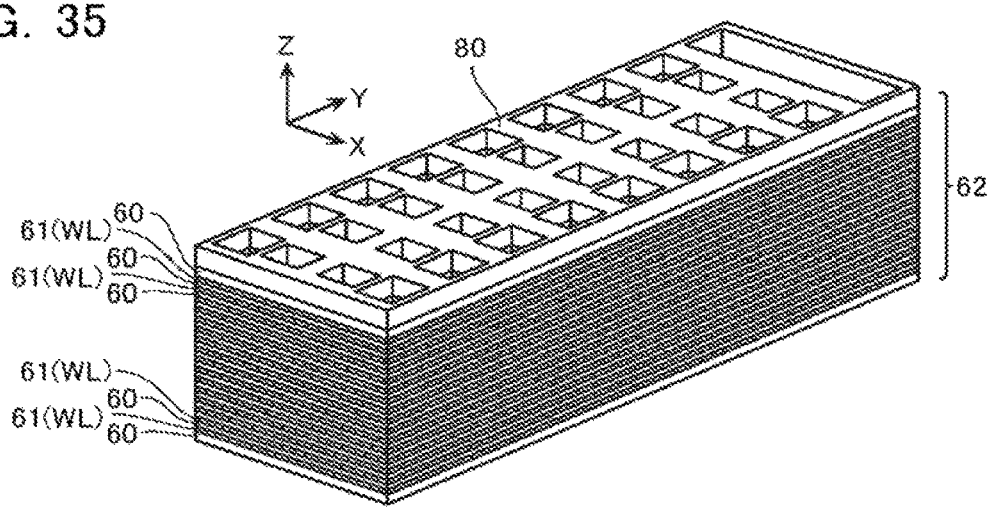
FIG. 35 is a view showing a manufacturing process of the connection unit (view No. 11).

Next, as shown in FIG. 33, an etching-dedicated third mask 88 is formed using photolithography technology and RIE technology. The third mask 88 is formed extending in the Y direction so as to cover one side of the connection unit 21. Subsequently, as shown in FIG. 34, RIE is performed on the upper surface of the word line stacked structure 62 on a side thereof not covered by the third mask 88, and one each of the uppermost layer WL layer 61 and the uppermost layer insulating layer 60 are removed. Subsequently, as shown in FIG. 35, the third mask 88 is removed. Due to the above processes, a height of the word line stacked structure 62 on the side thereof etched in FIG. 34 becomes lower by an amount of a one group portion (a total of a two layer portion) of the WL layer 61 and the insulating layer 60, compared to the word line stacked structure 62 on the side thereof which was covered by the third mask 88.

Figure 36:
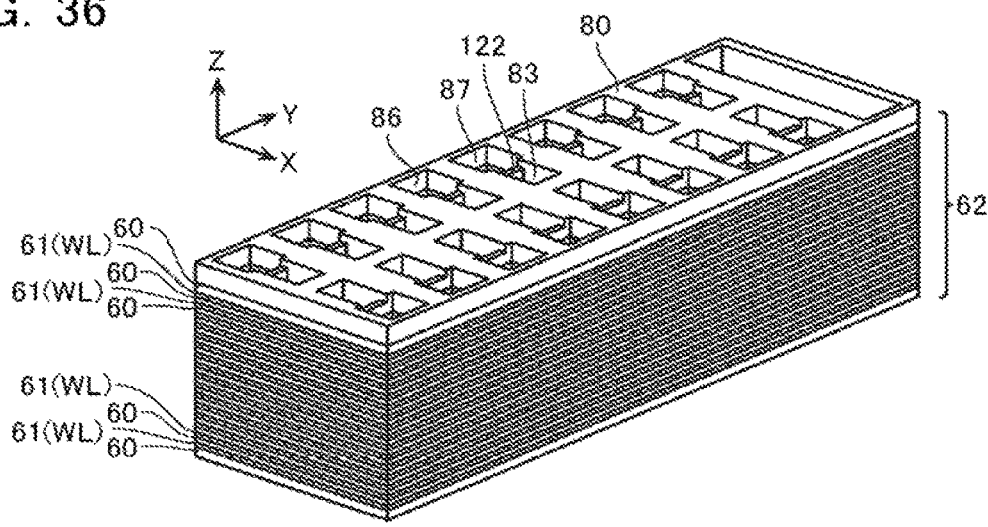
FIG. 36 is a view showing a manufacturing process of the connection unit (view No. 12).
Figure 50:
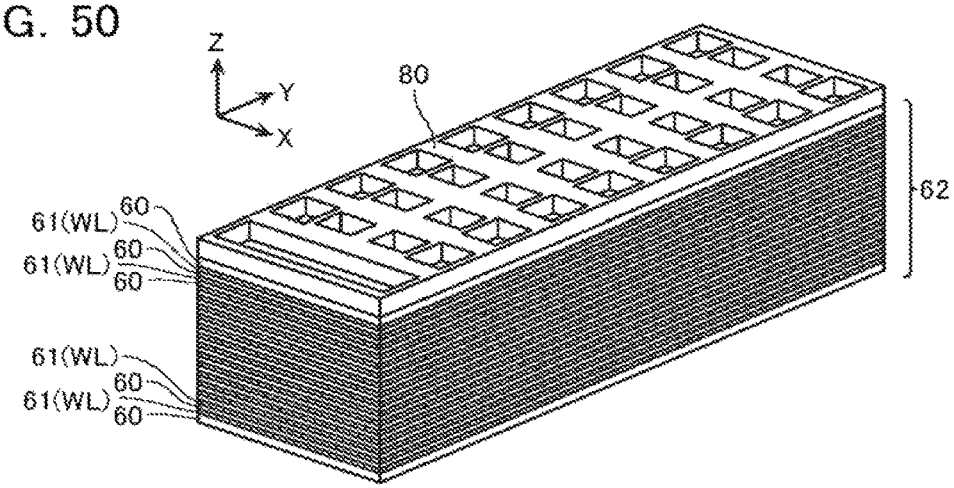
FIG. 50 is a view showing a manufacturing process of a stepped structure in the connection unit (view No. 1).

Now, processes from FIG. 35 to FIG. 36 will be described using FIGS. 50 to 67. FIG. 50 is a perspective view of an identical stage to that of FIG. 35, and in order to render processes more easily seen, it is configured as a drawing looking from a viewpoint on a 180° opposite side to that of FIG. 35.

Figure 51:
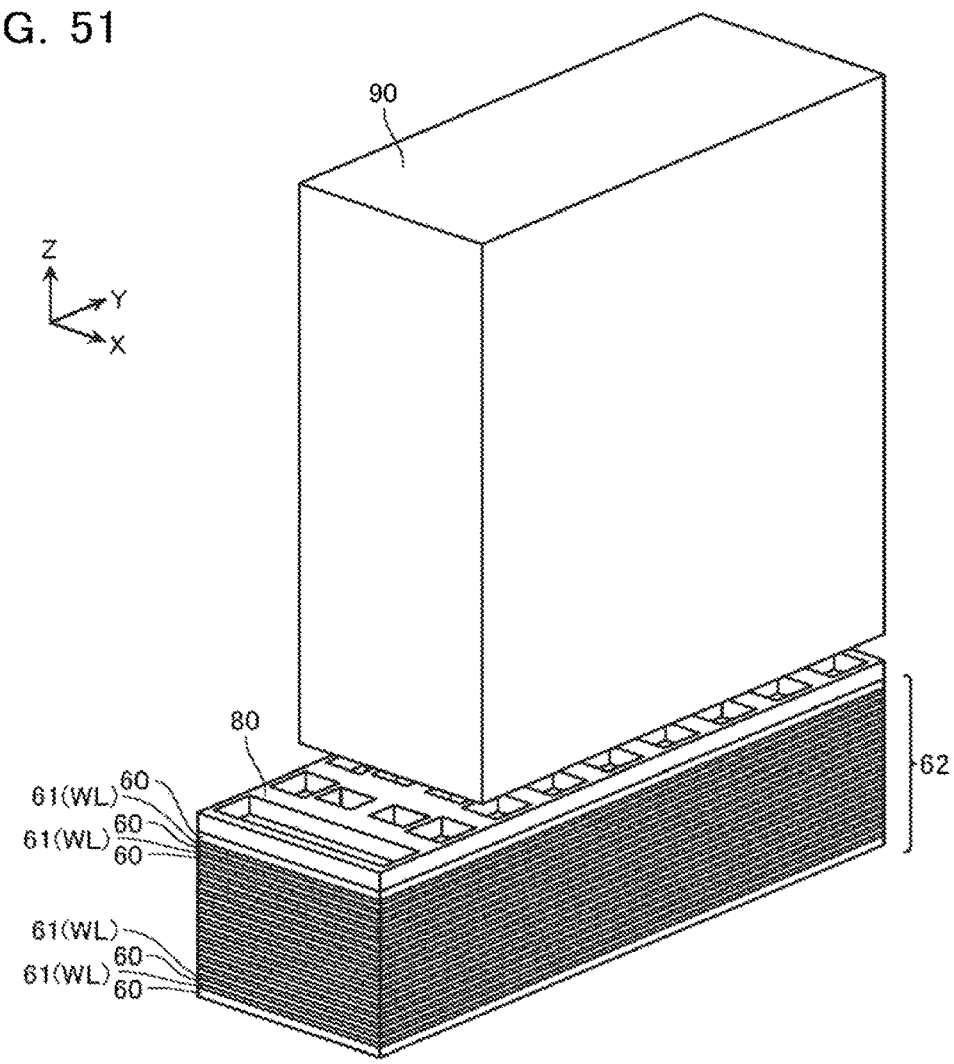
FIG. 51 is a view showing a manufacturing process of the stepped structure in the connection unit (view No. 2).
Figure 52:
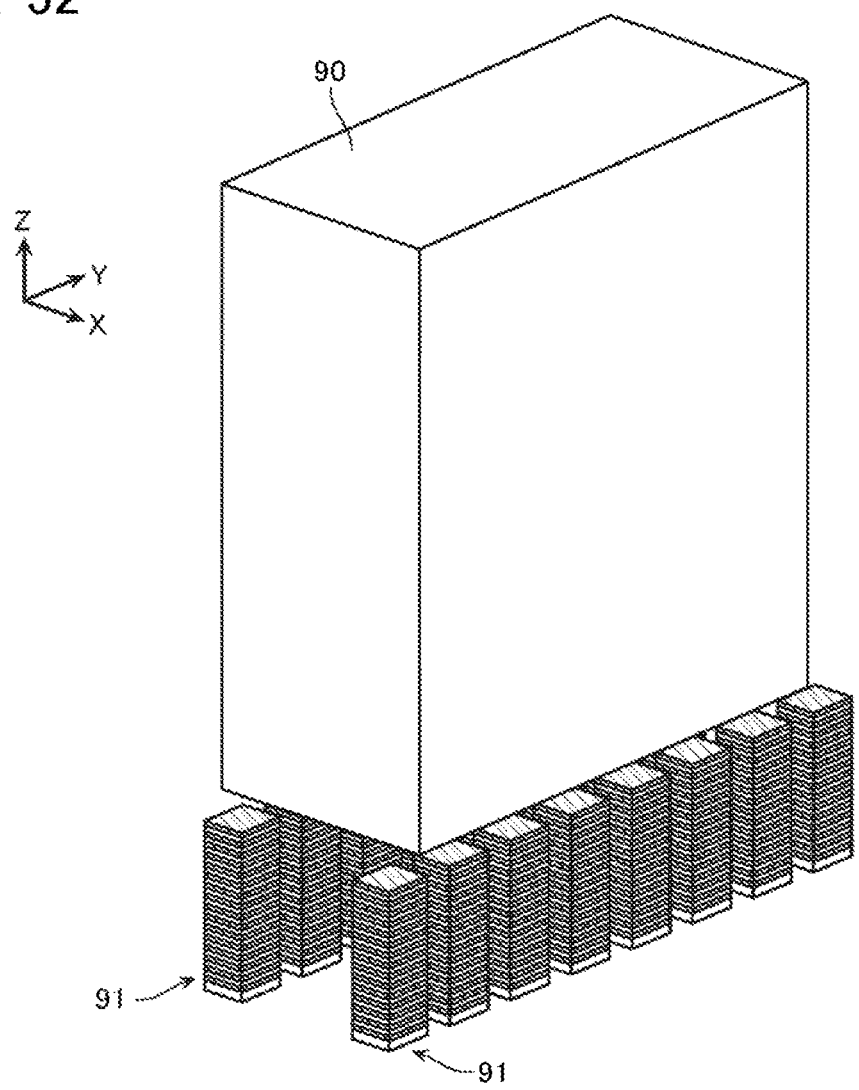
FIG. 52 is a view showing & manufacturing process of the stepped structure in the connection unit (view No. 3).

Next, as shown in FIG. 51, an etching-dedicated fourth mask 90 is formed by photolithography technology. Employable in the fourth mask 90 is, for example, a resist. FIG. 52 is a perspective view of an identical stage to that of FIG. 51, and in order to render processes more easily seen, visibly displays only a portion (referred to below as "WL stepped portion 91") later to be the stepped structure of the word line stacked structure 62, and the fourth mask 90 (the same applies below to FIGS. 53 to 67). At the stage of FIG. 52, only the two WL stepped portions 91 positioned most to a front side are in a state of not being covered by the fourth mask 90.

Figure 53:
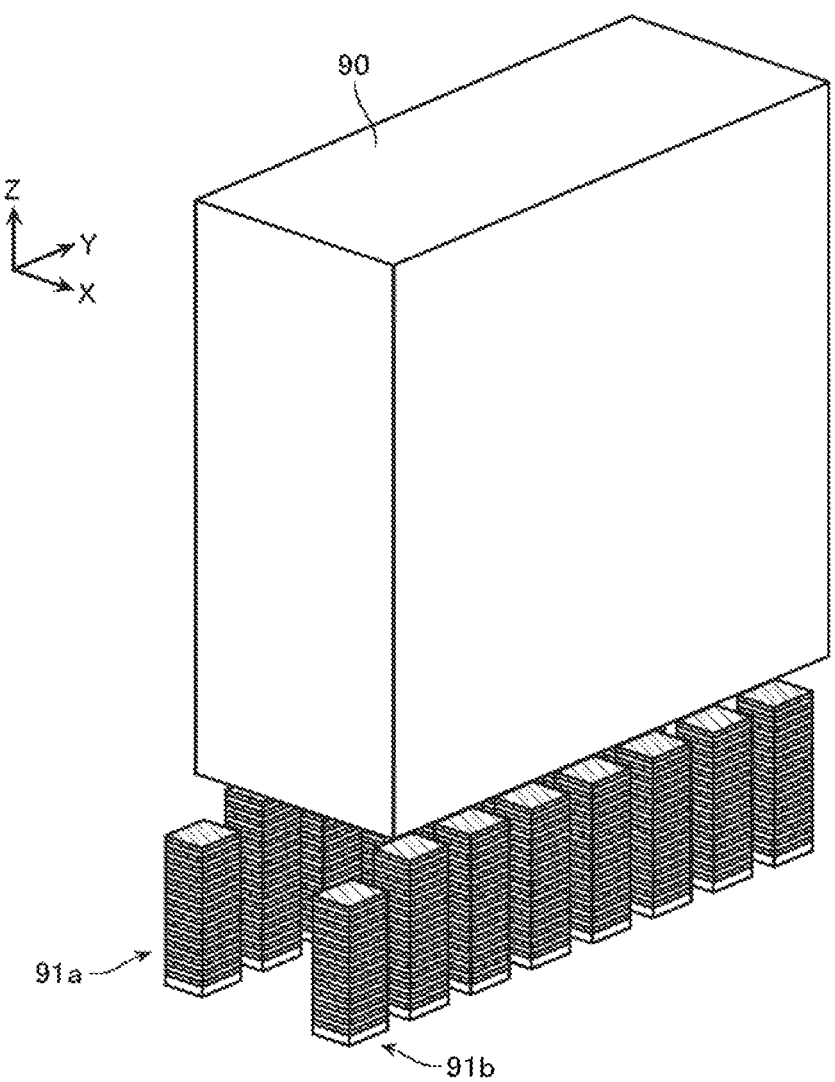
FIG. 53 is a view showing a manufacturing process of the stepped structure in the connection unit (view No. 4).

Next, as shown in FIG. 53, a first RIE process is performed, and two layers each of each of the WL layers 61 and the insulating layers 60 (a total of four layers) in WL stepped portions 91a and 91b not covered by the fourth mask 90, are removed by RIE. As a result, heights of the WL stepped portions 91a and 91b each become lower by an amount of a four layer portion compared to before etching. Moreover, since the WL stepped portion 91 on one side only was etched beforehand by a two layer portion in FIG. 34, the height of the WL stepped portion 91b is lower by an amount of a further two layer portion compared to the WL stepped portion 91a.

Next, a first shrink process is performed, and an upper portion and front portion (WL stepped portions 91a and 91b side) of the fourth mask 90 is etched back by an amount of a one terrace pitch portion (for example, approximately 152 nm). As a result, WL stepped portions 91c and 91d are newly exposed on an outer side of the fourth mask 90 and become a target of etching in a following RIE process.

Figure 54:
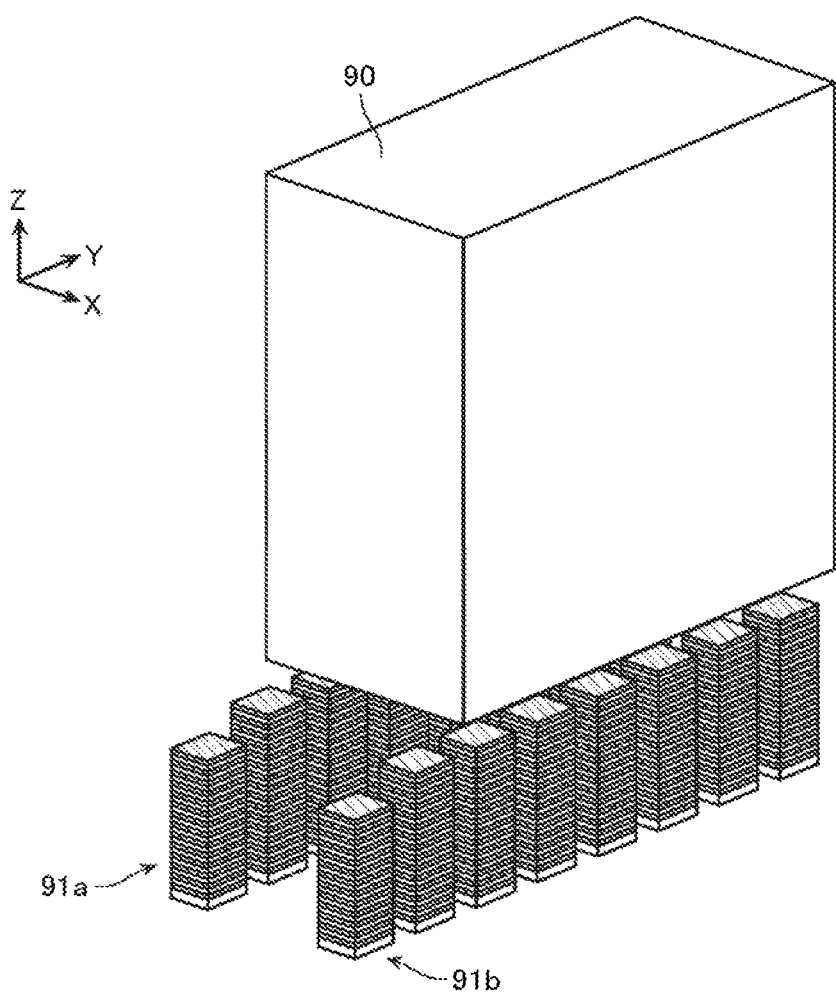
FIG. 54 is a view showing a manufacturing process of the stepped structure in the connection unit (view No. 5).
Figure 55:
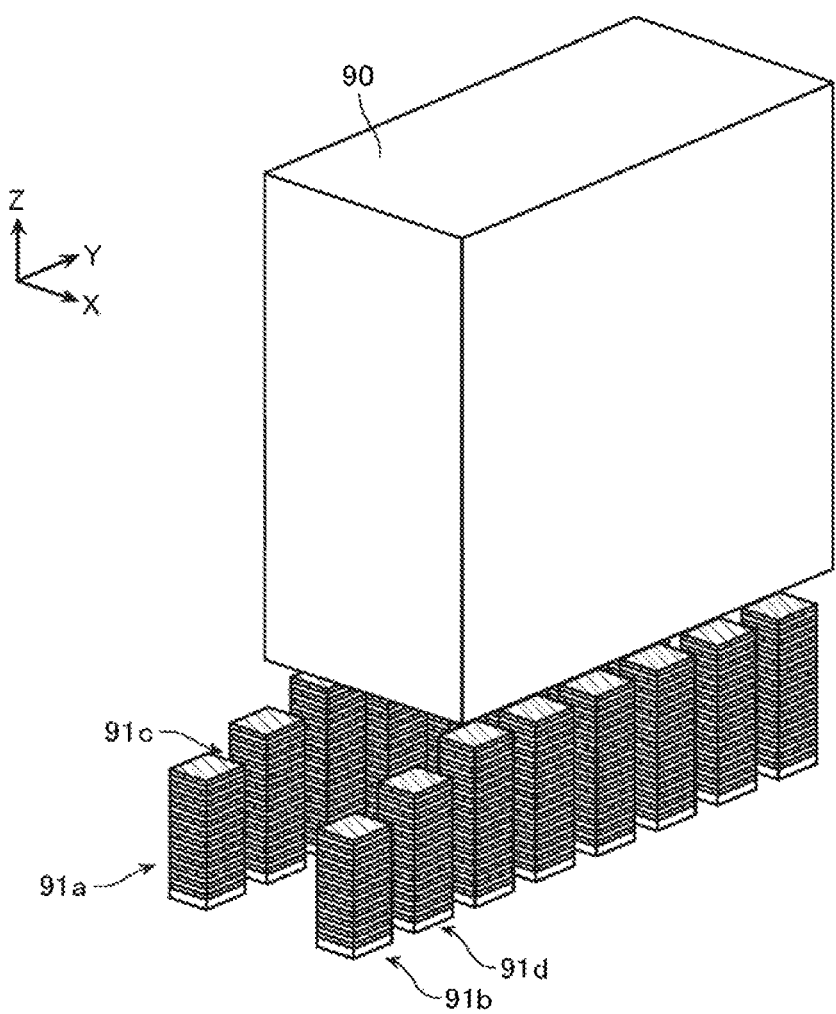
FIG. 55 is a view showing a manufacturing process of the stepped structure in the connection unit (view No. 6).
Figure 56:
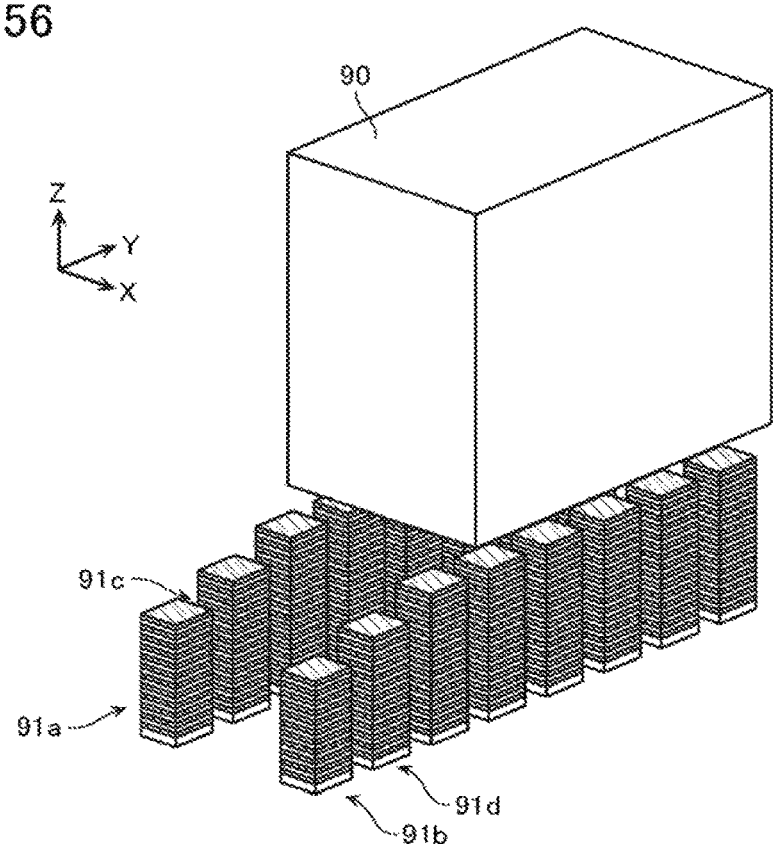
FIG. 56 is a view showing a manufacturing process of the stepped structure in the connection unit (view No. 7).

Hereafter, the RIE process and the shrink process are repeatedly performed, similarly to as described by FIGS. 53 to 54. In a second RIE process shown in FIG. 55, four layers each of the WL stepped portions 91a to 91d not covered by the fourth mask 90 are removed by RIE. In a second shrink process shown in FIG. 56, WL stepped portions 91e and 91f are newly exposed on an outer side of the fourth mask 90.

Figure 57:
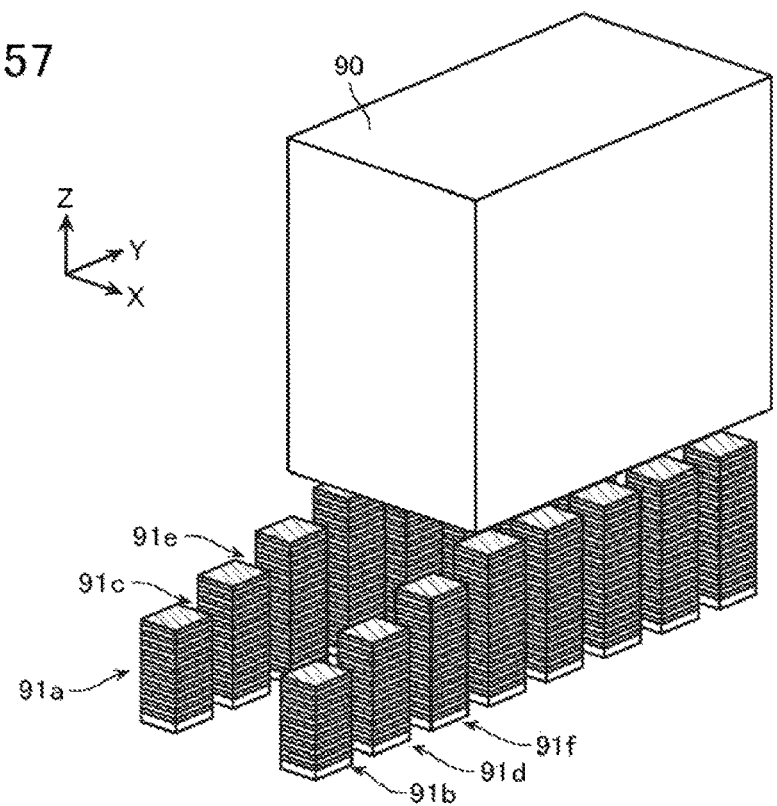
FIG. 57 is a view showing a manufacturing process of the stepped structure in the connection unit (view No. 8).
Figure 58:
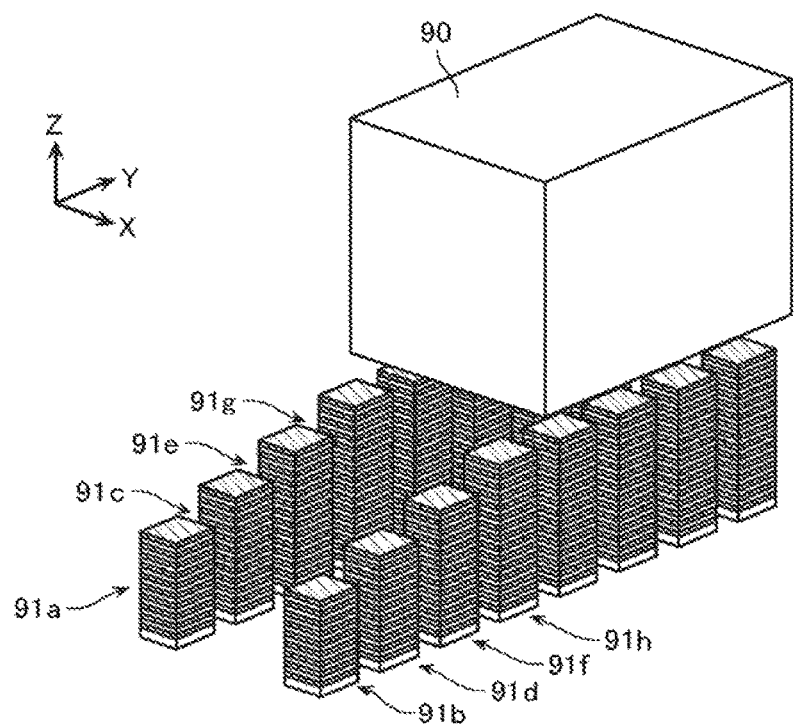
FIG. 58 is a view showing a manufacturing process of the stepped structure in the connection unit (view No. 9).
Figure 59:
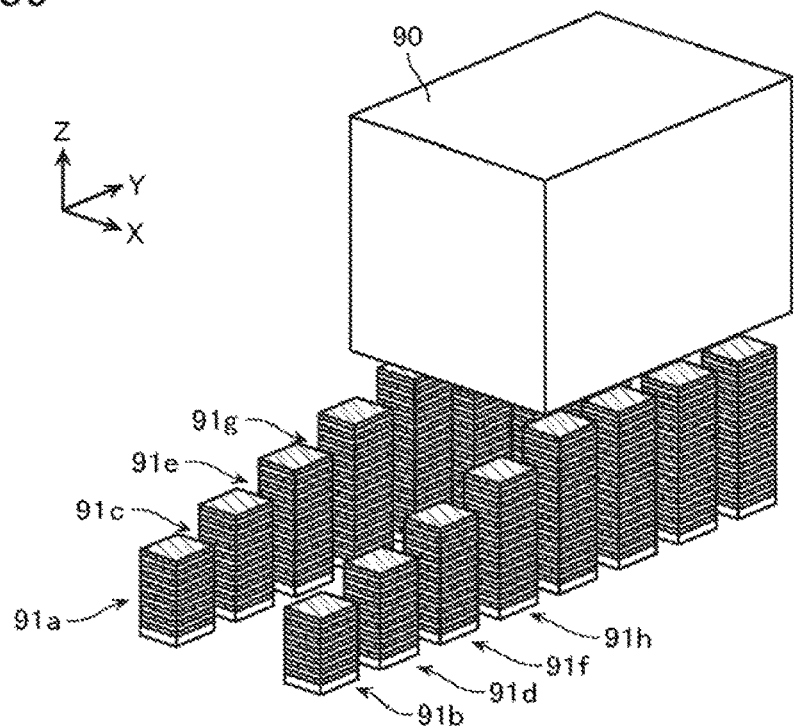
FIG. 59 is a view showing a manufacturing process of the stepped structure in the connection unit (view No. 10).
Figure 60:
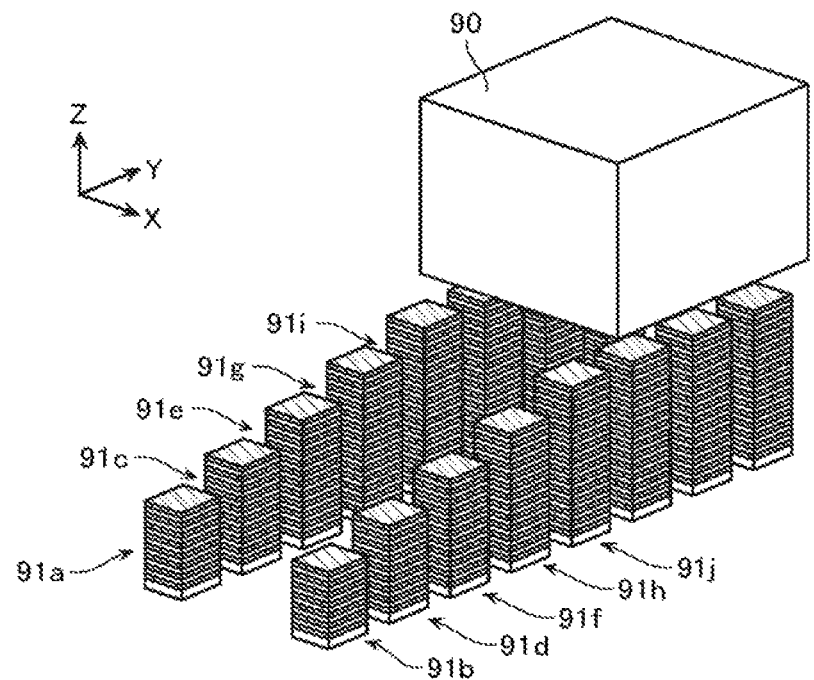
FIG. 60 is a view showing a manufacturing process of the stepped structure in the connection unit (view No. 11).

In a third RIE process shown in FIG. 57, four layers each of the WL stepped portions 91a to 91f not covered by the fourth mask 90 are removed by RIE. In a third shrink process shown in FIG. 58, WL stepped portions 91g and 91h are newly exposed on an outer side of the fourth mask 90. In a fourth RIE process shown in FIG. 59, four layers each of the WL stepped portions 91a to 91h not covered by the fourth mask 90 are removed by RIE. In a fourth shrink process shown in FIG. 60, WL stepped portions 91i and 91j are newly exposed on an outer side of the fourth mask 90.

Figure 61:
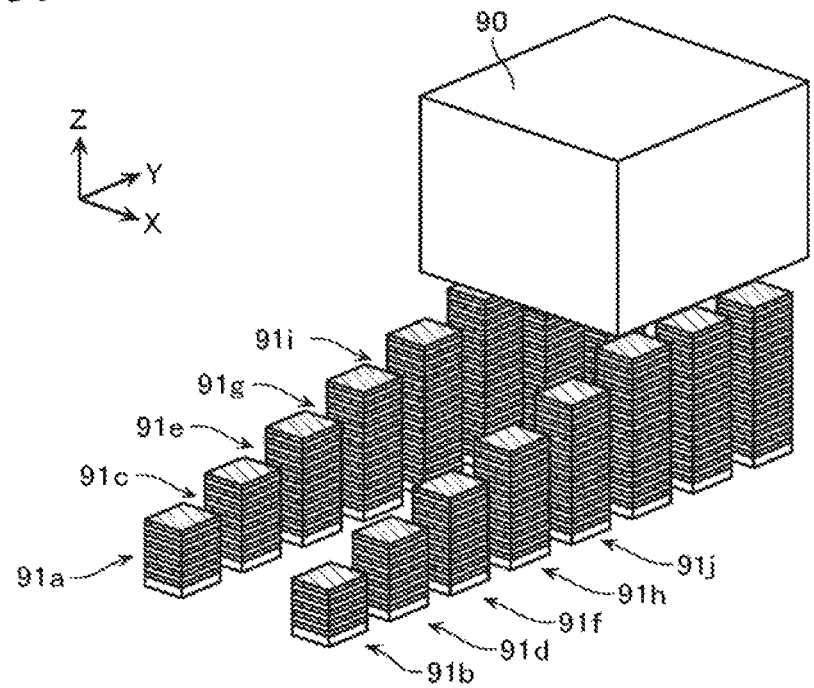
FIG. 61 is a view showing a manufacturing process of the stepped structure in the connection unit (view No. 12).
Figure 62:
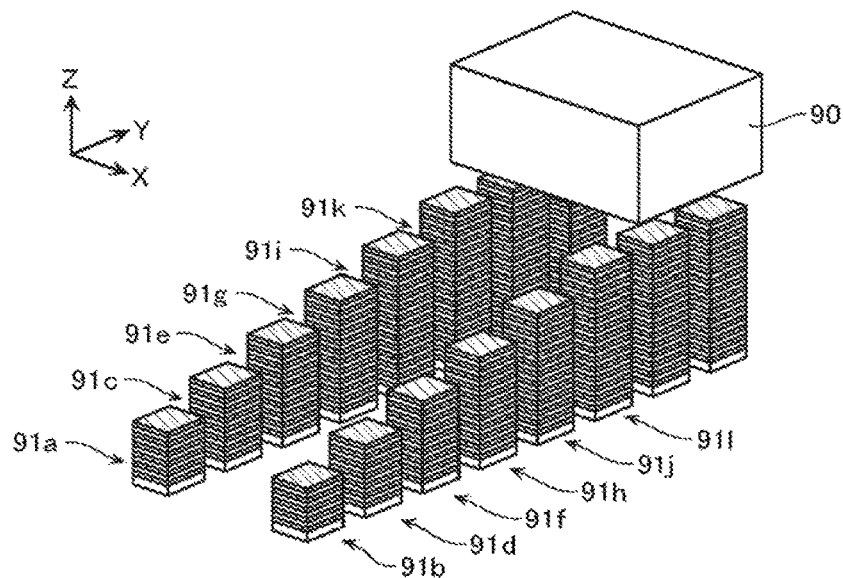
FIG. 62 is a view showing a manufacturing process of the stepped structure in the connection unit (view No. 13).
Figure 63:
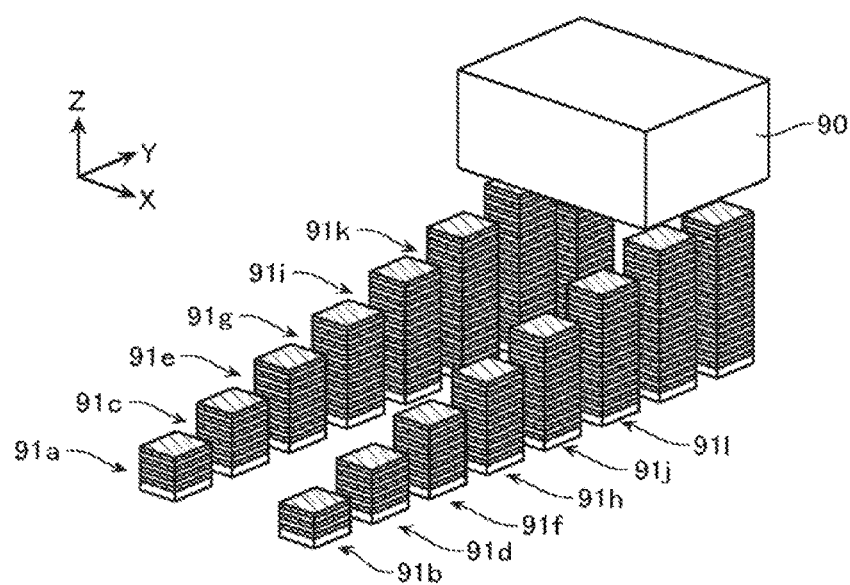
FIG. 63 is a view showing a manufacturing process of the stepped structure in the connection unit (view No. 14).
Figure 64:
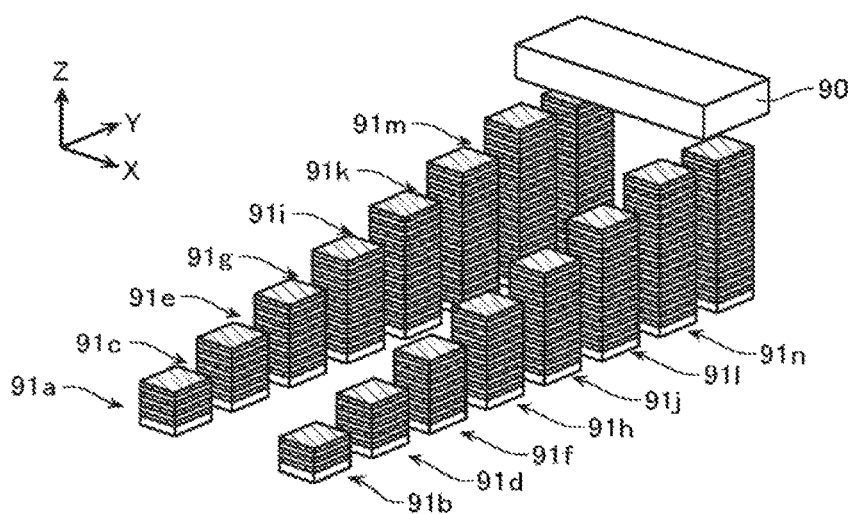
FIG. 64 is a view showing a manufacturing process of the stepped structure in the connection unit (view No. 15).

In a fifth RIE process shown in FIG. 61, four layers each of the WL stepped portions 91a to 91j not covered by the fourth mask 90 are removed by RIE. In a fifth shrink process shown in FIG. 62, WL stepped portions 91k and 91l are newly exposed on an outer side of the fourth mask 90. In a sixth RIE process shown in FIG. 63, four layers each of the WL stepped portions 91a to 91l not covered by the fourth mask 90 are removed by RIE. In a sixth shrink process shown in FIG. 64, WL stepped portions 91m and 91n are newly exposed on an outer side of the fourth mask 90.

Figure 65:
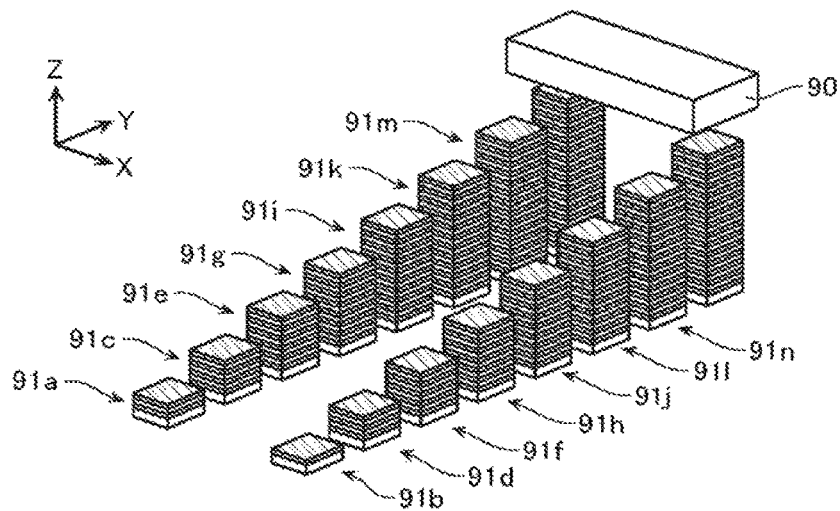
FIG. 65 is a view showing a manufacturing process of the stepped structure in the connection unit (view No. 16).

In a seventh RIE process shown in FIG. 65, four layers each of the WL stepped portions 91a to 91n not covered by the fourth mask 90 are removed by RIE. Subsequently, as shown in FIG. 66, residual fourth mask 90 is removed, and remaining WL stepped portions 91o and 91p are exposed.

Figure 66:
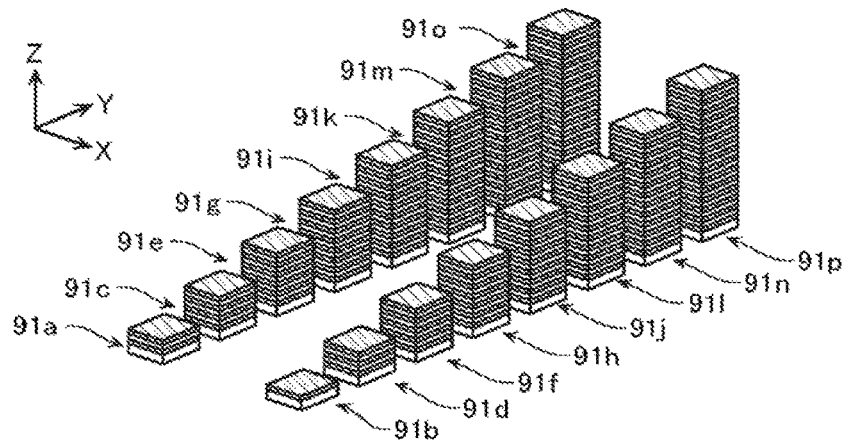
FIG. 66 is a view showing a manufacturing process of the stepped structure in the connection unit (view No. 17).

In FIG. 66, the WL stepped portion 91 is configured from two columns of stepped portions extending in the Y direction. Fellow stepped portions adjacent in the X direction have heights that differ by two layer portions at a time, and fellow stepped portions (within the same column) adjacent in the Y direction have heights that differ by four layer portions at a time. As a result, the 16 WL stepped portions 91a to 91p all have heights that differ, and have a configuration in which different WL layers 61 are exposed on their upper surfaces.

Figure 67:
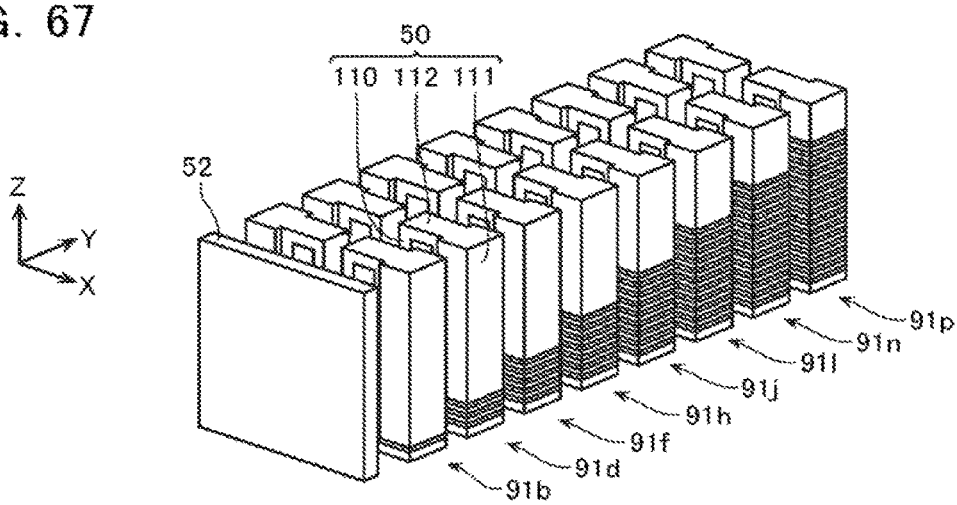
FIG. 67 is a view showing a manufacturing process of the stepped structure in the connection unit (view No. 18).

Next, as shown in FIG. 67, a pattern of the penetrating electrode is formed in the opening of the lower wiring line layer 30, whereby the first penetrating electrode 50 and the second penetrating electrode 52 are formed. The first penetrating electrode 50 includes the first columnar portion 111 connected to the WL layer 61 and the second columnar portion 110 connected to the peripheral circuit layer 12, and the first columnar portion 111 and second columnar portion 110 are connected to each other by the bridging portion 112 at the upper surface of the lower wiring line layer 30. The second penetrating electrode 52 is, for example, a plate-like electrode having a certain width in the X direction, and electrically connects wiring line layers positioned upwardly of the lower wiring line layer 30 and the peripheral circuit layer 12 positioned downwardly of the lower wiring line layer 30.

Description of the manufacturing processes of the connection unit will be continued returning again to FIG. 36. FIG. 36 is a perspective view of an identical stage to that of FIG. 66, and a second through-hole 87 from an upper surface of the WL stacked structure 62 to an upper surface of the WL stepped portion 91 is formed. In a midway process to finishing formation processes of the WL stepped portion 91, a thinly protruding region of the first sidewall protecting film 86 (an intermediate region 122 separating the two openings for the first penetrating electrodes 50 adjacent in the X direction) is partially removed by etching.

Figure 37:
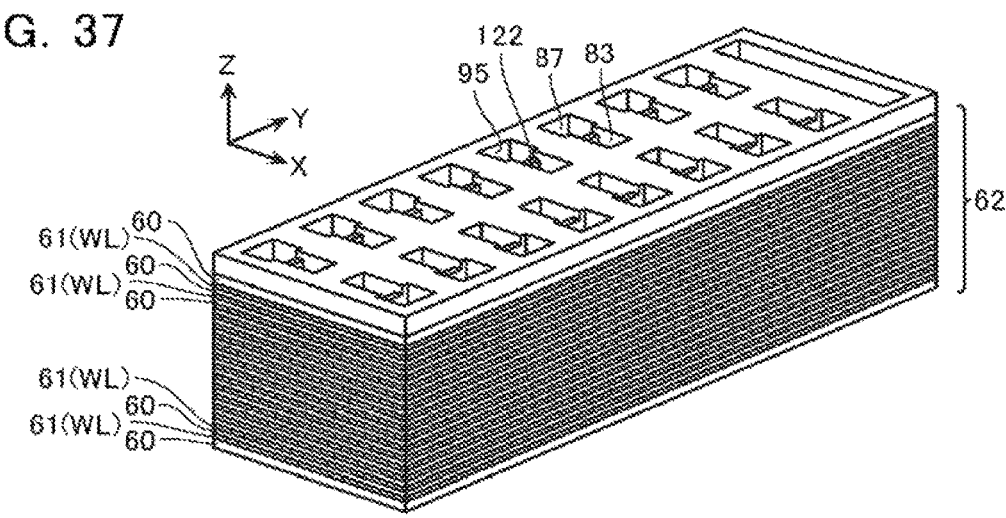
FIG. 37 is a view showing a manufacturing process of the connection unit (view No. 13).

Next, as shown in FIG. 37, a second sidewall protecting film 95 is formed uniformly on an entire surface. Employable in the second sidewall protecting film 95 is, for example, SiN having a film thickness of 10 nm. After formation of the second sidewall protecting film 95, etching is performed, and the second sidewall protecting film 95 present on a bottom surface and an upper surface of the opening is removed.

Figure 38:
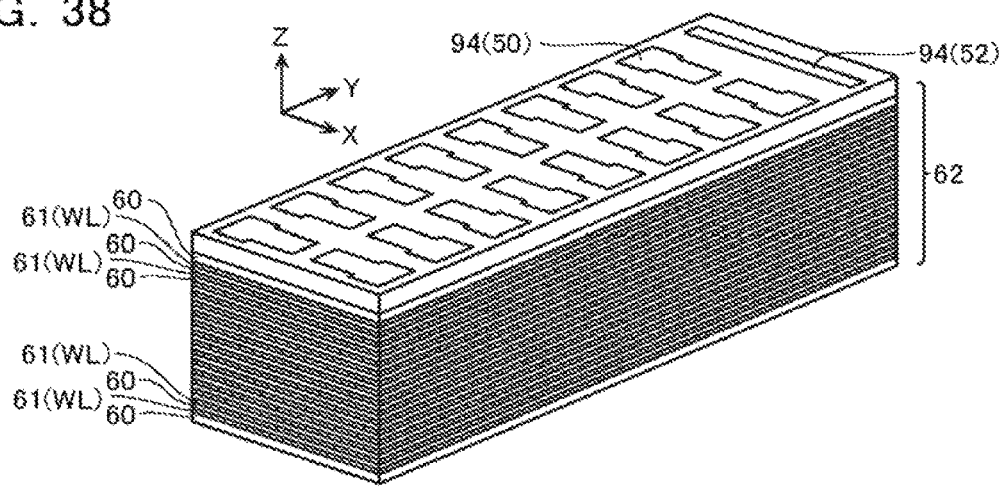
FIG. 38 is a view showing a manufacturing process of the connection unit (view No. 14).

Next, as shown in FIG. 38, a via material 94 is filled in the opening, and an upper portion is planarized by CMP. Due to the present process, the first penetrating electrode 50 and the second penetrating electrode 52 shown in FIG. 67 are formed. Employable in the via material 94 is, for example, tungsten (W). In said process, the via material 94 is supplied to the first through-hole 83, the second through-hole 87, and the intermediate region 122 between the first through-hole 83 and the second through-hole 87. This makes it possible for the bridging portion 112 formed in the intermediate region 122, as well as the second columnar portion 110 formed in the first through-hole 83 and the first columnar portion 111 formed in the second through-hole 87, to be simultaneously formed during formation of the first penetrating electrode 50 (refer to FIG. 67). As a result, the manufacturing process can be made more efficient.

Now, as a result of forming the first sidewall protecting film 86 on the side surface of the shrunk second mask 82 as described in FIGS. 29 to 30, in a subsequent process, the intermediate region 122 is configured to cover a WL stacked structure film of a shrink width by the first sidewall protecting film 86 and the second sidewall protecting film 95. Sometimes, performing an ordinary sidewall protecting film process without shrinking the second mask 82 results in a structure where the first columnar portion 111 and the second columnar portion 110 in the first penetrating electrode 50 are partitioned only by a thickness of the sidewall protecting film, and a process margin cannot be sufficiently obtained in a processing process typified by an etching process. However, adding the WL stacked structure film of the shrink width makes it possible for a process margin to be sufficiently secured, and enables insulation properties of said region to be raised and reliability of the semiconductor memory device to be improved.

Figure 39:
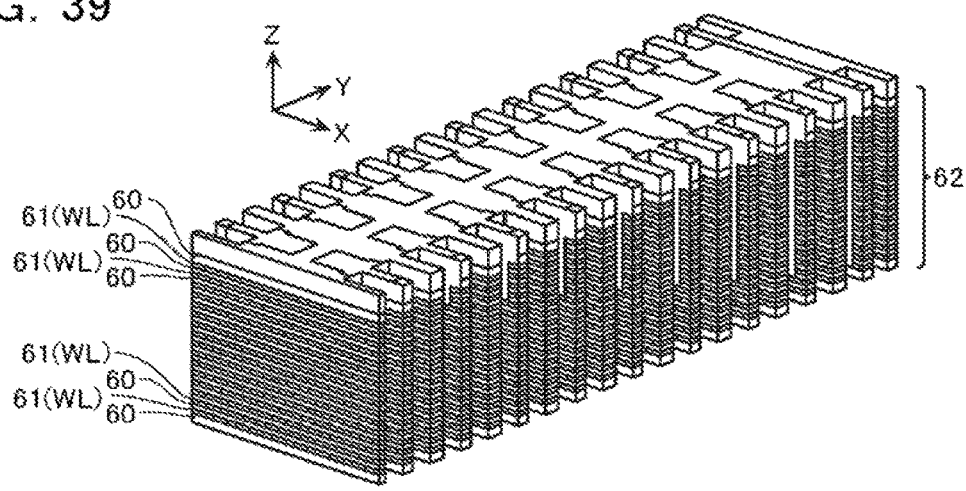
FIG. 39 is a view showing a manufacturing process of the connection unit (view No. 15).
Figure 40:
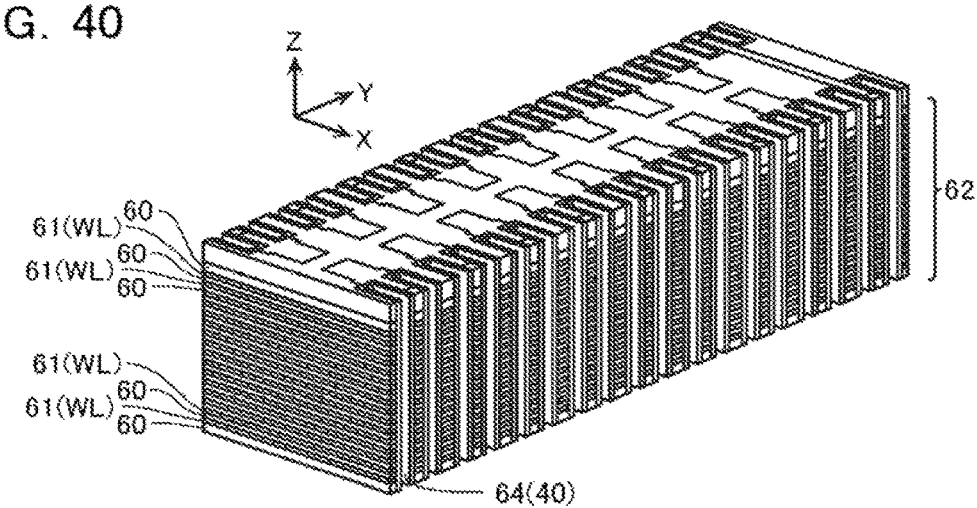
FIG. 40 is a view showing a manufacturing process of the connection unit (view No. 16).

Next, as shown in FIG. 39, the word line stacked structure 62 is batch processed by RIE technology. The present process corresponds to the process of FIG. 12 in the cell array unit 20. Next, as shown in FIG. 40, a layer 64 of a resistance varying material configured from, for example, HfOx having a film thickness of 4 nm is deposited uniformly employing, for example, an ALD method. The present process corresponds to the process of FIG. 13 in the cell array unit 20.

Figure 41:
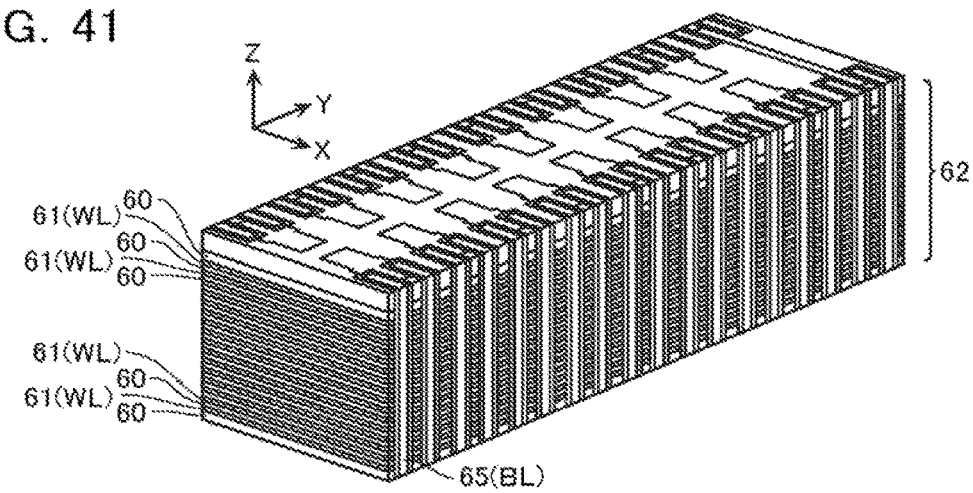
FIG. 41 is a view showing a manufacturing process of the connection unit (view No. 17).
Figure 42:
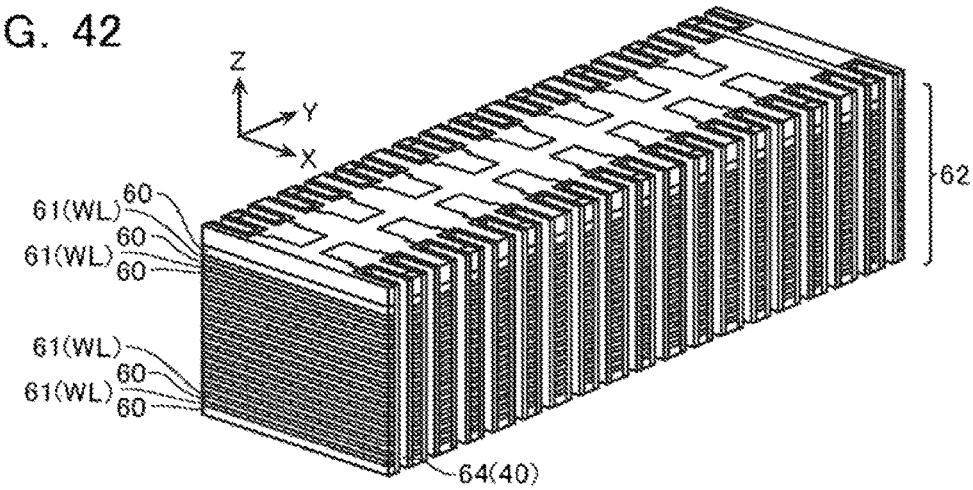
FIG. 42 is a view showing a manufacturing process of the connection unit (view No. 18).

Next, as shown in FIG. 41, a bit line film 65 is formed in an entire trench portion formed in FIG. 39, and by polishing by a CMP method, the bit line film 65 is left only inside the trench. This process corresponds to the process of FIG. 14 in the cell array unit 20. Next, as shown in FIG. 42, photolithography technology and RIE technology are employed to pattern the bit line film 65 into a pillar shape. In the connection unit 21 of the present embodiment, there is no need for the bit line BL to be formed, hence in FIG. 42, the bit line film 65 is completely removed. However, even supposing a part of the bit line material remains, there is no process for achieving electrical connection with said place later, hence there is no particular problem. The process of FIG. 42 corresponds to the process of FIG. 15 in the cell array unit 20. Note that in the cell array unit 20, formation processes of the silicon layers 66 to 68 (refer to FIGS. 16 to 19) are then performed, but in the connection unit 21, said silicon layers get completely removed by etching, hence a description of said processes will be omitted.

Figure 43:
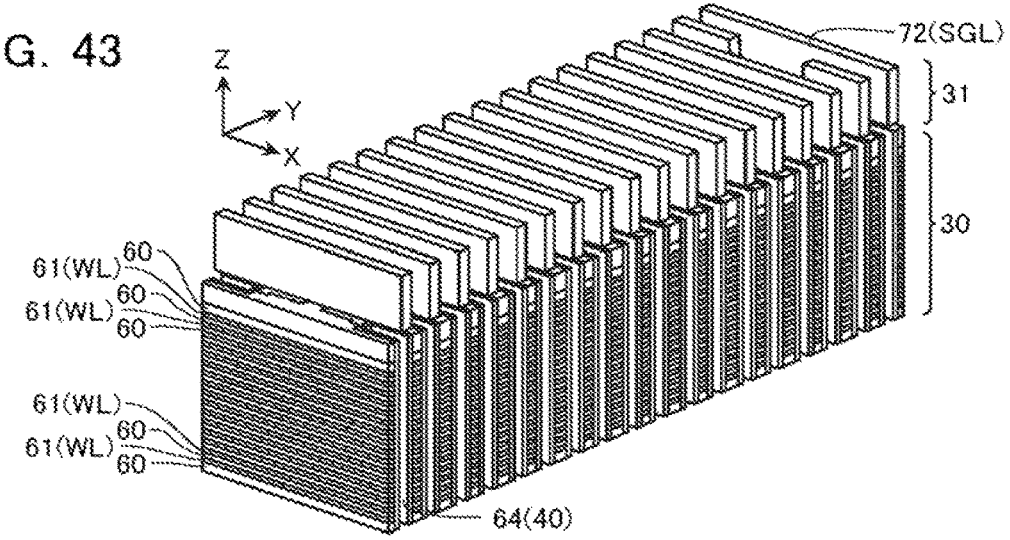
FIG. 43 is a view showing a manufacturing process of the connection unit (view No. 19).

Next, as shown in FIG. 43, a plurality of conductive films 72 extending in parallel in the X direction are formed upwardly of the lower wiring line layer 30. Formation of the conductive film 72 can be performed by filling the conductive film 72 in a trench portion formed in an inter-layer insulating film (not illustrated) in the formation processes of the silicon layers 66 to 68. The conductive film 72 corresponds to the select gate line SGL shown in FIGS. 3 and 4, and is formed from an identical material (for example, an n+ type polycrystalline silicon layer) to that of the conductive film 72 filled in FIG. 21. In FIG. 43, the conductive film 72 is divided in a region upward of the second penetrating electrode 52 of the lower wiring line layer 30. In a later process, a penetrating electrode for connecting the upper wiring line layer 32 and the second penetrating electrode 52 is formed in said region.

Figure 44:
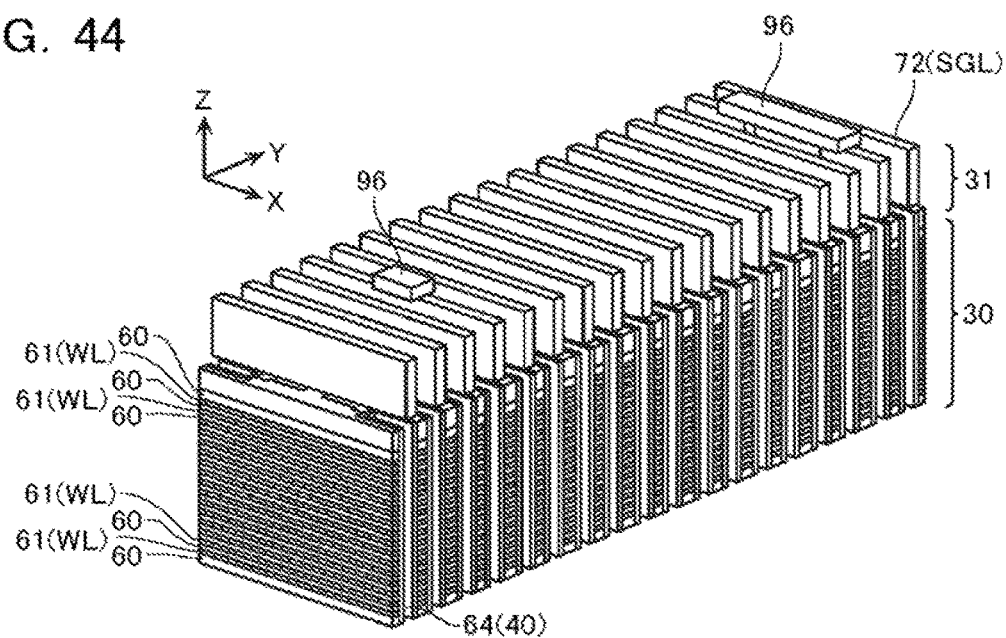
FIG. 44 is a view showing a manufacturing process of the connection unit (view No. 20).

Next, as shown in FIG. 44, an etching-dedicated fifth mask 96 is formed in a region of the select gate line SGL where connection is to be made to the upper wiring line layer 32. In the present embodiment, the fifth mask 96 is respectively formed on the fourth from front side select gate line SGL and the second from rear side select gate line SGL. The fifth mask 96 acts in a self-aligning manner with a pattern of the select gate line SGL, hence can be made broader than a width of the select gate line SGL (need only be in a range that does not overlap the adjacent select gate line SGL). This makes it possible to relax constraint conditions during lithography.

Figure 45:
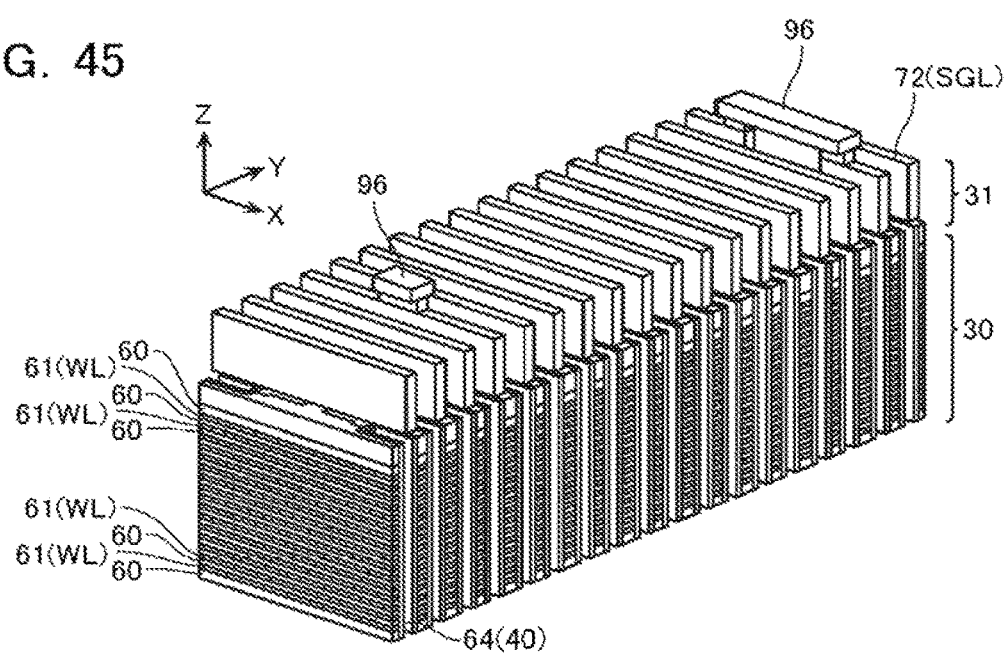
FIG. 45 is a view showing a manufacturing process of the connection unit (view No. 21).
Figure 46:
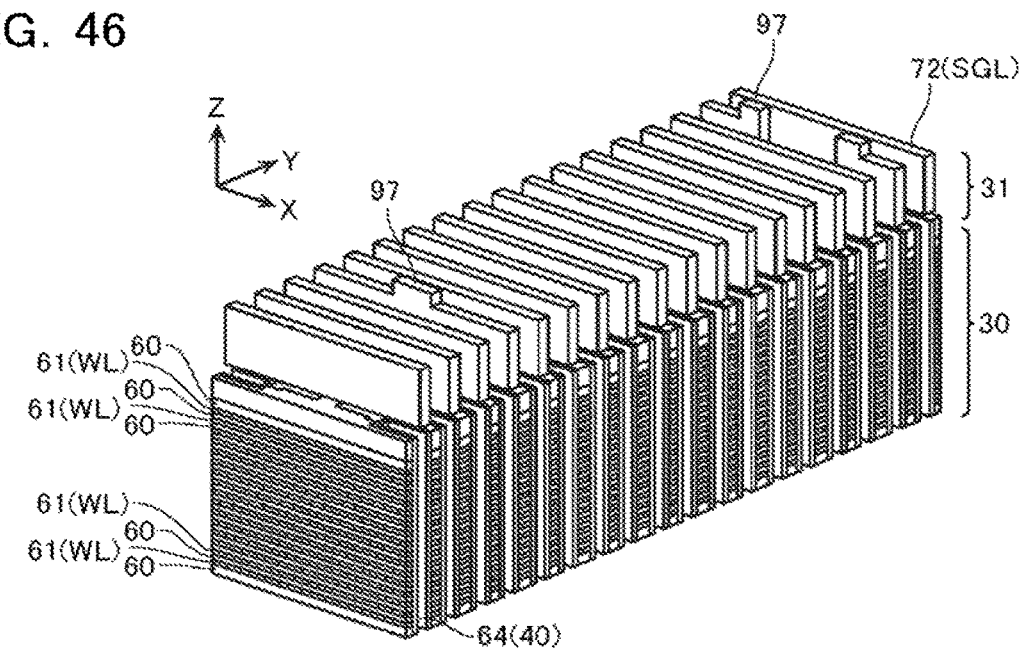
FIG. 46 is a view showing a manufacturing process of the connection unit (view No. 22).

Next, as shown in FIG. 45, the other select gate lines SGL are etched back, leaving a connection region of the select gate line SGL and the upper wiring line layer 32 covered by the fifth mask 96. Next, as shown in FIG. 46, the fifth mask 96 is removed, and then formation of an inter-layer insulating film and planarization by a CMP method are performed (indication of the inter-layer insulating film is omitted in FIG. 46). The present process corresponds to the processes of FIGS. 21 and 22 in the cell array unit 20. Due to the present process, a region on the select gate line SGL that was covered by the fifth mask 96 attains an upwardly protruding shape. Said protruding shaped region becomes a third penetrating electrode 97 that connects the select gate line SGL (middle wiring line layer 31) and the upper wiring line layer 32. Due to the above-mentioned processes, the third penetrating electrode 97 is formed by an identical material to the select gate line SGL and integrally with the select gate line SGL.

Figure 47:
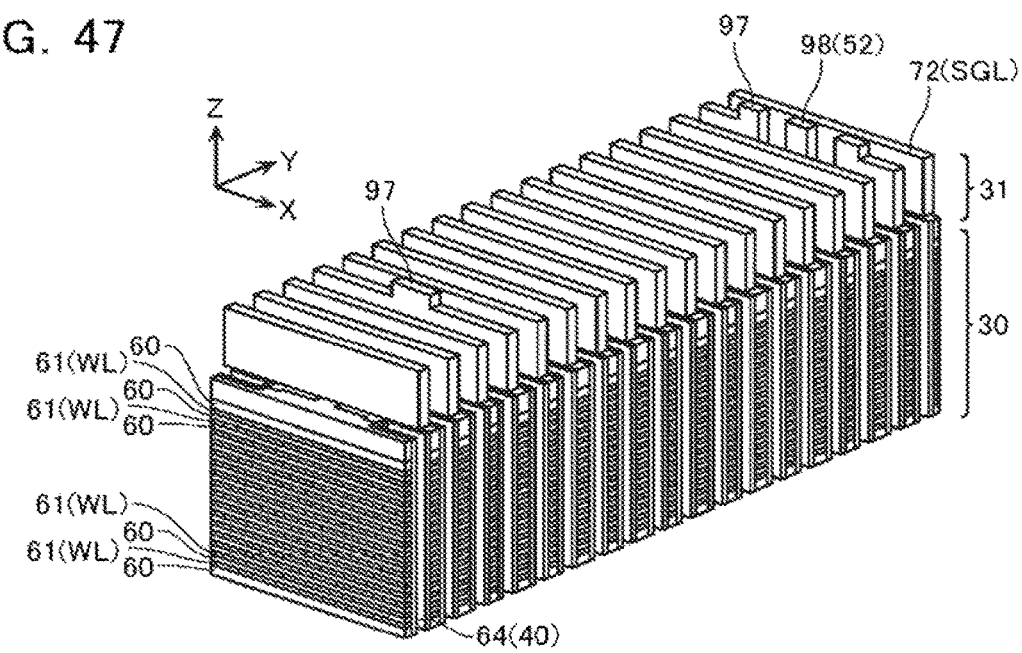
FIG. 47 is a view showing a manufacturing process of the connection unit (view No. 23).

Next, as shown in FIG. 47, photolithography technology and RIE technology are employed to provide an opening in a region positioned on the second penetrating electrode 52 of the lower wiring line layer 30, of the inter-layer insulating layer, and a via material (for example, tungsten (W) is filled in said opening. Said via material becomes a fourth penetrating electrode 98 that connects the upper wiring line layer 32 and the second penetrating electrode 52. The fourth penetrating electrode 98 is normally formed by a different material from that of the select gate line SGL. As a result, although the third penetrating electrode 97 and the fourth penetrating electrode 98 are the same in that both are electrically connected to the upper wiring line layer 32, they are formed by different materials from each other.

Figure 48:
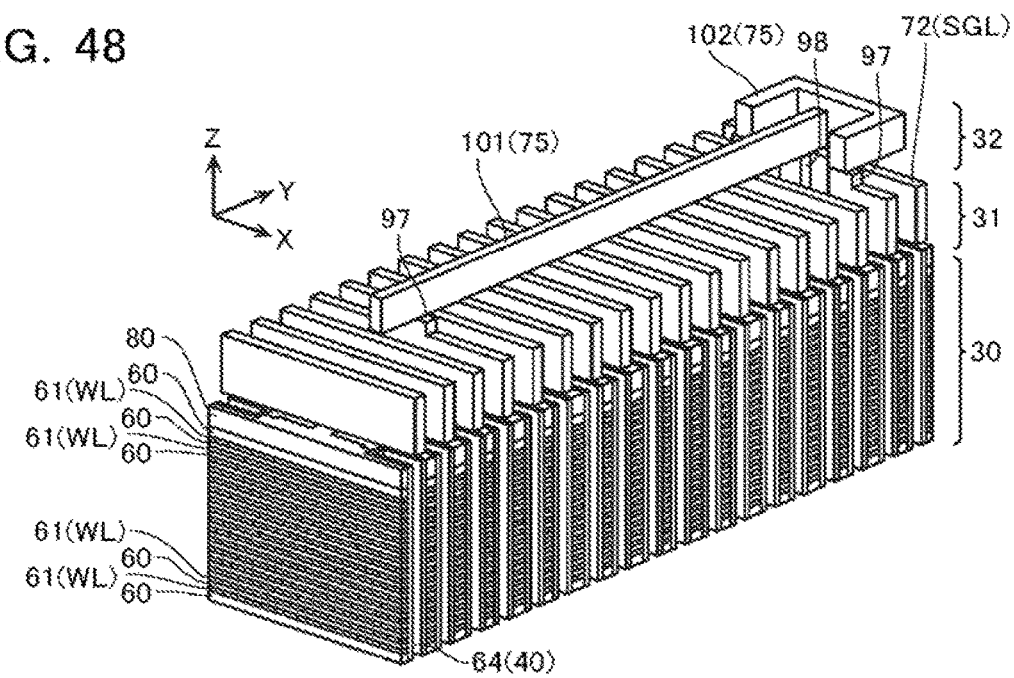
FIG. 48 is a view showing a manufacturing process of the connection unit (view No. 24).

Next, as shown in FIG. 48, ordinary photolithography technology and RIE technology are employed to form a wiring line pattern of the upper wiring line layer 32. The present, process corresponds to the process of FIG. 24 in the cell array unit 20. In the present embodiment, the first wiring line pattern 101 extending in the Y direction and the second wiring line pattern 102 bypassing the first wiring line pattern 101 are formed using the same global bit line film 75 as in the cell array unit 20. The first wiring line pattern 101 has its one end connected to the fourth from front side select gate line SGL via the third penetrating electrode 97, and has its other end connected to the second penetrating electrode 52 of the lower wiring line layer 30 via the fourth penetrating electrode 98. The second wiring line pattern 102 has its both ends each connected to the second from rear side select gate line SGL via the third penetrating electrode 97.

After formation of the upper wiring line layer 32, an inter-layer insulating layer is formed on an entire surface and polishing is performed by, for example, a CMP method, whereby a trench portion occurring by the process of FIG. 48 is filled with the inter-layer insulating layer (the present process is not illustrated). Due to the above processes, the connection unit 21 is completed.

Figure 49:
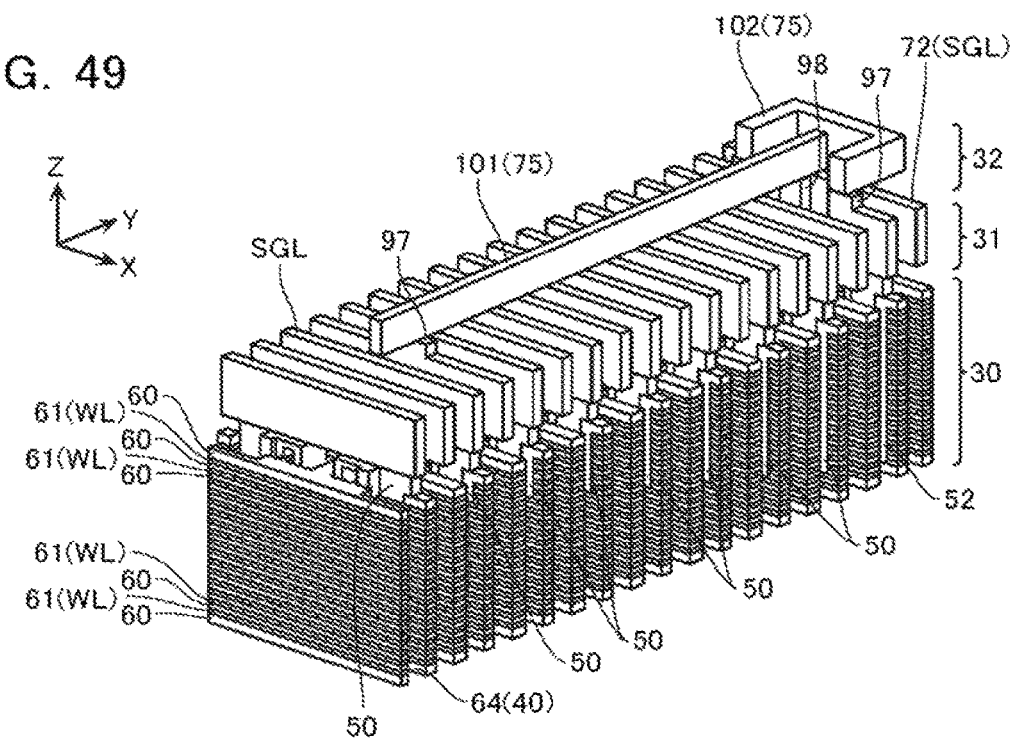
FIG. 49 is a perspective view explaining an internal structure of the connection unit.

FIG. 49 is a view that omits the etching-dedicated mask and the variable resistance layer 40 from a state of FIG. 48 to clarify relationships of electrical connection. The first penetrating electrode 50 penetrates the lower wiring line layer 30 to be connected to the peripheral circuit layer 12, without being connected to either of the upper wiring line layer 32 and the middle wiring line layer 31. The select gate line SGL is connected to the peripheral circuit layer 12 downward of the lower wiring line layer 30, via the third penetrating electrode 97, the first wiring line pattern 101 of the upper wiring line layer 32, the fourth penetrating electrode 98, and the second penetrating electrode 52.

Figure 68:
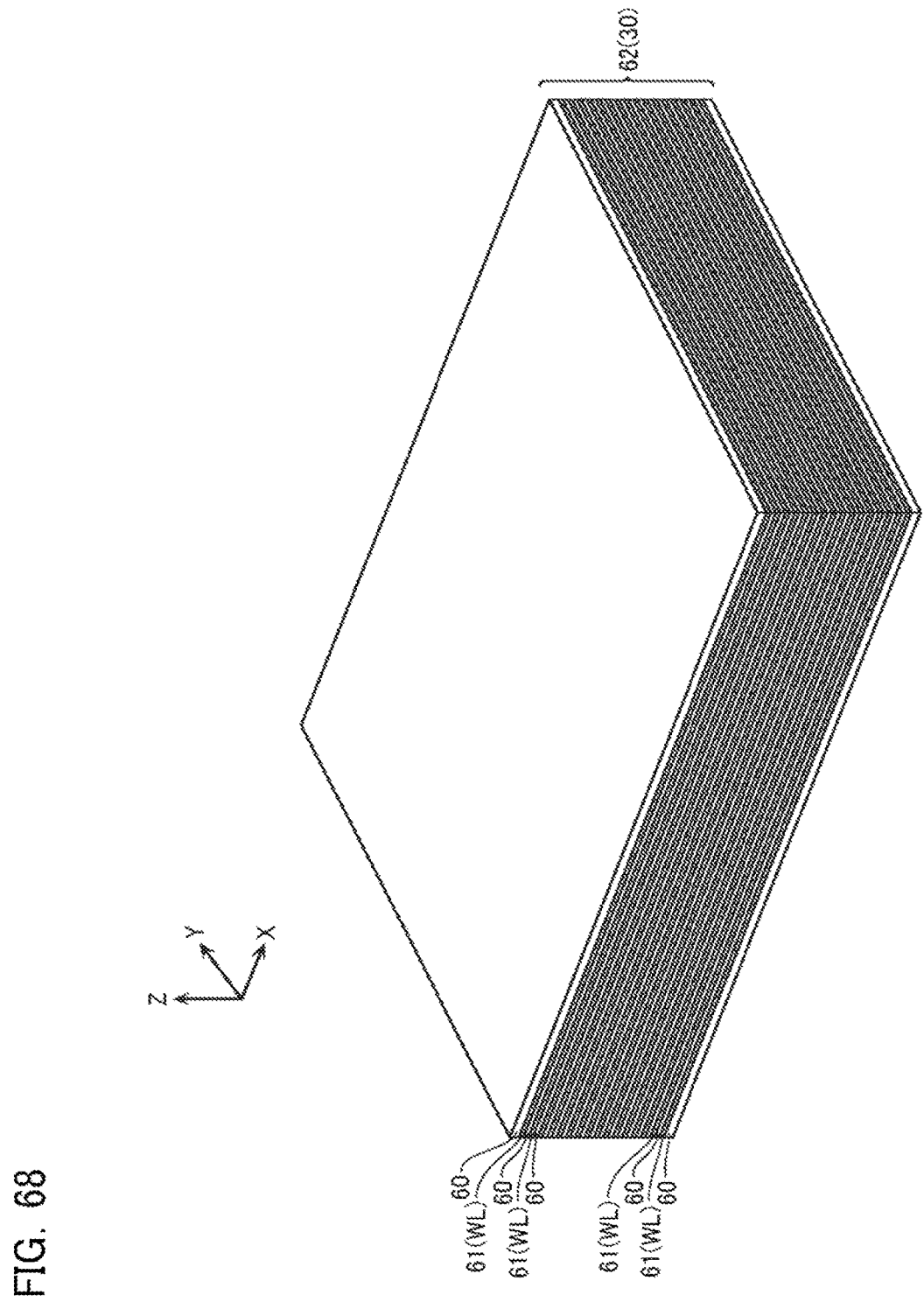
FIG. 68 is a view showing a manufacturing process of the cell array unit and the connection unit (view No. 1).

Next, manufacturing processes of an entirety including the cell array unit 20 and the connection unit 21 will be described with reference to FIGS. 68 to 82. In order to render processes more easily seen, the etching mask and portions duplicating previous descriptions are appropriately omitted from description. First, as shown in FIG. 68, the insulating layers 60 and the WL layers 61 are stacked alternately, and the word line stacked structure 62 is formed. The present process corresponds to the processes of FIGS. 10 and 25.

Figure 69:
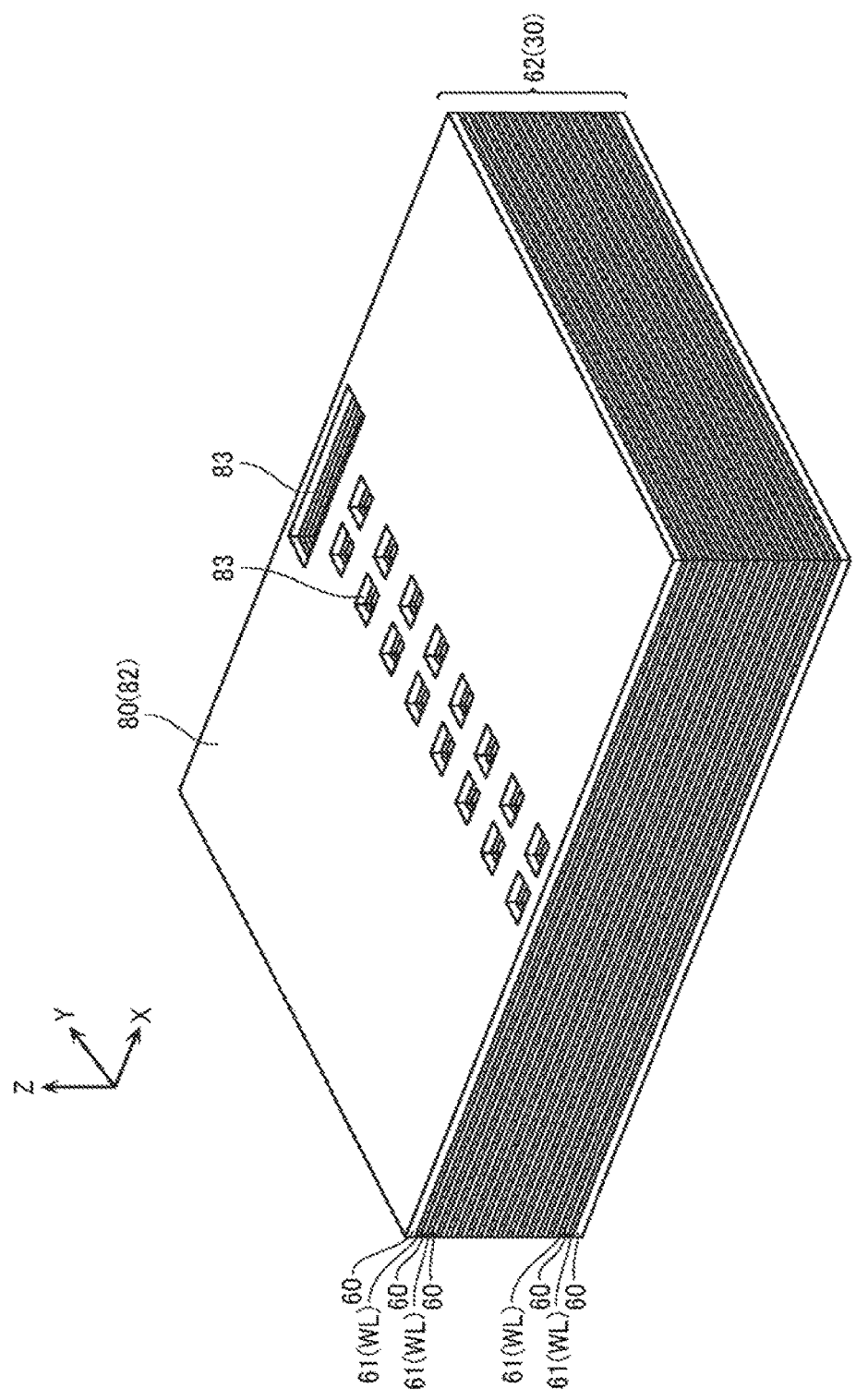
FIG. 69 is a view showing a manufacturing process of the cell array unit and the connection unit (view No. 2).

Next, as shown in FIG. 69, the word line stacked structure 62 at portions thereof not covered by either of the first mask 80 and the second mask 82 described in the formation process of the connection unit 21 is etched to a lowermost layer by RIE technology, and a penetrating electrode-dedicated opening 83 is formed. The present process corresponds to the process of FIG. 29. In the present process, the cell array unit 20 is not influenced by the etching since it is entirely covered by the first mask 80.

Figure 70:
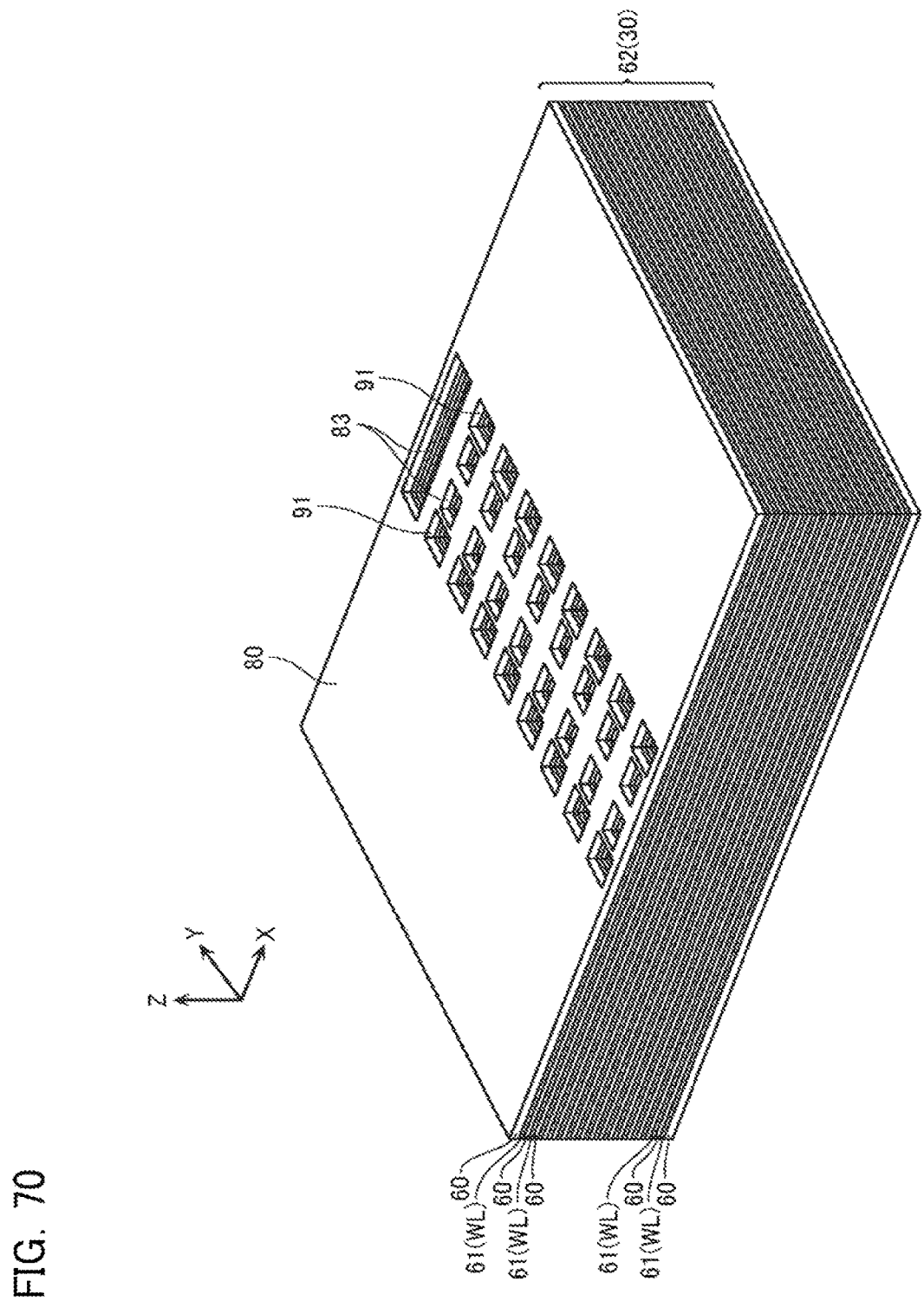
FIG. 70 is a view showing a manufacturing process of the cell array unit and the connection unit (view No. 3).

Next, as shown in FIG. 70, formation of the WL stepped portion 91 is performed. The present process corresponds to the process of FIG. 66. In the present process, the cell array unit 20 is not influenced by the etching since it is entirely covered by the first mask 80.

Figure 71:
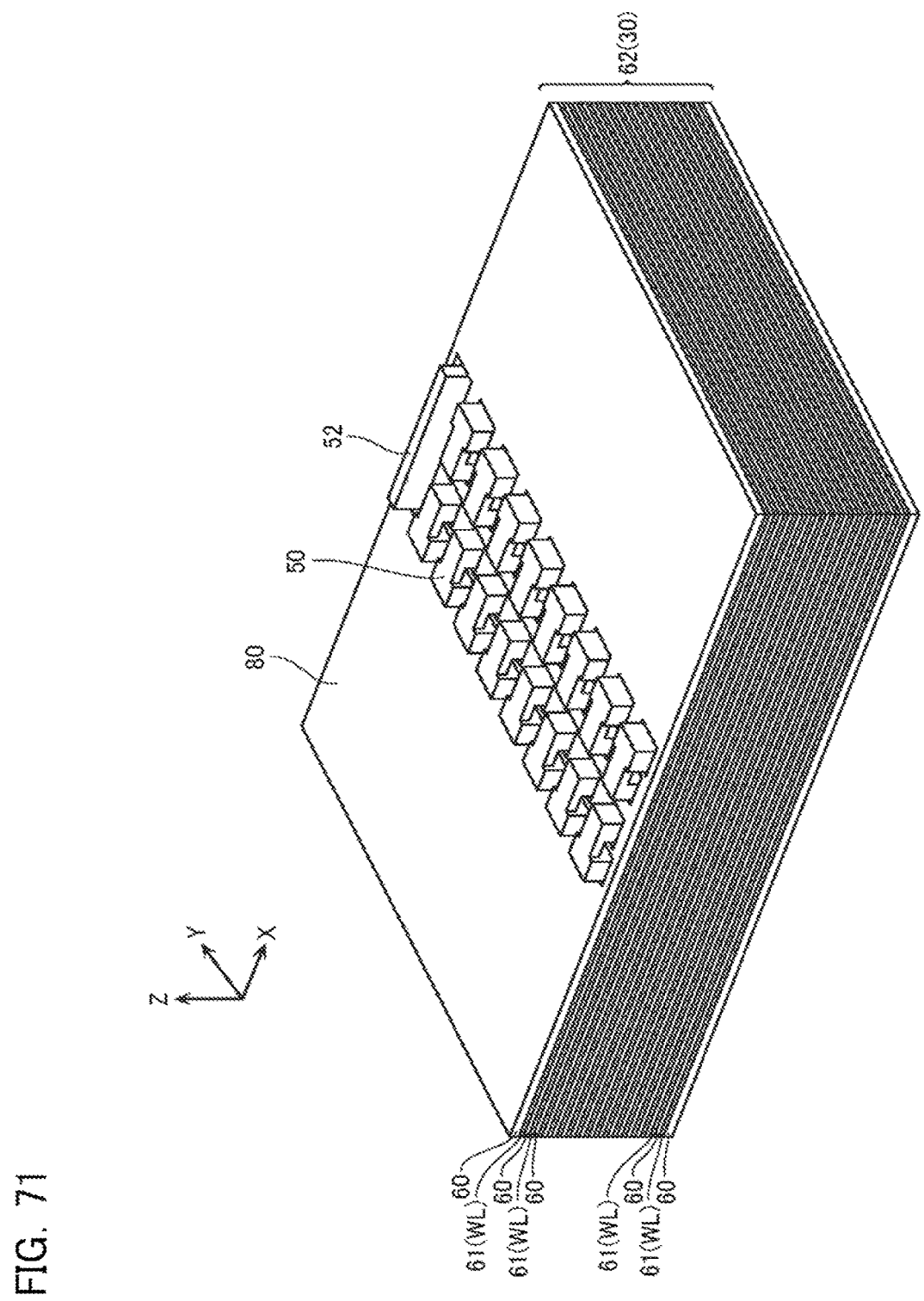
FIG. 71 is a view showing a manufacturing process of the cell array unit and the connection unit (view No. 4).

Next, as shown in FIG. 71, a via material is filled in the opening formed in FIGS. 69 and 70, and the first penetrating electrode 50 and the second penetrating electrode 52 are formed. The present process corresponds to the processes of FIGS. 38 and 57.

Figure 72:
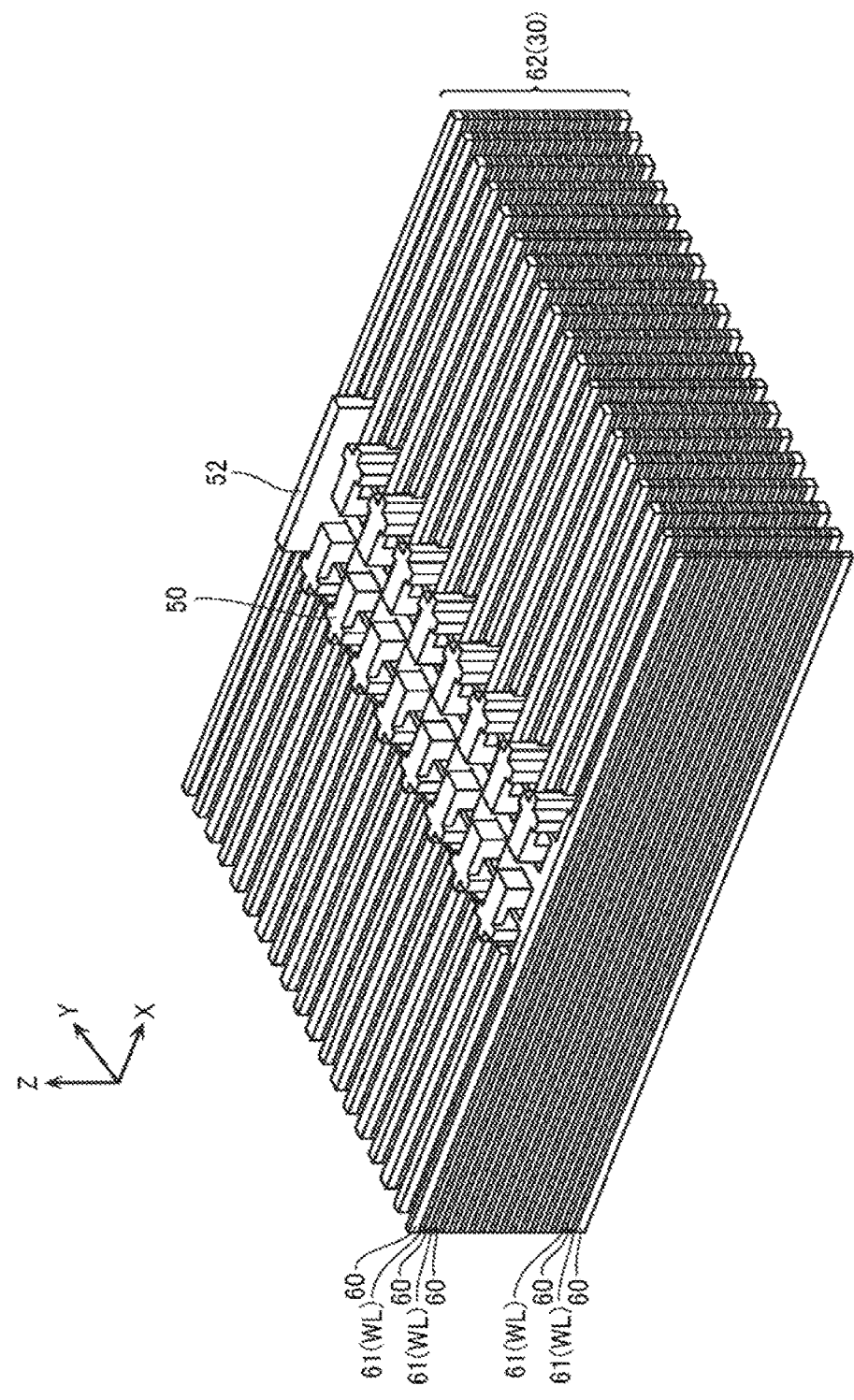
FIG. 72 is a view showing a manufacturing process of the cell array unit and the connection unit (view No. 5).
Figure 73:
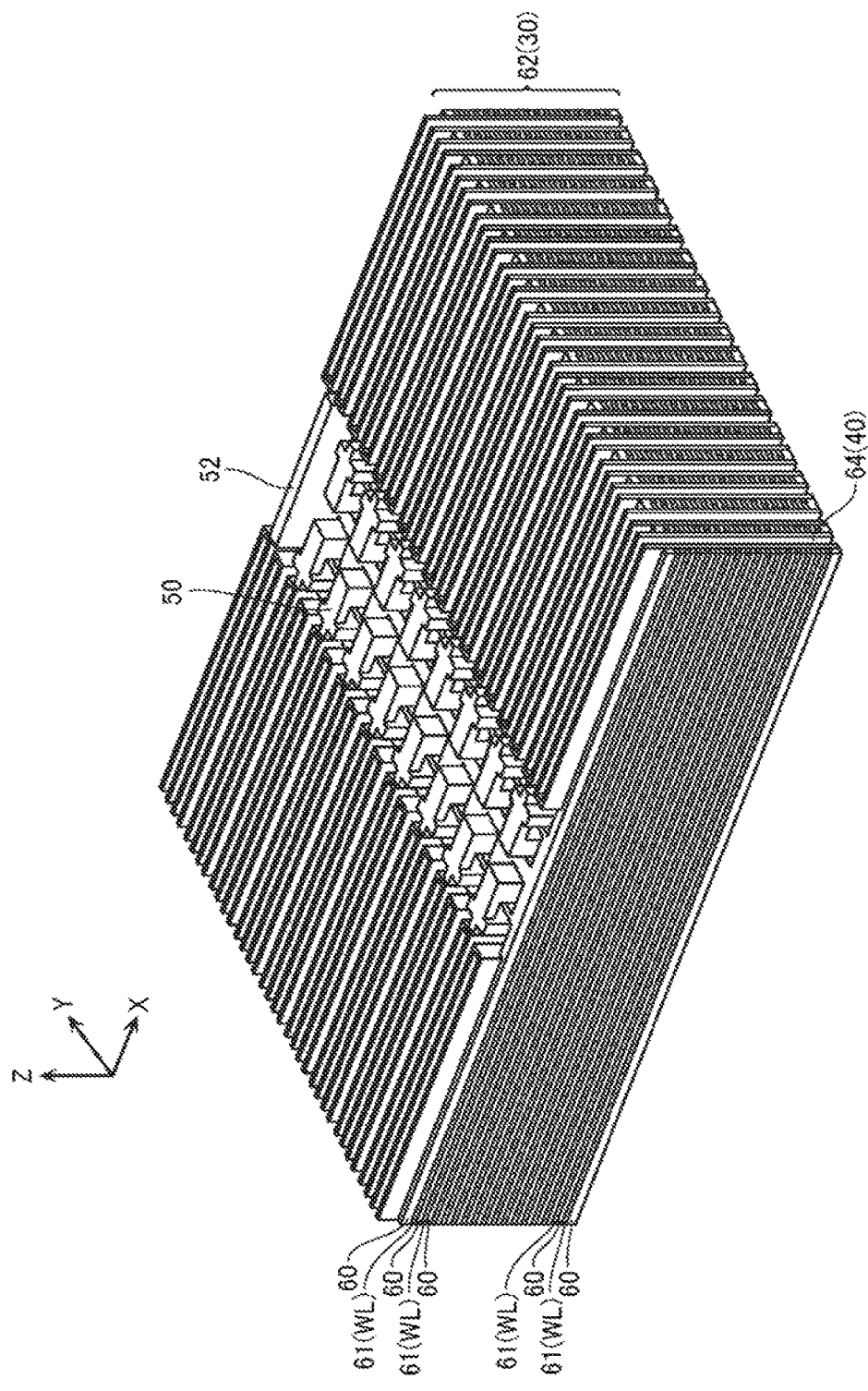
FIG. 73 is a view showing a manufacturing process of the cell array unit and the connection unit (view No. 6).
Figure 74:
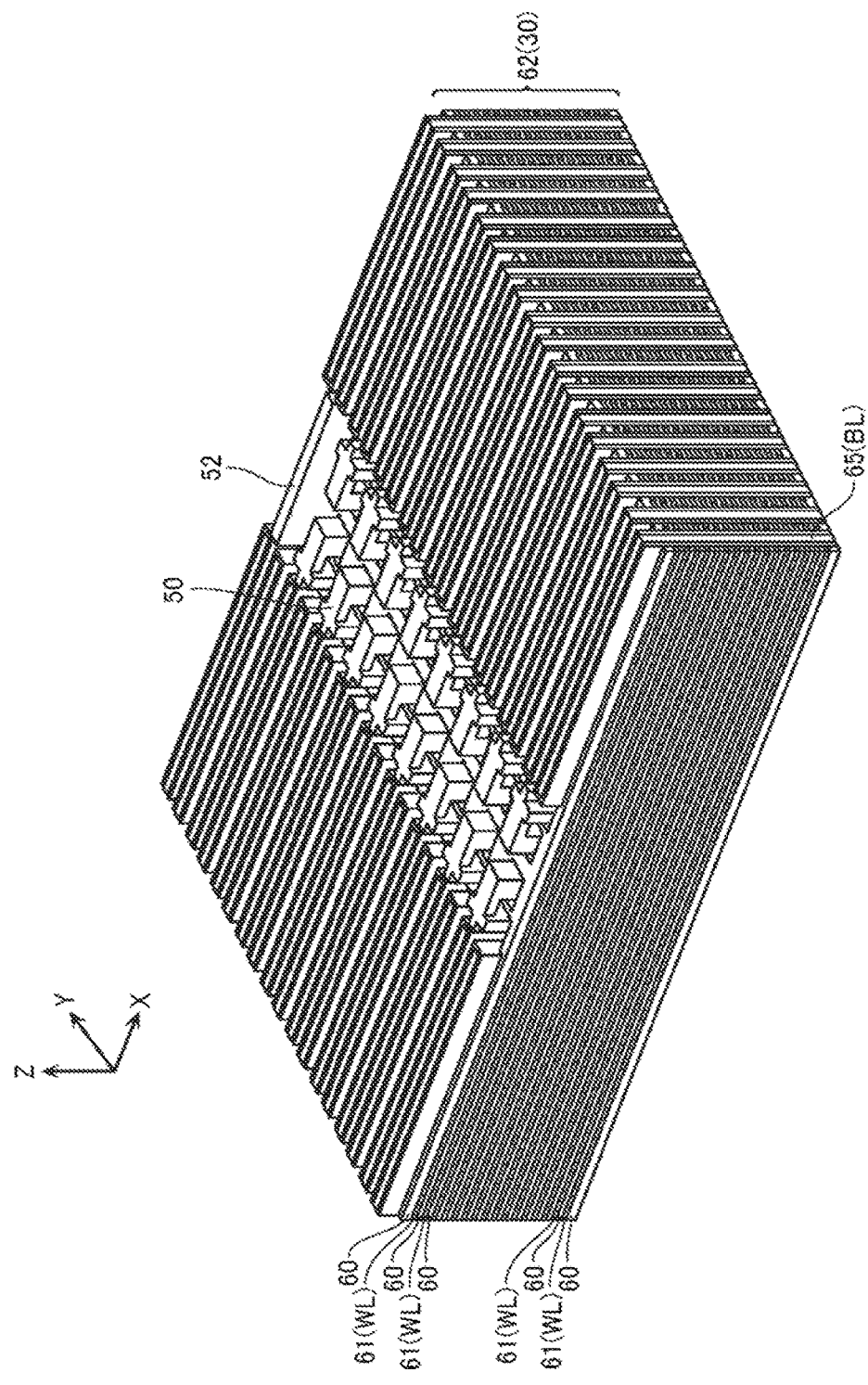
FIG. 74 is a view showing a manufacturing process of the cell array unit and the connection unit (view No. 7).
Figure 75:
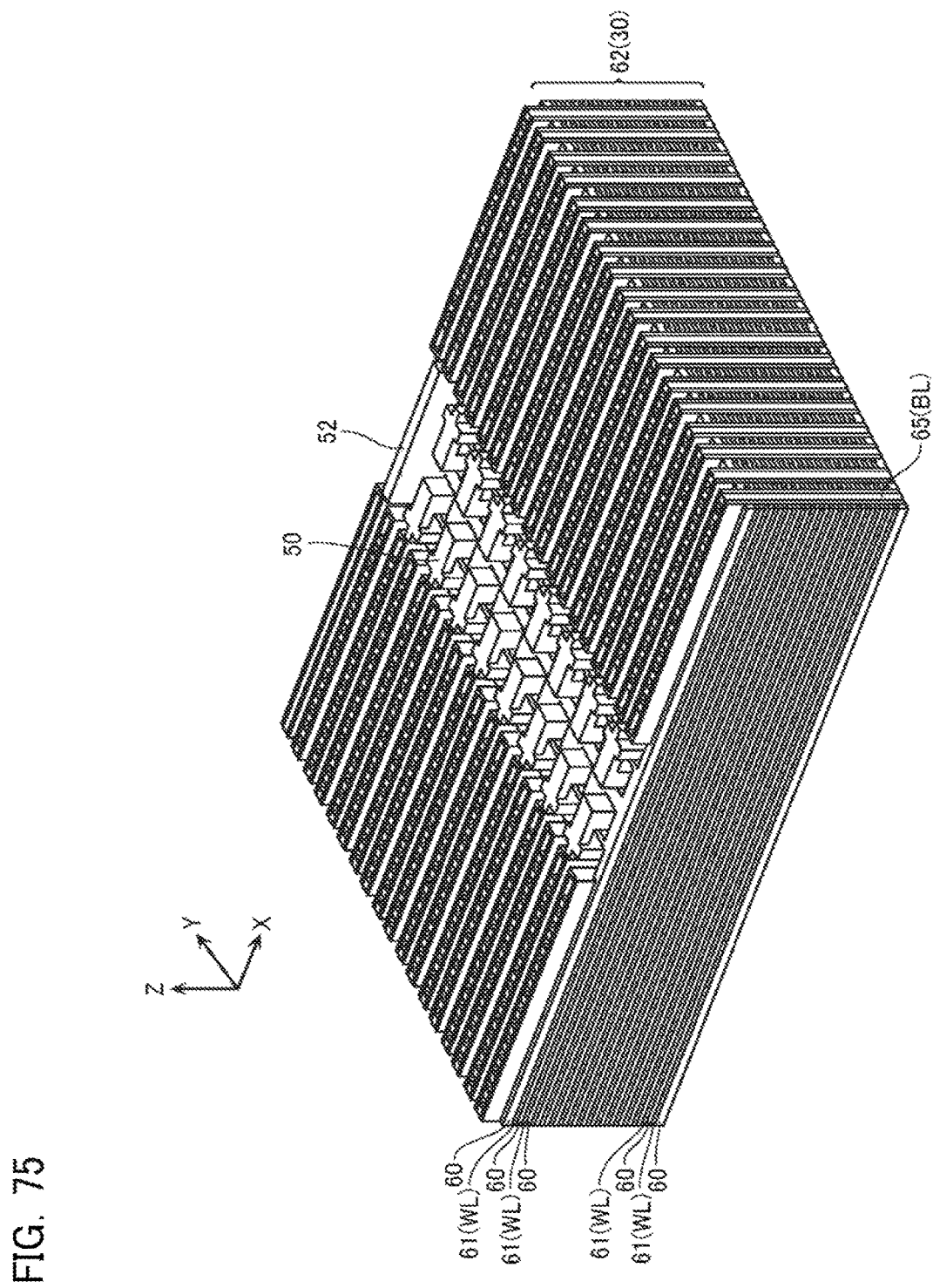
FIG. 75 is a view showing a manufacturing process of the cell array unit and the connection unit (view No. 8).

Next, as shown in FIG. 72, the word line stacked structure 62 is batch processed by RIE technology, and a stripe shaped pattern of word lines WL is formed. The present process corresponds to the processes of FIGS. 12 and 39. Next, as shown in FIG. 73, the layer 64 of a resistance changing material is formed uniformly. The present process corresponds to the processes of FIGS. 13 and 40. Next, as shown in FIG. 74, filling the bit line film 65 is performed. The present process corresponds to the processes of FIGS. 14 and 41. Next, as shown in FIG. 75, photolithography technology and RIE technology are employed to pattern the bit line film 65 into a pillar shape. The present process corresponds to the processes of FIGS. 15 and 42.

Figure 76:
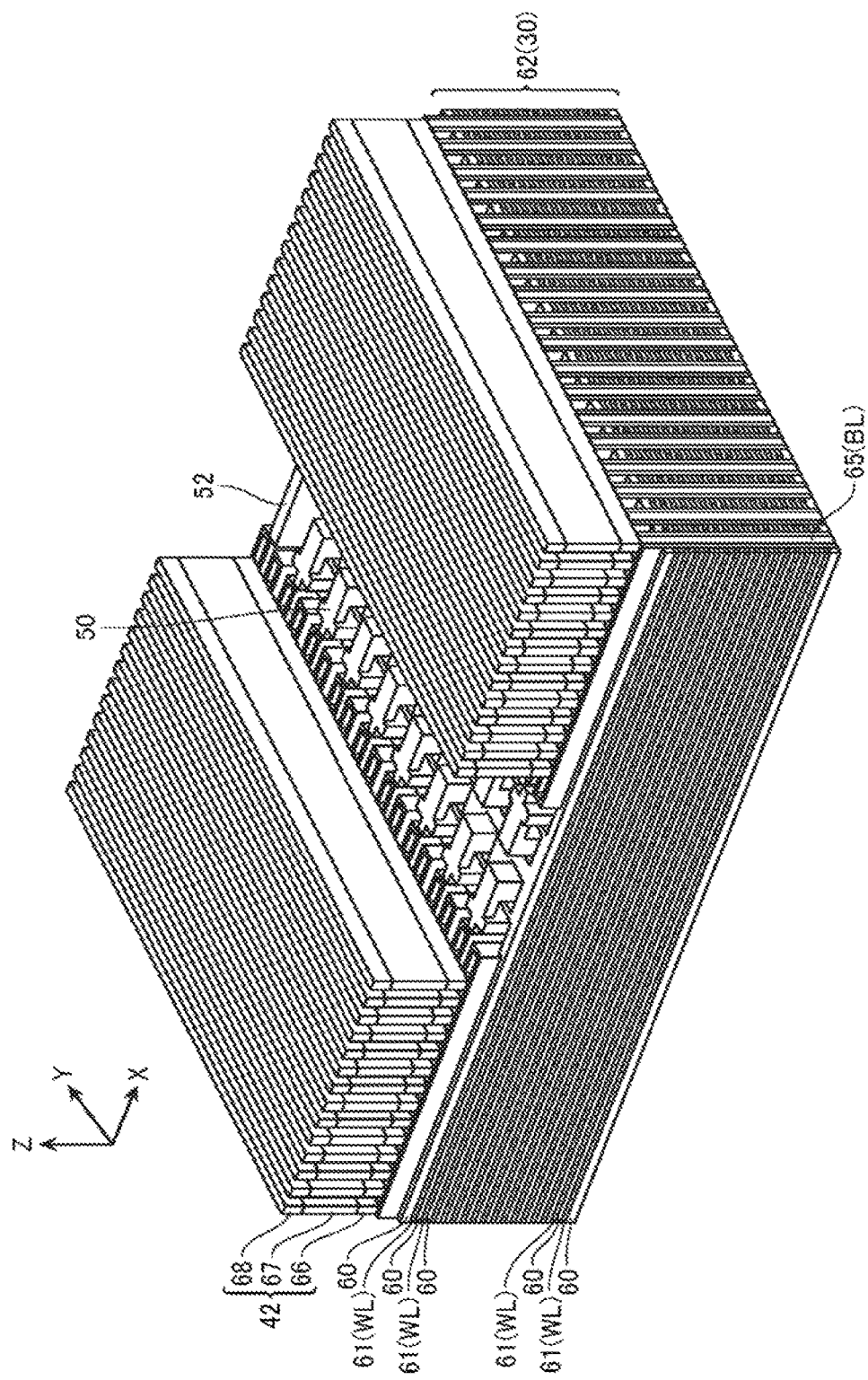
FIG. 76 is a view showing a manufacturing process of the cell array unit and the connection unit (view No. 9).
Figure 77:
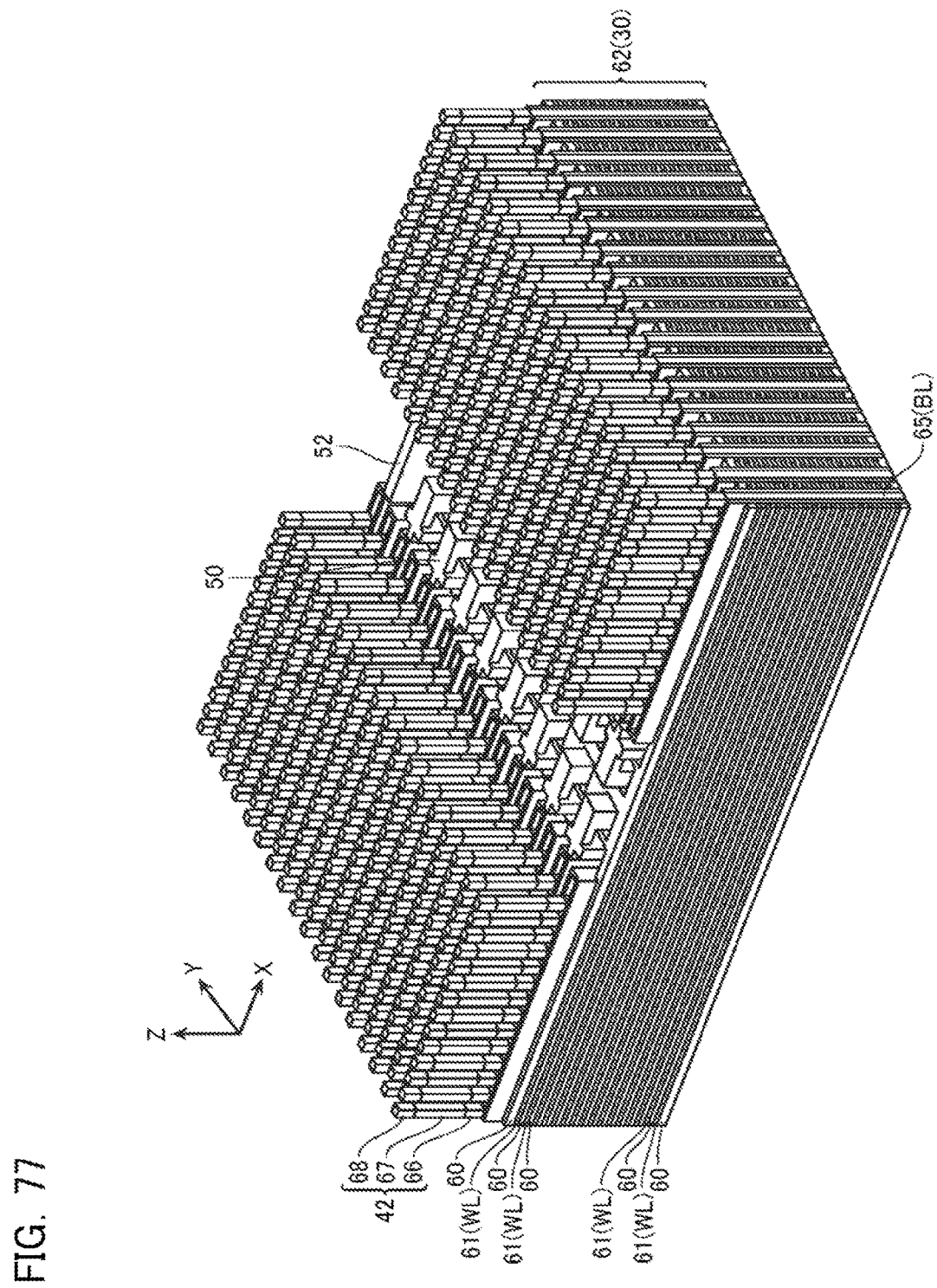
FIG. 77 is a view showing a manufacturing process of the cell array unit and the connection unit (view No. 10).

Next, as shown in FIG. 76, formation of the silicon layers 66 to 68 is sequentially performed. After the silicon layers 66 to 68 have been crystallized by annealing, photolithography technology and RIE technology are employed to form a stripe shaped pattern extending in the Y direction. After formation of an inter-layer insulating film, as shown in FIG. 77, photolithography technology and RIE technology are employed to form a stripe shaped pattern extending in the X direction. The above described processes correspond to the processes of FIGS. 17 and 18. At this time, a trench portion which is later to be a pattern for forming the select gate lines SGL is formed in an inter-layer insulating film not illustrated, in the connection unit 21.

Figure 78:
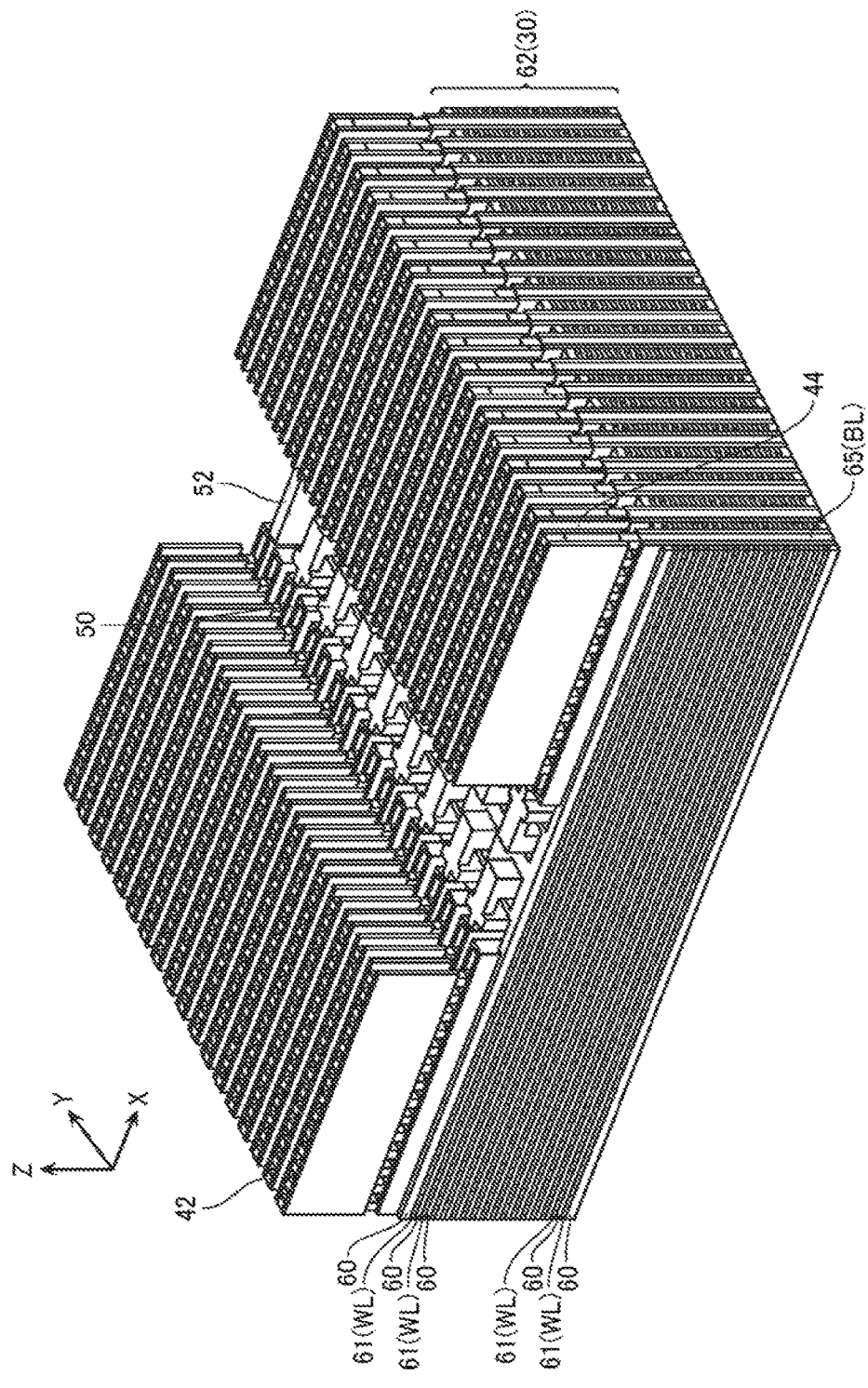
FIG. 78 is a view showing a manufacturing process of the cell array unit and the connection unit (view No. 11).
Figure 79:
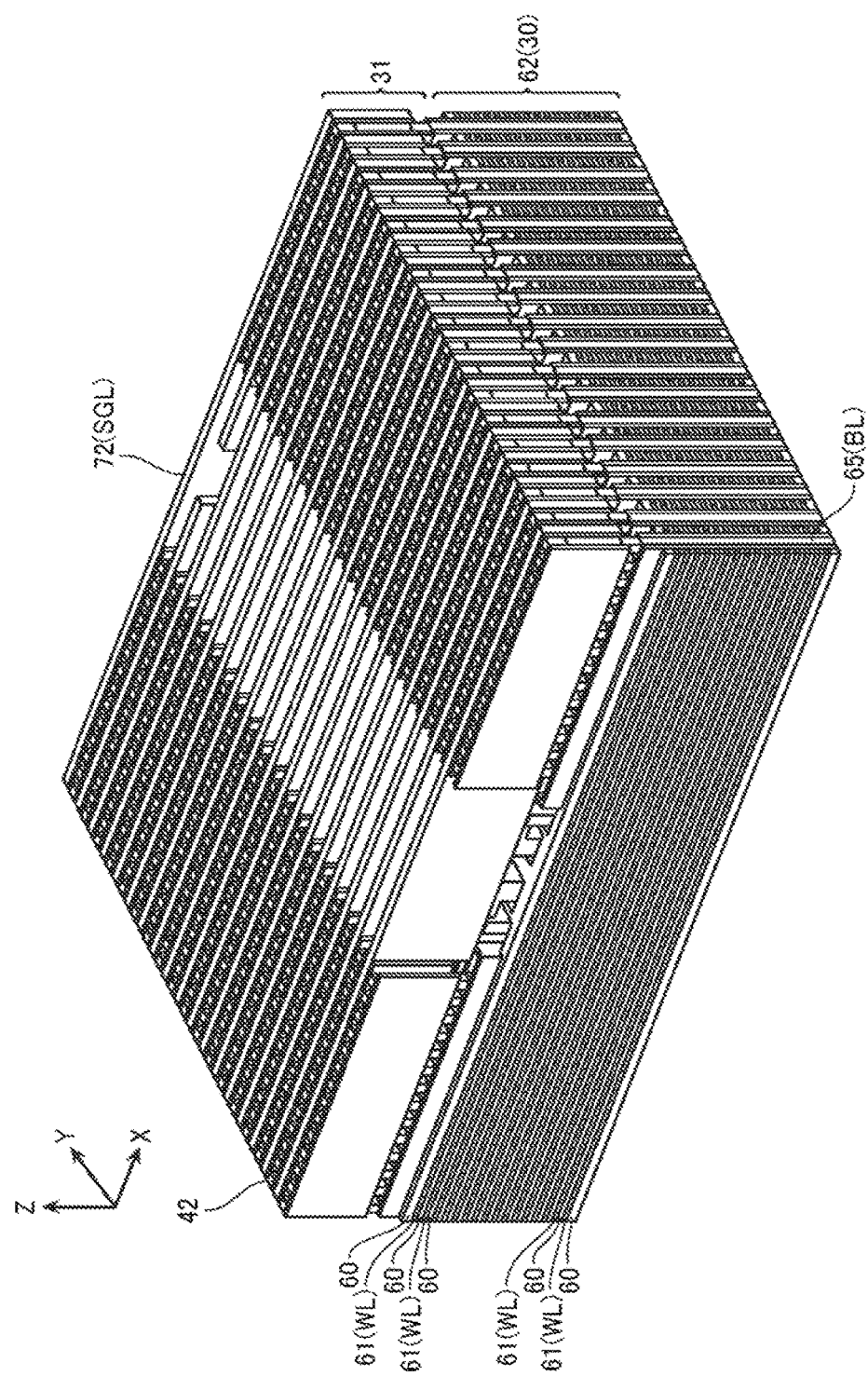
FIG. 79 is a view showing a manufacturing process of the cell array unit and the connection unit (view No. 12).

Next, as shown in FIG. 78, formation of the gate insulating film 44 is performed. The present process corresponds to the process of FIG. 20. Subsequently, as shown in FIG. 79, the conductive film 72 is filled in the trench portion of the inter-layer insulating film (not illustrated) formed in the formation processes of the silicon layers 66 to 68, and the select gate line SGL is formed. The present process corresponds to the process of FIG. 43.

Figure 80:
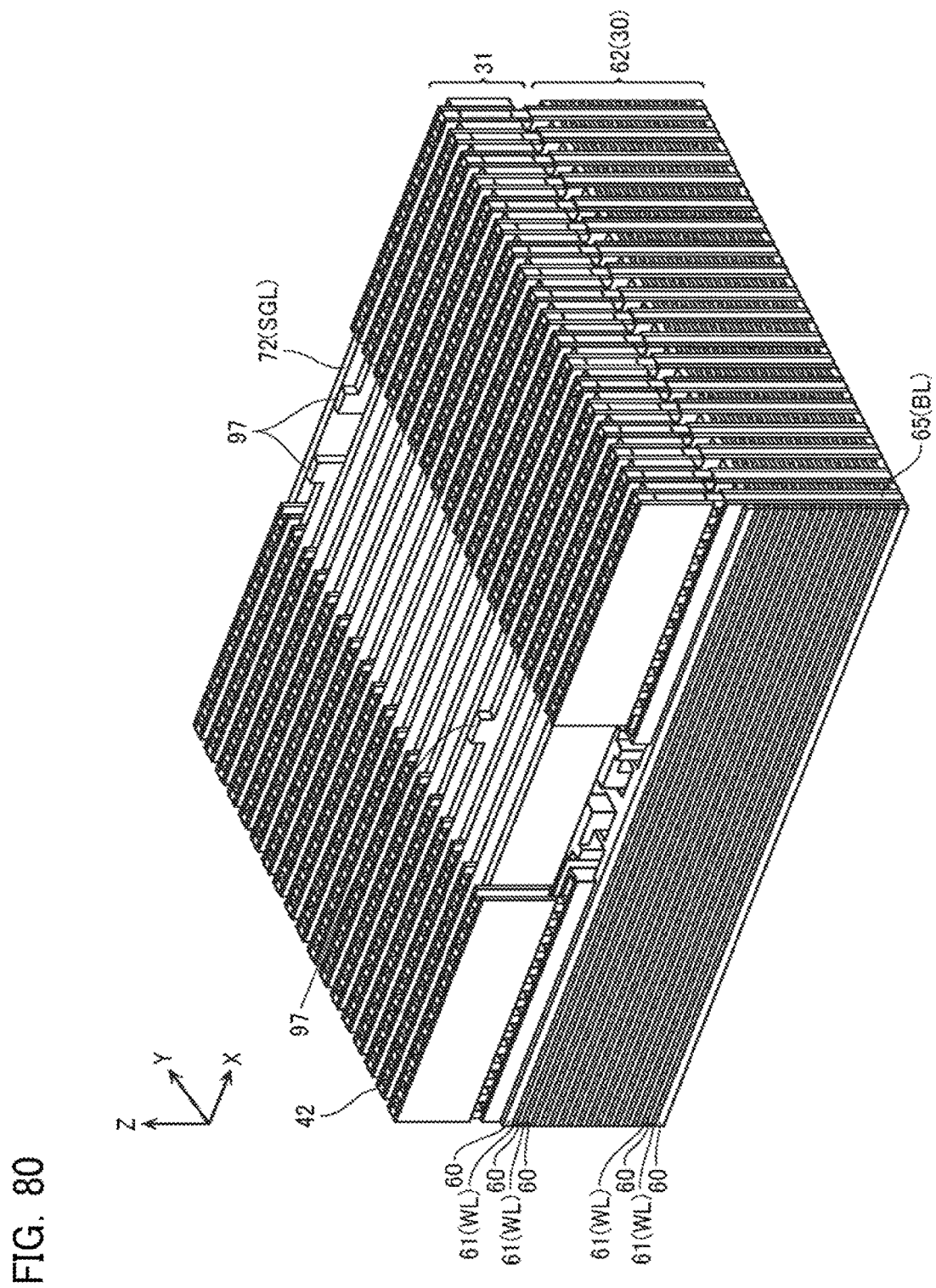
FIG. 80 is a view showing a manufacturing process of the cell array unit and the connection unit (view No. 13).

Next, as shown in FIG. 80, a portion that is to be the connection region with the upper wiring line layer 32 (the third penetrating electrode 97) of the select gate lines SGL is left, and the other select gate lines SGL are etched back. At this time, the select gate lines SGL of the cell array unit 20, and not only those of the connection unit 21, are also simultaneously etched back. By sharing the etching back process of the select gate lines SGL in the cell array unit 20 and the formation process of the third penetrating electrode 97 in the connection unit 21 in this way, processes can be made simpler, compared to when forming each of the units independently. The present process corresponds to the processes of FIGS. 21 and 46.

Figure 81:
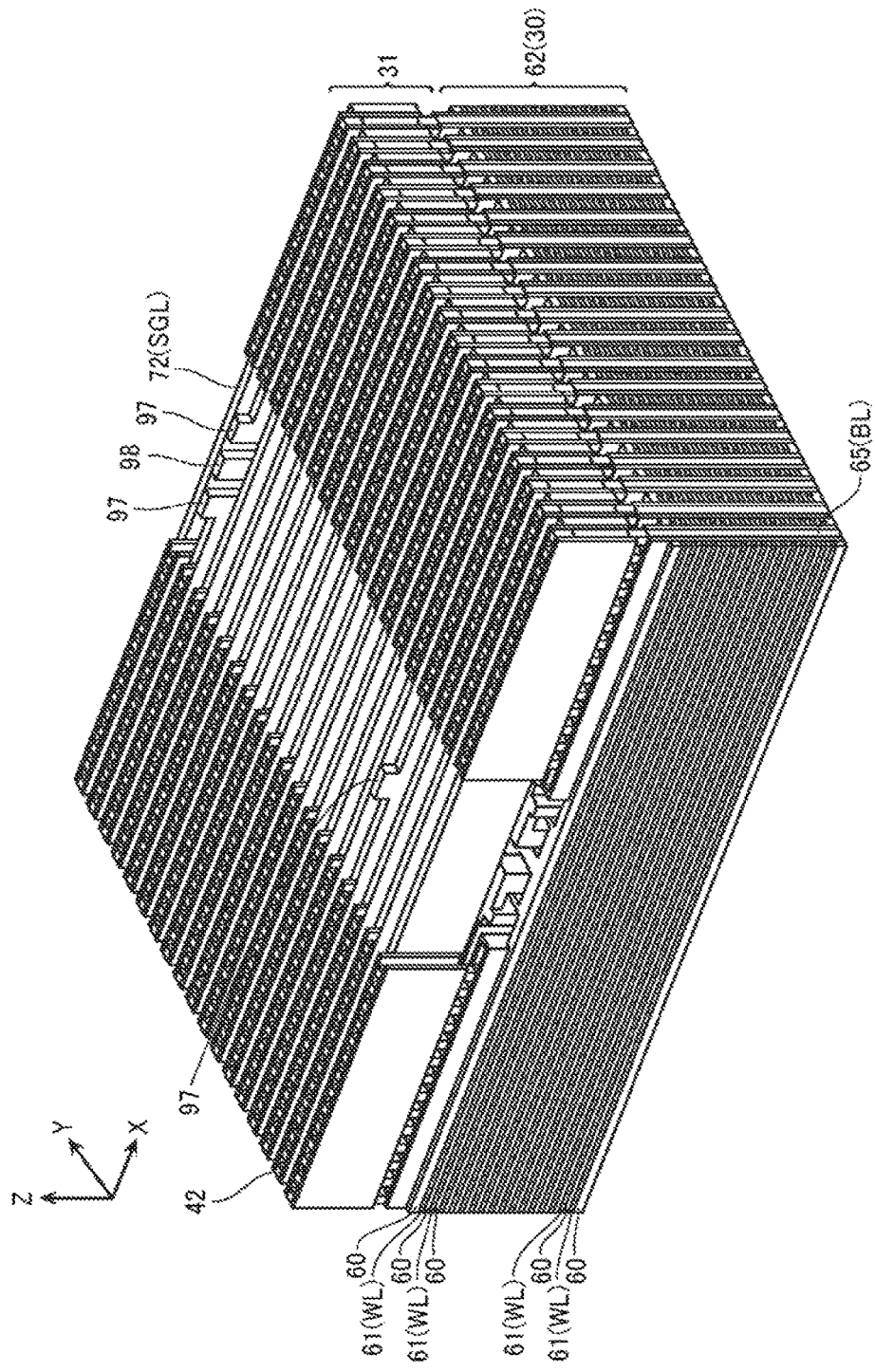
FIG. 81 is a view showing a manufacturing process of the cell array unit and the connection unit (view No. 14).
Figure 82:
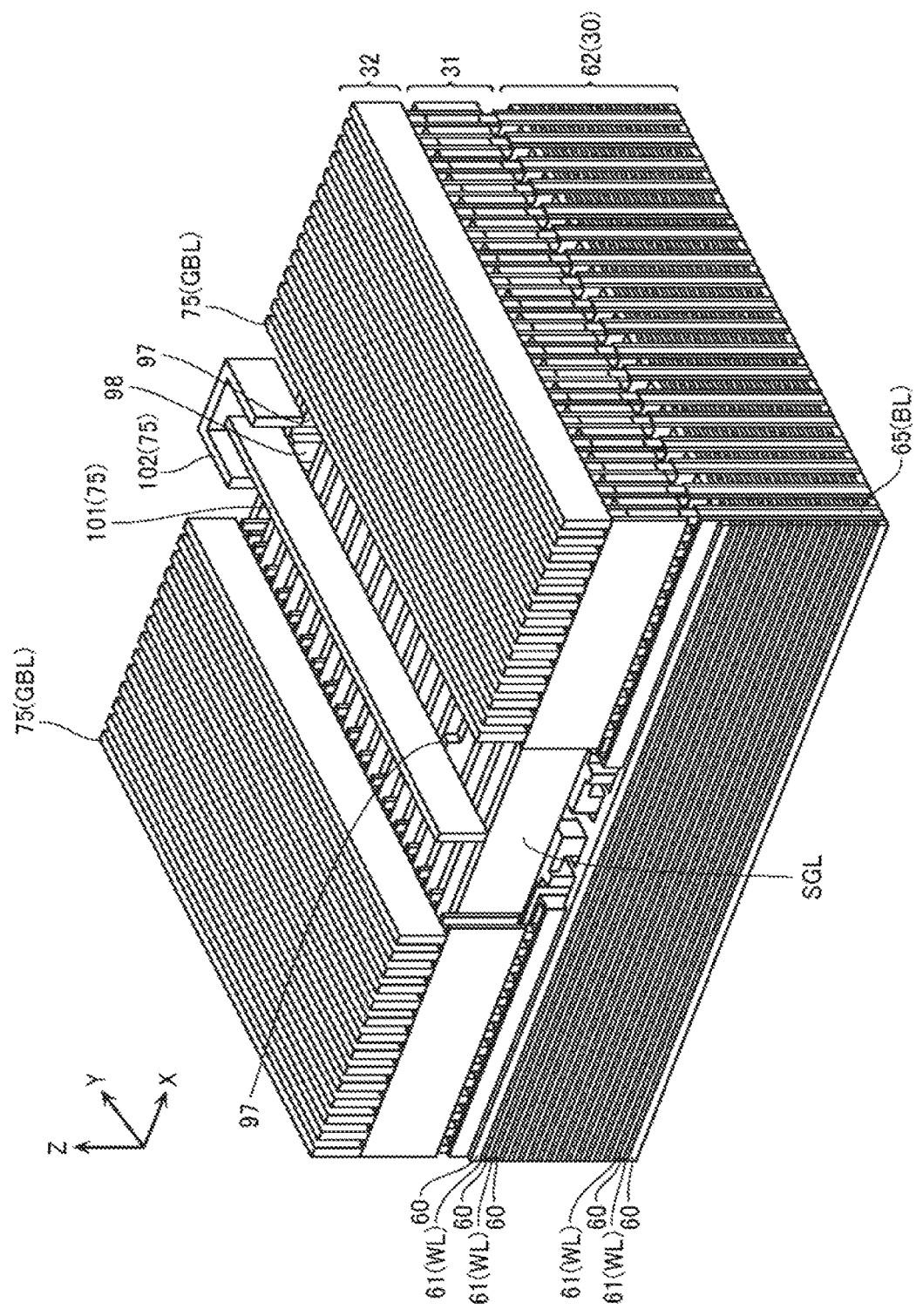
FIG. 82 is a view showing a manufacturing process of the cell array unit and the connection unit (view No. 15).

Next, as shown in FIG. 81, lithography technology and RIE technology are employed to provide an opening upwardly of the second penetrating electrode 52 in the connection unit 21, and form the fourth penetrating electrode 98. The present process corresponds to the process of FIG. 47. Next, as shown in FIG. 82, formation of the global bit line GBL in the cell array unit 20 and formation of the upper wiring line layer 32 (first wiring line pattern 101 and second wiring line pattern 102) in the connection unit 21 are performed simultaneously. The present process corresponds to the processes of FIGS. 24 and 48. Due to the above processes, the semiconductor memory device according to the present embodiment is completed.

First Modified Example

The present embodiment described an example where one of the select gate lines SGL in the connection unit 21 is connected to the fourth penetrating electrode 98 via the first wiring line pattern 101 of the upper wiring line pattern 32. However, a specific configuration of the connection unit is not limited to the above-described configuration. Described below are modified examples in which configurations of the middle wiring line layer 31 and the upper wiring line layer 32 of the connection unit 21 are changed.

Figure 83:
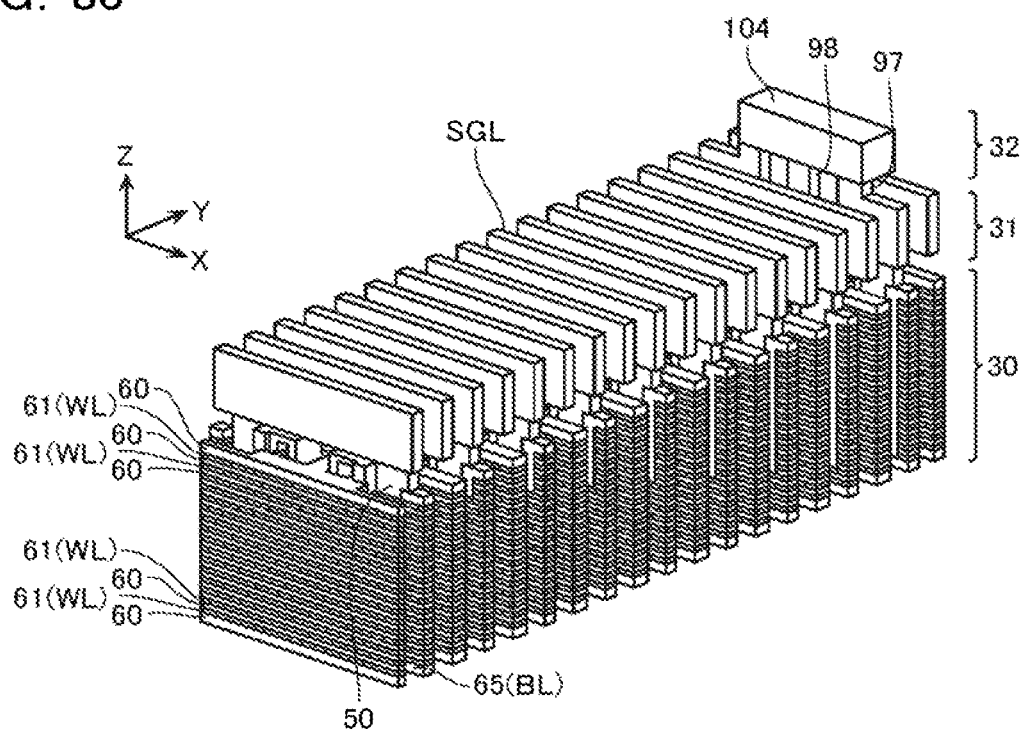
FIG. 83 is a perspective view of external appearance of a connection unit of a semiconductor memory device according to a first modified example.

FIG. 83 is a perspective view of external appearance of a connection unit 21 of a semiconductor memory device according to a first modified example. Contrary to in the first embodiment (FIG. 8), the first wiring line pattern 101 extending in the Y direction is not formed in the upper wiring line layer 32, and instead, a third wiring line pattern 104 is formed in the upper wiring line layer 32. Both ends of the third wiring line pattern 103 are connected to the select gate line SGL via the third penetrating electrode 97, and a central portion of the third wiring line pattern 103 is connected to the second penetrating electrode 52 via the fourth penetrating electrode 98.

That is, the third wiring line pattern 104 connects fellow select gate lines SGL and connects said select gate lines SGL and the second penetrating electrode 52, thereby playing a role combining those of the first wiring line pattern 101 and the second wiring line pattern 102 in the first embodiment. As a result, the select gate line SGL positioned directly above the second penetrating electrode 52 can be connected to the peripheral circuit layer 12 downward of the lower wiring line layer 30.

Second Modified Example

Figure 84:
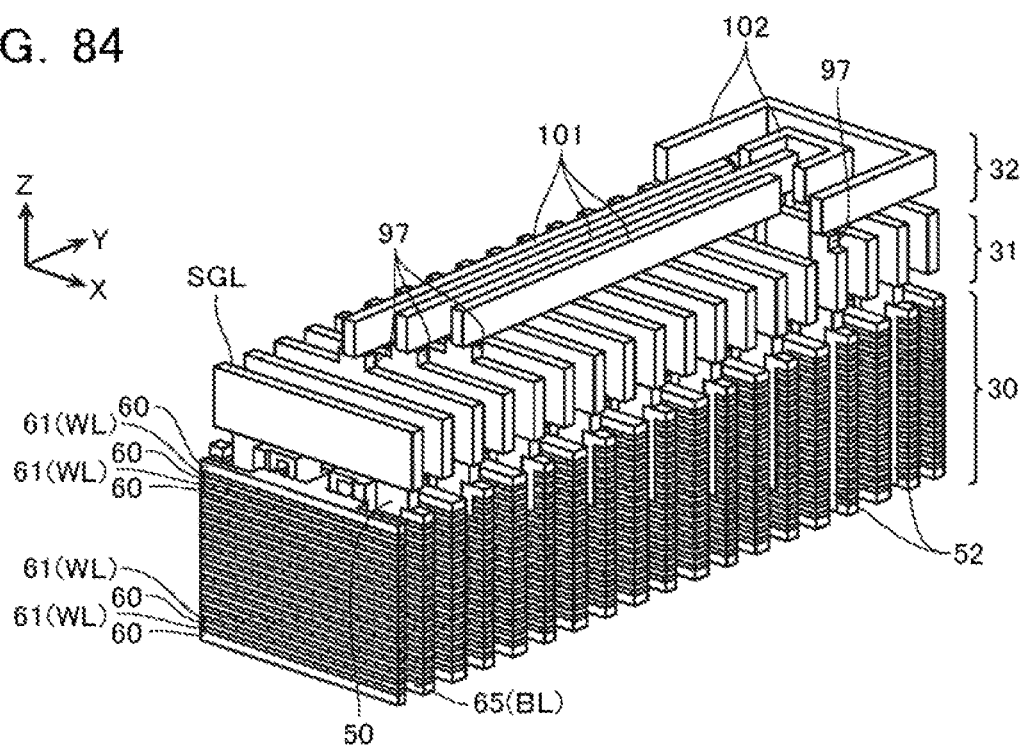
FIG. 84 is a perspective view of external appearance of a connection unit of a semiconductor memory device according to a second modified example.
Figure 85A:
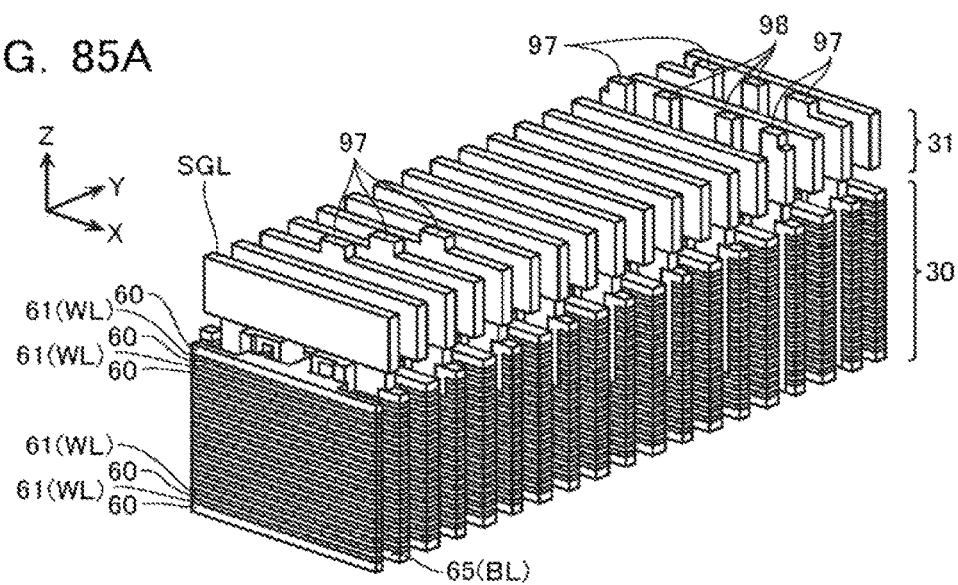
FIG. 85A is a view for explaining an internal configuration of the connection unit shown in FIG. 84.
Figure 85B:
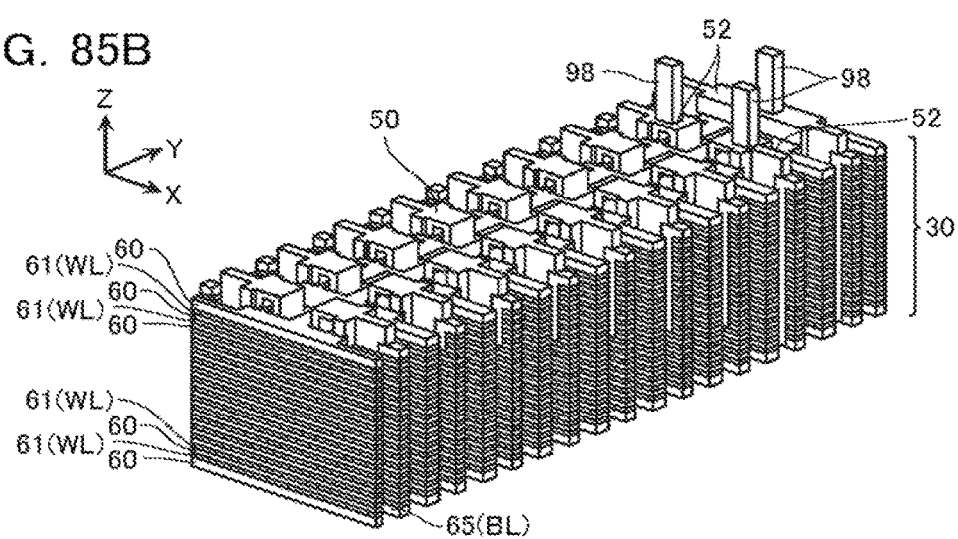
FIG. 85B is a view for explaining the internal configuration of the connection unit shown in FIG. 84.
Figure 85C:
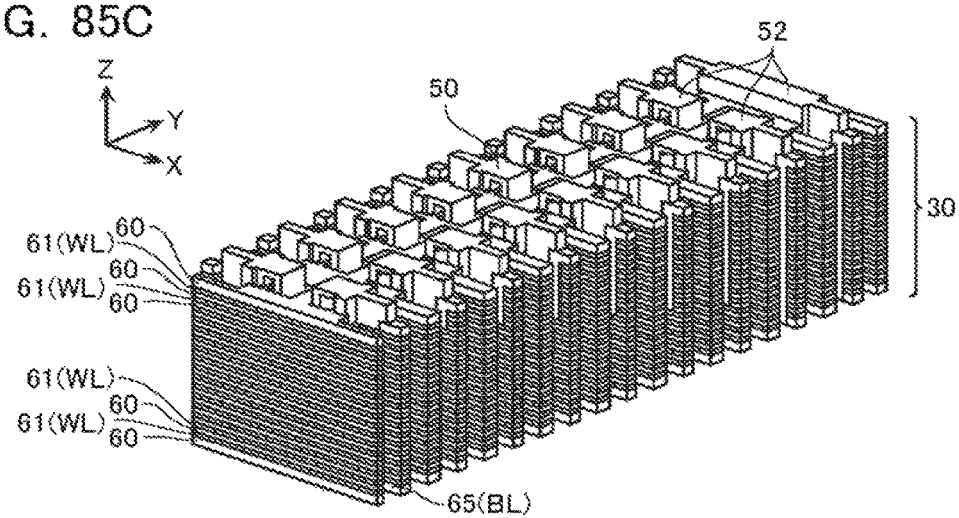
FIG. 85C is a view for explaining the internal configuration of the connection unit shown in FIG. 84.

FIG. 84 is a perspective view of external appearance of a connection unit 21 of a semiconductor memory device according to a second modified example, and FIGS. 85A to 85C are perspective views rendering parts of FIG. 84 visible. FIG. 85A omits display of the upper wiring line layer 32. FIG. 85B further omits display of the middle wiring line layer 31 from FIG. 85A. FIG. 85C further omits display of the fourth penetrating electrode 98 from FIG. 85B.

As shown in FIG. 84, in the present modified example, contrary to in the first embodiment (FIG. 8), three first wiring line patterns 101 extending in the Y direction are formed in the upper wiring line layer 32. The three first wiring line patterns 101 are respectively connected to the third through fifth from front select gate lines SGL via the third penetrating electrode 97. Moreover, the center one of the three first wiring line patterns 101 is connected to the second penetrating electrode 52 via between the second from rear select gate lines SGL, and the two side ones of the three first wiring line patterns 101 are connected to the second penetrating electrode 52 via between the fourth from rear select gate lines SGL (refer to FIGS. 85A and 85B).

In addition, as shown in FIG. 85C, in the present modified example, two second penetrating electrodes 52 penetrating the lower wiring line layer 30 up and down are formed sandwiching the base portion 120 of the word line WL not only at an end of the WL stepped portion 91 but also at a position one to the front thereof. Increasing the number of second penetrating electrodes 52 in this way makes it possible to increase the number of contacts connecting the middle wiring line layer 31 and upper wiring line layer 32 and the peripheral circuit layer 12.

Moreover, increasing the number of first wiring line patterns 101 in the upper wiring line layer 32 makes it possible to connect a greater number of select gate lines SGL to the peripheral circuit layer 12 in one connection unit 21. In this case, increasing the number of second wiring line patterns 102 makes it possible to handle an increase in the number of first wiring line patterns 101 and fourth penetrating electrodes 52. Appropriately combining the first wiring line pattern 101 for connecting the third penetrating electrode 97 and the fourth penetrating electrode 98, and the second wiring line pattern 102 acting as a bypass pattern in this way makes it possible to achieve contact with the peripheral circuit layer 12 while maintaining design freedom.

Third Modified Example

Figure 86:
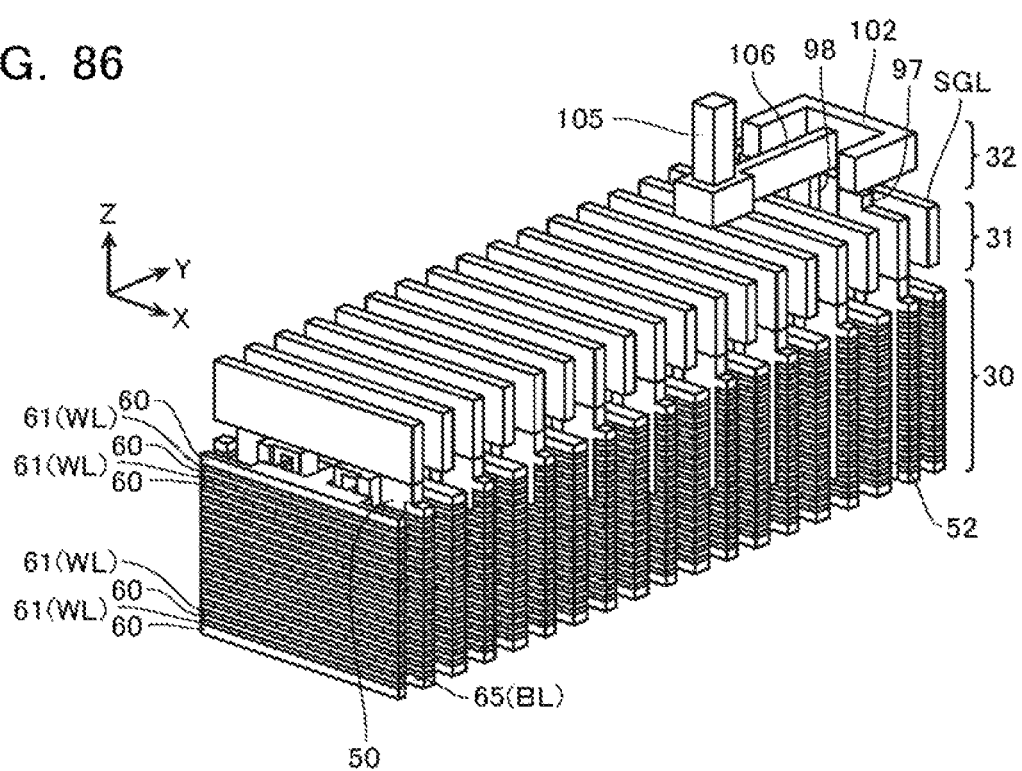
FIG. 86 is a perspective view of external appearance of a connection unit of a semiconductor memory device according to a third modified example.

FIG. 86 is a perspective view of external appearance of a connection unit of a semiconductor memory device according to a third modified example. Contrary to in the first embodiment, the third penetrating electrode 97 that connects the select gate line SGL and the upper wiring line layer 32 is not formed. The upper wiring line layer 32 is connected to a further upwardly positioned wiring line layer via a fifth penetrating electrode 105. The fifth penetrating electrode 105 is connected to one end of a wiring line pattern 106 extending in the Y direction, and the other end of the wiring line pattern 106 is electrically connected to the second penetrating electrode 52 via the fourth penetrating electrode 98.

The present modified example makes it possible to electrically connect a wiring line layer positioned more upwardly than the upper wiring line layer 32 to the peripheral circuit layer 12 via the fifth penetrating electrode 105 and the wiring line pattern 106. Moreover, configurations according to the above-described first embodiment and first through third modified examples may be appropriately adopted in combination. As a result, space increase of the connection unit 21 can be suppressed while securing freedom of design.

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a cell array unit; and
   a connection unit that is provided adjacently to the cell array unit and is electrically connected to a peripheral circuit unit disposed below the cell array unit, the cell array unit including:
  a plurality of word lines that extend in a first direction and are respectively disposed with a certain spacing in a second direction and a third direction, the second direction intersecting the first direction, and the third direction being a stacking direction that intersects the first direction and the second direction;
  a plurality of bit lines that extend in the third direction and are respectively disposed with a certain spacing in the first direction and the second direction,
  a variable resistance layer that is provided on a side surface of the bit line, the side surface facing the word line, and functions as a storage element at an intersection of the bit line and the word line;
  a plurality of select gate lines that are provided in a layer upward of the plurality of word lines and that function as a control gate for selecting the bit line; and
  a plurality of global bit lines that are provided in a layer upward of the plurality of select gate lines and that are electrically connected to the plurality of bit lines via the control gate,
the connection unit including:
  a lower wiring line layer that includes a plurality of connection lines that are electrically connected to the plurality of word lines, the plurality of connection lines being provided at a same height as the plurality of the word lines;
  a middle wiring line layer that is provided on the lower wiring line layer and in which the plurality of select gate lines extending from the cell array unit are formed;
  an upper wiring line layer that is provided on the middle wiring line layer and in which the same wiring line layer as the plurality of global bit lines is formed; and
  a first penetrating electrode that connects the lower wiring layer and the peripheral circuit unit;
  a second penetrating electrode that connects at least one of the middle wiring line layer and upper wiring line layer and the peripheral circuit unit;
  a third penetrating electrode that connects the middle wiring line layer and the upper wiring line layer, the third penetrating electrode being formed by the same material as the middle wiring line layer, and
  a fourth penetrating electrode that connects the upper wiring line layer and the second penetrating electrode, the fourth penetrating electrode being formed by a different material from the third penetrating electrode,
the middle wiring line layer that is electrically connected to the second penetrating electrode via the third penetrating electrode, the upper wiring line layer, and the fourth penetrating electrode,
the upper wiring line layer that includes a first wiring line pattern that connects the third penetrating electrode and the fourth penetrating electrode, and
the first wiring line pattern that is formed extending in the first direction.

2. The semiconductor memory device according to claim 1, wherein
  the third penetrating electrode is formed integrally with the middle wiring line layer.

3. The semiconductor memory device according to claim 1, wherein
  the first wiring line pattern connects two of third penetrating electrodes at both ends thereof, and connects the fourth penetrating electrode at a central portion thereof.

4. The semiconductor memory device according to claim 1, wherein
  the plurality of word lines form a comb tooth shaped pattern by extending from one of the plurality of connection lines formed in the connection unit to both sides of the first direction, and
  the first penetrating electrode is provided between the comb tooth shaped patterns that face each other in the first direction.

5. The semiconductor memory device according to claim 1, wherein
  the plurality of word lines form a comb tooth shaped pattern by extending from the plurality of connection lines formed in the connection unit to both sides of the first direction, and
  the second penetrating electrode is provided between the comb tooth shaped patterns that are adjacent in the second direction.

6. The semiconductor memory device according to claim 1, wherein
  the first penetrating electrode includes:
    a first portion that penetrates the lower wiring line layer in the third direction and that connects the peripheral circuit unit and an upper surface of the lower wiring line layer; and
    a second portion that is connected to the first portion, penetrates part of the lower wiring line layer in the third direction, and connects the word line and the upper surface of the lower wiring line layer.

7. The semiconductor memory device according to claim 6, wherein
  the first portion and the second portion have a columnar shape, and
  the first portion and the second portion are connected by a bridging portion at the upper surface of the lower wiring line layer.

8. The semiconductor memory device according to claim 6, wherein
  a plurality of connection regions in which the second portion and the word line are connected are formed in a stepped shape in the second direction, and a plurality of the first penetrating electrodes are each connected to a different word line by the plurality of connection regions.

9. A semiconductor memory device, comprising:
  a cell array unit; and
  a connection unit that is provided adjacently to the cell array unit and is electrically connected to a peripheral circuit unit disposed below the cell array unit,
the cell array unit including:
  a plurality of word lines that extend in a first direction and are respectively disposed with a certain spacing in a second direction and a third direction, the second direction intersecting the first direction, and the third direction being a stacking direction that intersects the first direction and the second direction;
  a plurality of bit lines that extend in the third direction and are respectively disposed with a certain spacing in the first direction and the second direction;
  a variable resistance layer that is provided on a side surface of the bit line, the side surface facing the word line, and functions as a storage element at an intersection of the bit line and the word line;

a plurality of select gate lines that are provided in a layer upward of the plurality of word lines and that function as a control gate for selecting the bit line; and a plurality of global bit lines that are provided in a layer upward of the plurality of select gate lines and that are electrically connected to the plurality of bit lines via the control gate, the connection unit including:

a lower wiring line layer that includes a plurality of connection lines that are electrically connected to the plurality of word lines, the plurality of connection lines being provided at a same height as the plurality of the word lines;

a middle wiring line layer that is provided on the lower wiring line layer and in which the plurality of select gate lines extending from the cell array unit are formed;

an upper wiring line layer that is provided on the middle wiring line layer and in which the same wiring line layer as the plurality of global bit lines is formed; and a first penetrating electrode that connects the lower wiring layer and the peripheral circuit unit;

a second penetrating electrode that connects at least one of the middle wiring line layer and upper wiring line layer and the peripheral circuit unit, a third penetrating electrode that connects the middle wiring line layer and the upper wiring line layer, the third penetrating electrode being formed by the same material as the middle wiring line layer; and a fourth penetrating electrode that connects the upper wiring line layer and the second penetrating electrode, the fourth penetrating electrode being formed by a different material from the third penetrating electrode, the middle wiring line layer that is electrically connected to the second penetrating electrode via the third penetrating electrode, the upper wiring line layer, and the fourth penetrating electrode, the upper wiring line layer that includes a plurality of first wiring line patterns that connect the third penetrating electrode and the fourth penetrating electrode respectively different from each other, and the plurality of first wiring line patterns that are formed extending in the second direction.

10. The semiconductor memory device according to claim 9, wherein
the third penetrating electrode is formed integrally with the middle wiring line layer.

11. The semiconductor memory device according to claim 9, wherein the upper wiring line layer includes a second wiring line pattern that bypasses connection portions between the plurality of the first wiring line patterns and the fourth penetrating electrodes, and both ends of the second wiring line pattern are respectively connected to the middle wiring line layer.

12. The semiconductor memory device according to claim 9, wherein the plurality of word lines form a comb tooth shaped pattern by extending from one of the plurality of connection lines formed in the connection unit to both sides of the first direction, and the first penetrating electrode is provided between the comb tooth shaped patterns that face each other in the first direction.

13. The semiconductor memory device according to claim 9, wherein the plurality of word lines form a comb tooth shaped pattern by extending from one of the plurality of connection lines formed in the connection unit to both sides of the first direction, and the second penetrating electrode is provided between the comb tooth shaped patterns that are adjacent in the second direction.

14. The semiconductor memory device according to claim 9, wherein the first penetrating electrode includes:

a first portion that penetrates the lower wiring line layer in the third direction and that connects the peripheral circuit unit and an upper surface of the lower wiring line layer; and a second portion that is connected to the first portion, penetrates part of the lower wiring line layer in the third direction, and connects the word line and the upper surface of the lower wiring line layer.

15. The semiconductor memory device according to claim 14, wherein the first portion and the second portion have a columnar shape, and the first portion and the second portion are connected by a bridging portion at the upper surface of the lower wiring line layer.

16. The semiconductor memory device according to claim 14, wherein a plurality of connection regions in which the second portion and the word line are connected are formed in a stepped shape in the second direction, and a plurality of the first penetrating electrodes are each connected to a different word line by the plurality of connection regions.

* * * * *